(12) United States Patent
Li

(10) Patent No.: US 7,447,078 B2
(45) Date of Patent: *Nov. 4, 2008

(54) METHOD FOR NON-VOLATILE MEMORY WITH BACKGROUND DATA LATCH CACHING DURING READ OPERATIONS

(75) Inventor: Yan Li, Milpitas, CA (US)

(73) Assignee: Sandisk Corporation, Milpitas, CA (US)

( * ) Notice: Subject to any disclaimer, the term of this patent is extended or adjusted under 35 U.S.C. 154(b) by 119 days.

This patent is subject to a terminal disclaimer.

(21) Appl. No.: 11/381,994

(22) Filed: May 5, 2006

(65) Prior Publication Data

US 2006/0221696 A1 Oct. 5, 2006

Related U.S. Application Data

(63) Continuation-in-part of application No. 11/097,590, filed on Apr. 1, 2005, now Pat. No. 7,206,230.

(51) Int. Cl.
*G11C 16/26* (2006.01)
*G11C 11/34* (2006.01)

(52) U.S. Cl. .............................. 365/185.21; 365/185.02

(58) Field of Classification Search .................. 365/185
See application file for complete search history.

(56) References Cited

U.S. PATENT DOCUMENTS

| 4,357,685 A | 11/1982 | Daniele et al. |
|---|---|---|
| 4,785,427 A | 11/1988 | Young |
| 5,034,922 A | 7/1991 | Burgess |
| 5,070,032 A | 12/1991 | Yuan et al. |
| 5,093,806 A | 3/1992 | Tran |
| 5,095,344 A | 3/1992 | Harari |

(Continued)

FOREIGN PATENT DOCUMENTS

EP     0 615 184     9/1994

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner*—Huan Hoang
*Assistant Examiner*—Michael J Weinberg
(74) *Attorney, Agent, or Firm*—Davis Wright Tremaine LLP

(57) ABSTRACT

Part of the latency from memory read or write operations is for data to be input to or output from the data latches of the memory via an I/O bus. Methods and circuitry are present for improving performance in non-volatile memory devices by allowing the memory to perform some of these data caching and transfer operations in the background while the memory core is busy with a read operation. A scheme for caching read data is implemented so that even when the read for a current page on a current wordline must be preceded by a prerequisite read of data on an adjacent wordline, the prerequisite read along with any I/O access is preemptively done in the cycle for reading a previous page so that the current read can be performed while the previously read page is busy with the I/O access.

13 Claims, 42 Drawing Sheets

Read Caching with LM Coding

U.S. PATENT DOCUMENTS

| | | | |
|---|---|---|---|
| 5,172,338 A | 12/1992 | Mehrotra et al. | |
| 5,245,571 A | 9/1993 | Takahashi | |
| 5,313,421 A | 5/1994 | Guterman et al. | |
| 5,315,541 A | 5/1994 | Harari et al. | |
| 5,343,063 A | 8/1994 | Yuan et al. | |
| 5,418,752 A | 5/1995 | Harari et al. | |
| 5,509,134 A | 4/1996 | Fandrich et al. | |
| 5,519,847 A | 5/1996 | Fandrich et al. | |
| 5,532,962 A | 7/1996 | Auclair et al. | |
| 5,537,356 A | 7/1996 | Akaogi et al. | |
| 5,570,315 A | 10/1996 | Tanaka et al. | |
| 5,595,924 A | 1/1997 | Yuan et al. | |
| 5,661,053 A | 8/1997 | Yuan | |
| 5,692,165 A | 11/1997 | Jeddeloh et al. | |
| 5,768,192 A | 6/1998 | Eitan | |
| 5,774,397 A | 6/1998 | Endoh et al. | |
| 5,815,444 A | 9/1998 | Ohta | |
| 5,860,082 A | 1/1999 | Smith et al. | |
| 5,862,099 A | 1/1999 | Gannage et al. | |
| 5,867,429 A | 2/1999 | Chen et al. | |
| 5,872,739 A | 2/1999 | Womack | |
| 5,893,135 A | 4/1999 | Hasbun et al. | |
| 5,903,495 A | 5/1999 | Takeuchi et al. | |
| 5,920,502 A | 7/1999 | Noda et al. | |
| 5,949,720 A | 9/1999 | Brady | |
| 5,969,986 A | 10/1999 | Wong et al. | |
| 6,011,287 A | 1/2000 | Itoh et al. | |
| 6,011,725 A | 1/2000 | Eitan | |
| 6,029,233 A | 2/2000 | Abily et al. | |
| 6,038,174 A | 3/2000 | Khan et al. | |
| 6,046,935 A | 4/2000 | Takeuchi et al. | |
| 6,046,940 A | 4/2000 | Takeuchi et al. | |
| 6,097,638 A | 8/2000 | Himeno et al. | |
| 6,222,762 B1 | 4/2001 | Guterman et al. | |
| 6,252,803 B1 | 6/2001 | Fastow et al. | |
| 6,253,250 B1 | 6/2001 | Evans et al. | |
| 6,266,273 B1 | 7/2001 | Conley et al. | |
| 6,324,121 B2 | 11/2001 | Banks | |
| 6,349,056 B1 | 2/2002 | Conley et al. | |
| 6,356,485 B1 | 3/2002 | Proebsting | |
| 6,373,746 B1 | 4/2002 | Takeuchi et al. | |
| 6,407,953 B1 | 6/2002 | Cleeves | |
| 6,438,038 B2 | 8/2002 | Ikebashi et al. | |
| 6,456,528 B1 | 9/2002 | Chen | |
| 6,490,199 B2 | 12/2002 | Lee et al. | |
| 6,504,757 B1 | 1/2003 | Hollmer et al. | |
| 6,519,180 B2 | 2/2003 | Tran et al. | |
| 6,560,143 B2 | 5/2003 | Conley et al. | |
| 6,567,302 B2 | 5/2003 | Lakhani | |
| 6,650,570 B2 | 11/2003 | Tanzawa et al. | |
| 6,657,891 B1 | 12/2003 | Shibata et al. | |
| 6,687,158 B2 | 2/2004 | Yano | |
| 6,700,820 B2 | 3/2004 | Elmhurst et al. | |
| 6,717,857 B2 | 4/2004 | Byeon et al. | |
| 6,731,539 B1 | 5/2004 | Wong | |
| 6,738,289 B2 | 5/2004 | Gongwer et al. | |
| 6,744,667 B2 | 6/2004 | Yamamoto et al. | |
| 6,829,167 B2 | 12/2004 | Tu et al. | |
| 6,829,172 B2 | 12/2004 | Bloom et al. | |
| 6,847,553 B2 | 1/2005 | Chen et al. | |
| 6,856,568 B1 | 2/2005 | Wong | |
| 6,859,394 B2 | 2/2005 | Matsunaga et al. | |
| 6,925,004 B2 | 8/2005 | Shibata et al. | |
| 6,940,753 B2 | 9/2005 | Cernea | |
| 6,972,993 B2 | 12/2005 | Conley et al. | |
| 6,983,428 B2 | 1/2006 | Cernea | |
| 6,987,693 B2 | 1/2006 | Cernea et al. | |
| 6,992,936 B2 | 1/2006 | Tsujikawa et al. | |
| 6,999,344 B2 | 2/2006 | Hosono et al. | |
| 7,009,878 B2 | 3/2006 | Hosono et al. | |
| 7,012,835 B2 | 3/2006 | Gonzalez et al. | |
| 7,023,736 B2 | 4/2006 | Cernea et al. | |
| 7,038,946 B2 | 5/2006 | Hosono et al. | |
| 7,046,568 B2 | 5/2006 | Cernea | |
| 7,073,103 B2 | 7/2006 | Gongwer et al. | |
| 7,120,051 B2 | 10/2006 | Gorobets et al. | |
| 7,158,421 B2 | 1/2007 | Li et al. | |
| 7,177,197 B2 | 2/2007 | Cernea | |
| 7,187,585 B2 | 3/2007 | Li et al. | |
| 7,196,931 B2 | 3/2007 | Cernea et al. | |
| 7,206,230 B2 | 4/2007 | Li et al. | |
| 7,224,614 B1 | 5/2007 | Chan | |
| 7,245,528 B2 | 7/2007 | Shibata et al. | |
| 7,251,160 B2 | 7/2007 | Li et al. | |
| 7,301,805 B2 | 11/2007 | Gorobets et al. | |
| 7,301,808 B2 * | 11/2007 | Li et al. | 365/185.03 |
| 7,301,816 B2 * | 11/2007 | Li et al. | 365/185.2 |
| 7,301,839 B2 * | 11/2007 | Li et al. | 365/205 |
| 7,321,510 B2 | 1/2008 | Li et al. | |
| 2001/0006479 A1 | 7/2001 | Ikehashi et al. | |
| 2002/0036925 A1 | 3/2002 | Tanzawa et al. | |
| 2002/0039322 A1 | 4/2002 | Tran et al. | |
| 2002/0118574 A1 | 8/2002 | Gongwer et al. | |
| 2002/0126528 A1 | 9/2002 | Conley et al. | |
| 2002/0126532 A1 | 9/2002 | Matsunaga et al. | |
| 2003/0117850 A1 | 6/2003 | Yano | |
| 2004/0057285 A1 | 3/2004 | Cernea et al. | |
| 2004/0057287 A1 | 3/2004 | Cernea et al. | |
| 2004/0057318 A1 | 3/2004 | Cernea et al. | |
| 2004/0060031 A1 | 3/2004 | Cernea | |
| 2004/0109357 A1 | 6/2004 | Cernea et al. | |
| 2004/0109362 A1 | 6/2004 | Gongwer et al. | |
| 2004/0160829 A1 | 8/2004 | Tsujikawa et al. | |
| 2004/0210729 A1 | 10/2004 | Horii et al. | |
| 2004/0237000 A1 | 11/2004 | Keays | |
| 2005/0157560 A1 | 7/2005 | Hosono et al. | |
| 2005/0162913 A1 | 7/2005 | Chen | |
| 2005/0169082 A1 | 8/2005 | Cernea | |
| 2005/0257120 A1 | 11/2005 | Gorobets et al. | |
| 2006/0031593 A1 | 2/2006 | Sinclair | |
| 2006/0126390 A1 | 6/2006 | Gorobets et al. | |
| 2006/0126394 A1 | 6/2006 | Li | |
| 2006/0136687 A1 | 6/2006 | Smith et al. | |
| 2006/0140007 A1 | 6/2006 | Cernea et al. | |
| 2006/0209592 A1 | 9/2006 | Li et al. | |
| 2006/0221692 A1 | 10/2006 | Chen | |
| 2006/0221697 A1 | 10/2006 | Li et al. | |
| 2006/0221704 A1 | 10/2006 | Li et al. | |
| 2006/0221714 A1 | 10/2006 | Li et al. | |
| 2006/0233010 A1 | 10/2006 | Li | |
| 2006/0233021 A1 | 10/2006 | Lin et al. | |
| 2006/0233022 A1 | 10/2006 | Li | |
| 2006/0233023 A1 | 10/2006 | Lin et al. | |
| 2006/0233026 A1 | 10/2006 | Li | |
| 2006/0239080 A1 | 10/2006 | Li | |
| 2007/0002626 A1 | 1/2007 | Li | |
| 2007/0103982 A1 * | 5/2007 | Li et al. | 365/185.12 |
| 2007/0109846 A1 * | 5/2007 | Li et al. | 365/185.2 |
| 2007/0109867 A1 | 5/2007 | Li et al. | |

FOREIGN PATENT DOCUMENTS

| | | |
|---|---|---|
| EP | 1 134 746 A2 | 9/2001 |
| EP | 1164595 A1 | 12/2001 |
| EP | 1 209 568 A | 5/2002 |
| EP | 1280161 A1 | 1/2003 |
| EP | 1 473 737 A | 11/2004 |
| JP | 5282883 | 3/1992 |
| JP | 11003290 | 1/1999 |
| WO | WO 98/44420 | 10/1998 |
| WO | WO 00/49488 | 8/2000 |
| WO | WO 00/67137 | 11/2000 |
| WO | WO 02/49039 | 6/2002 |
| WO | WO 02/058074 | 7/2002 |

| WO | WO 02/069340 A1 | 9/2002 |
| WO | WO 03/029951 | 4/2003 |
| WO | WO 03/069627 | 8/2003 |
| WO | WO 2006/107633 | 10/2006 |
| WO | WO 2006/107654 | 10/2006 |
| WO | WO 2007/130976 | 11/2007 |
| WO | WO 2007/131059 | 11/2007 |
| WO | WO 2007/131062 | 11/2007 |

OTHER PUBLICATIONS

EPO/ISA, "Notification of Transmittal of the International Search Report and the Written Opinion of the International Searching Authority, or the Declaration," mailed in International Application No. PCT/US2006/011248 (published as WO2006/107654) on Jul. 24, 2006, 10 pages.

EPO/ISA, "Notification of Transmittal of the International Search Report and the Written Opinion of the International Searching Authority, or the Declaration," corresponding Internation Application No. PCT/US2007/068069, mailed on Jan. 23, 2008, 12 pages.

USPTO, "Office Action," mailed in related U.S. Appl. No. 11/381,997 on Mar. 18, 2008, 24 pages.

Imamiya et al., "A 125-mm2 1-Gb NAND Flash Memory with 10/Mbytes/s Program Speed," IEEE Journal of Solid-State Circuits, vol. 37, No. 11, Nov. 2002, pp. 1493-1501.

Lee et al., "High-Performance 1-Gb NAND Flash Memory with 0.12-μm Technology," Journal of Solid-State Circuits, Nov. 2002, vol. 37, No. 11, pp. 1502-1509.

Nakamura et al., "A Novel Sense Amplifier for Flexible Voltage Operation NAND Flash Memories," 1995 Symposium on VLSI Circuits Digest of Technical Papers, Jun. 8-10, 1995, pp. 71-72.

Srisa-an et al., "Performance Enhancements to the Active Memory System," 2002 IEEE International Conference on Computer Design: VLSI in Computers and Processors, Sep. 16-18, 2002, pp. 249-256.

USPTO, "Notice of Allowance and Fee(s) Due," mailed on related U.S. Appl. No. 11/381,997 on Sep. 10, 2008, 13 pages.

* cited by examiner

Input Logic Truth Table

| Transfer Mode | ONE | ONEB<0> | ONEB<1> | PBus (Input) | BSI (Output) |
|---|---|---|---|---|---|
| Pass-Through | 1 | 0 | 0 | PBus | PBus |
| Invert | 0 | 1 | 1 | PBus | PBus* |
| Float | 1 | 1 | 0 | PBus | Float |

Output Logic Truth Table

| Transfer Mode | PINV | NINV | PDIR | NDIR | MTCH | PBus (Output) |
|---|---|---|---|---|---|---|
| Pass-Through | D | D | D | 1 | 0 | 0 |
|  | 0 | D | D | D | 1 | 1 |
| Invert | D | D | 0 | D | 0 | 1 |
|  | D | 1 | D | D | 1 | 0 |
| Float | D | D | D | D | X | Z |
| Pre-Charge | 0 | D | 0 | D | X | 1 |

(Default Values: PINV=1, NINV=0, PDIR=1, NDIR=0)

Multistate Memory (LM Gray Code)

Lower Page Programming (LM Gray Code)

Upper Page Programming (LM Gray Code)

Lower Page Read (LM Gray Code)

Upper Page Read (LM Gray Code)

BACKGROUND NEXT PAGE DATA LOADING DURING LOWER PAGE PROGRAMMING

| Program Phase | Target States Verified | States to be Tracked for Programming | No of Latches Required | Code Table |
|---|---|---|---|---|
| "I" (initial) | None | "L", "A$_L$", "A", "B$_L$", "B", "C" | 3 | 3CT() |
| "A" Done | "A" | "L", "B$_L$", "B", C | 2 | 2CT("A") |
| "B" Done | "B" | "L", "A$_L$", "A", C | 2 | 2CT("B") |
| "C" Done | "C" | "L", "A$_L$", "A", "B$_L$", "B" | 3 | 3CT() |
| "A"+"B" Done | "A", "B" | "L", "C" | 1 | 1CT("A"+"B") |
| "A"+"C" Done | "A", "C" | "L", "B$_L$", "B" | 2 | 2CT("A"+"C") |
| "B"+"C" Done | "B", "C" | "L", "A$_L$", "A" | 2 | 2CT("B"+"C") |
| "A"+"B"+"C" Done | "A", "B", "C" | None | 0 | None |

"L" = Program Lockout

UPPER PAGE OR FULL SEQUENCE PROGRAMMING
TRACKING OF STATES DURING VARIOUS PROGRAM PHASES

FIG. 22

BACKGROUND NEXT PAGE DATA LOADING DURING UPPER PAGE OR FULL-SEQUENCE PROGRAMMING

BACKGROUND READ DURING LOWER PAGE PROGRAMMING

BACKGROUND READ DURING UPPER PAGE OR FULL-SEQUENCE PROGRAMMING

CONVENTIONAL CACHED MEMORY OPERATION

MULTIPLE MEMORY OPERATIONS MANAGEMENT

MANAGEMENT OF MULTIPLE MEMORY OPERATIONS

Cache Operation During Erase Operation

BACKGROUND PROGRAM DATA LOADING DURING ERASE PHASE

BACKGROUND PROGRAM DATA LOADING DURING SOFT PROGRAMMING PHASE

BACKGROUND READ DURING ERASE

Caching Read Scrubbing Operation During Erase Operation

PREEMPTIVE BACKGROUND READ DURING ERASE

Conventional Read Caching

**Logical Page Programming Sequence
to Minimize WL-WL Yupin Effect**

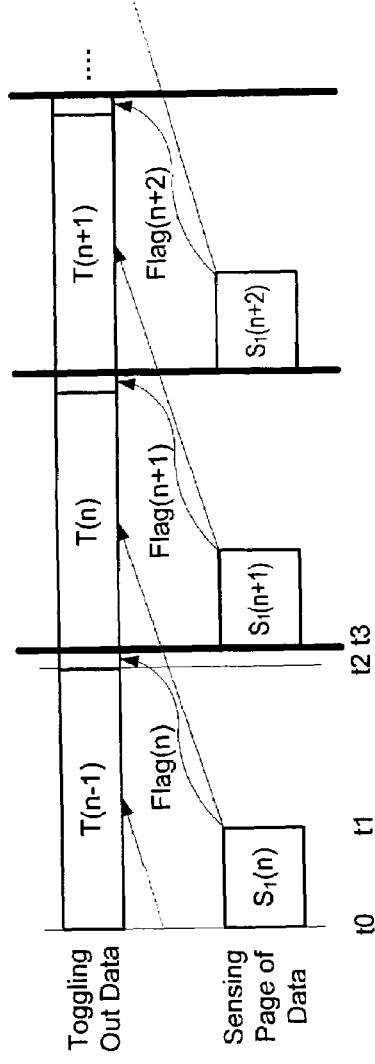
FIG. 38A Read Caching with LM Coding
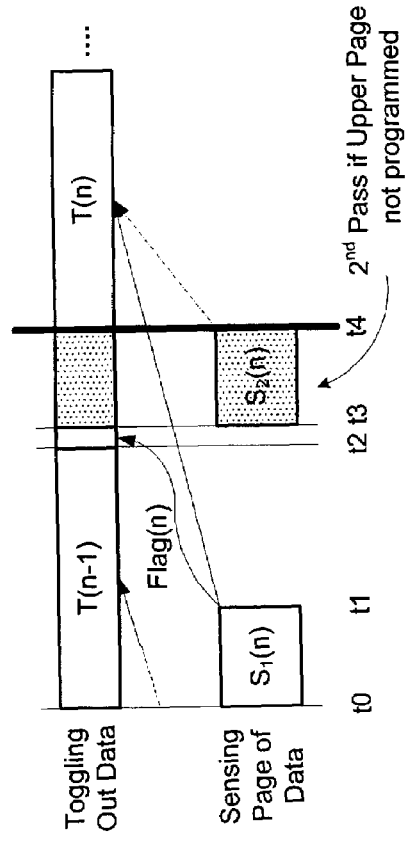
FIG. 38B Read Caching with LM Coding
(special case of reading lower logical page when upper page is not yet programmed)

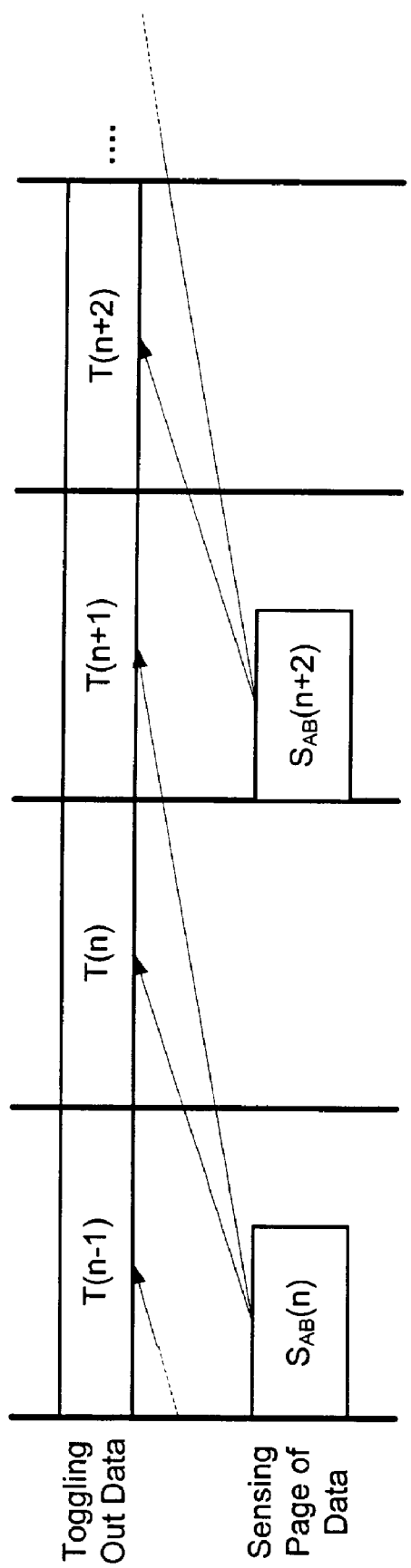
FIG. 39 Cache Read with All-Bit Sensing

Read Caching with LM Coding & LA Correction
(according to conventional scheme)

Improved Read Caching with LM Coding & LA Correction

Improved Read Caching with Lookahead Correction

Operation of the Prerequisite Lookahead Sensing

Operation of the Current Sensing

METHOD FOR NON-VOLATILE MEMORY WITH BACKGROUND DATA LATCH CACHING DURING READ OPERATIONS

CROSS REFERENCE TO RELATED APPLICATIONS

This application is a continuation-in-part of U.S. application Ser. No. 11/097,590 filed on Apr. 1, 2005 now U.S. Pat. No. 7,206,230. This application is also related to the following U.S. patent applications: U.S. application Ser. No. 11/097,517, filed Apr. 1, 2005, entitled "Use of Data Latches in Multi-Phase Programming of Non-Volatile Memories", by Yan Li and Raul-Adrian Cernea; U.S. application Ser No. 11/381,995, entitled "Method for Non-Volatile Memory with Background Data Latch Caching During Program Operations,"by Yan Li, filed concurrently herewith, on May 5, 2006; U.S. application Ser. No. 11/382,006, entitled "Non-Volatile Memory with Background Data Latch Caching During Program Operations,"by Yan Li, filed concurrently herewith, on May 5, 2006; U.S. application Ser. No. 11/382,001, entitled "Method for Non-Volatile Memory with Background Data Latch Caching During Erase Operations,"by Jason Lin and Yan Li, filed concurrently herewith, on May 5, 2006; U.S. application Ser. No. 11/381,998, entitled "Non-Volatile Memory with Background Data Latch Caching During Erase Operations,"by Jason Lin and Yan Li, filed concurrently herewith, on May 5, 2006; U.S. application Ser. No. 11/381,997, entitled "Non-Volatile Memory with Background Data Latch Caching During Read Operations,"by Yan Li, filed concurrently herewith, on May 5, 2006; U.S. application Ser. No. 11/381,996, entitled "Method for Non-Volatile Memory with Managed Execution of Cached Data,"by Yan Li, filed concurrently herewith, on May 5, 2006; and U.S. application Ser. No. 11/382,000, entitled "Non-Volatile Memory with Managed Execution of Cached Data,"by Yan Li, filed concurrently herewith, on May 5, 2006. These applications are incorporated herein by reference in their entirety for all purposes.

FIELD OF THE INVENTION

This invention relates generally to non-volatile semiconductor memory such as electrically erasable programmable read-only memory (EEPROM) and flash EEPROM, and specifically to cache operations based on shared latch structures allowing overlapping memory operations.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the Ti's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1—left and T1—right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1—left is being accessed, both the T2 and T1—right are turned on to allow the current in the T1—left's portion of the channel to pass between the source and the drain. Similarly, when the storage unit T1—right is being accessed, T2 and T1—left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903, 495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIGS. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 1D) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 μA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

FIG. 6A is a schematic block diagram of an individual read/write module 190. Essentially, during read or verify, a sense amplifier determines the current flowing through the drain of an addressed memory transistor connected via a selected bit line. The current depends on the charge stored in the memory transistor and its control gate voltage. For example, in a multi-state EEPROM cell, its floating gate can be charged to one of several different levels. For a 4-level cell, it may be used to store two bits of data. The level detected by the sense amplifier is converted by a level-to-bits conversion logic to a set of data bits to be stored in a data latch.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

Referring to FIG. 5, the read/write circuits 170 is organized into banks of read/write stacks 180. Each read/write stack 180 is a stack of read/write modules 190. In a memory array, the column spacing is determined by the size of the one or two transistors that occupy it. However, as can be seen from FIG. 6A, the circuitry of a read/write module will likely be implemented with many more transistors and circuit elements and therefore will occupy a space over many columns. In order to service more than one column among the occupied columns, multiple modules are stacked up on top of each other.

FIG. 6B shows the read/write stack of FIG. 5 implemented conventionally by a stack of read/write modules 190. For example, a read/write module may extend over sixteen columns, then a read/write stack 180 with a stack of eight read/write modules can be used to service eight columns in parallel. The read/write stack can be coupled via a column decoder to either the eight odd (1, 3, 5, 7, 9, 11, 13, 15) columns or the eight even (2, 4, 6, 8, 10, 12, 14, 16) columns among the bank.

As mentioned before, conventional memory devices improve read/write operations by operating in a massively parallel manner on all even or all odd bit lines at a time. This architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage element is sandwiched between a channel region and a control gate. The current that flows in the channel region is a function of the resultant electric field contributed by the field at the control gate and the charge storage element. With ever increasing density, memory transistors are formed closer and closer together. The field from neighboring charge elements then becomes significant contributor to the resultant field of an affected cell. The neighboring field depends on the charge programmed into the charge storage elements of the neighbors. This perturbing field is dynamic in nature as it changes with the programmed states of the neighbors. Thus, an affected cell may read differently at different time depending on the changing states of the neighbors.

The conventional architecture of interleaving page exacerbates the error caused by neighboring floating gate coupling. Since the even page and the odd page are programmed and read independently of each other, a page may be programmed under one set of condition but read back under an entirely different set of condition, depending on what has happened to the intervening page in the meantime. The read errors will become more severe with increasing density, requiring a more accurate read operation and coarser partitioning of the threshold window for multi-state implementation. Performance will suffer and the potential capacity in a multi-state implementation is limited.

United States Patent Publication No. US-2004-0060031-A1 discloses a high performance yet compact non-volatile memory device having a large block of read/write circuits to read and write a corresponding block of memory cells in parallel. In particular, the memory device has an architecture that reduces redundancy in the block of read/write circuits to a minimum. Significant saving in space as well as power is accomplished by redistributing the block of read/write modules into a block read/write module core portions that operate in parallel while interacting with a substantially smaller sets of common portions in a time-multiplexing manner. In particular, data processing among read/write circuits between a plurality of sense amplifiers and data latches is performed by a shared processor.

Therefore there is a general need for high performance and high capacity non-volatile memory. In particular, there is a need for a compact non-volatile memory with enhanced read and program performance having an improved processor that is compact and efficient, yet highly versatile for processing data among the read/writing circuits.

SUMMARY OF INVENTION

According to one aspect of the invention, cache operations are presented that allow data to be transferred in or out of a memory while the internal memory is engaged in another operation, such as a read, program or erase. In particular, arrangements of data latches and methods of their use are described which allow such cache operations.

Architectures are described where data latches are shared by a number of physical pages. For example, read/write stacks are associated with the bit lines of the memory, which shared by multiple word lines. While one operation is going on in the memory, if any of these latch are free, they can cache data for future operations in the same or another word line, saving transfer time as this can be hidden behind another operation. This can improve performance by increasing the amount of pipelining of different operations or phases of operations. In one example, in a cache program operation, while programming one page of data another page of data can be loaded in, saving on transfer time. For another example, in one exemplary embodiment, a read operation on one word line is inserted into a write operation on another word line, allowing the data from the read to be transferred out of the memory while the data write continues on.

According to the various aspects, data from another page in the same block, but on a different word line, can be toggled out (to, for example, do an ECC operation) while a write or other operation is going on for the first page of data. This inter-phase pipelining of operations allows the time needed for the data transfer to be hidden behind the operation on the first page of data. More generally, this allows a portion of one operation to be inserted between phases of another, typically longer, operation. Another example would be to insert a sensing operation between phases of, say, an erase operation, such as before an erase pulse or before a soft programming phase used as the later part of the erase.

If a relatively long operation with different phases is being performed, a primary aspect will interpose in a quicker operation using the shared latches of the read/write stacks if latches available. For example, a read can be inserted into a program or erase operation, or a binary program can be inserted into an erase. The primary exemplary embodiments will toggle data in and/or out for one page during a program operation for another page that shares the same read write stacks, where, for example, a read of the data to be toggled out and modified is inserted into the verify phase of the data write.

The availability of open data latches can arise in a number of ways. Generally, for a memory storing n bits per cell, n such data latches will be needed for each bit line; however, not all of these latches are needed at all times. For example, in a two-bit per cell memory storing data in an upper page/lower page format, one data latches will be needed while programming the lower page (with another latch used if quick pass write is implemented). Two data latches will be needed while programming the upper page (with a third latch used if quick pass write is implemented)). More generally, for memories storing multiple pages, all of the latches will be needed only when programming the highest page. This leaves the other latches available for cache operations. Further, even while writing the highest page, as the various states are removed from the verify phase of the write operation, latches will free up. Specifically, once only the highest state remains to be verified, only a single latch is needed for verification purposes and the others may be used for cache operations.

An exemplary embodiment is based on a four state memory storing two-bits per cell and having two latches for data on each bit line and one additional latch for quick pass write. The operations of writing the lower page, or erasing, or doing a post erase soft program are basically a binary operation and have one of the data latches free, which can use it to cache data. Similarly, where doing an upper page or full sequence write, once all but the highest level has verified, only a single state needs to verify and the memory can free up a latch that can be used to cache data. An example of how this can be used is that when programming one page, such as in a copy operation, a read of another page that shares the same set of data latches, such as another word line on the same set of bit lines, can be slipped in between program pulse and verifies of the write. The address can then be switched to the page being written, allowing the write process to pick up where it left off without having to restart. While the write continues, the data cached during the interpolated read can be toggled out, checked or modified and transferred back to be present for writing back in once the earlier write operation completes. This sort cache operation allows the toggling out and modification of the second page of data to be hidden behind the programming of the first page.

Cache Operations During Read—Background Read and Write Operations

According to one aspect of the invention, a read cache scheme is provided for the case of multi-state memory cells with the need to minimize perturbation between the memory cells (Yupin Effect.) The scheme for caching read data is such that even for read operation whose correction depend on data from a neighboring physical page or wordline, the data latches and I/O bus are efficiently used to toggle out a previously read page while a current page is being sensed from the memory core.

In a preferred implementation, the efficient read caching scheme is employed for memory encoded with the "LM"

coding and read with look-ahead ("LA") correction. Both the "LM" coding and "LA" correction require additional latch and bus activities besides the mere toggling of read data. When the read for a current page on a current wordline must be preceded by a prerequisite read of data on an adjacent wordline, the prerequisite read along with any I/O access is preemptively done in the cycle for reading a previous page so that the current read can be performed while the previously read page is busy with the I/O access.

According to another aspect of the invention, a read caching scheme is implemented for multi-bit pages of memory cells where more than one bit is sensed together. In the preferred implementation, all of the multi-bits are sensed together. The multi-bit pages of memory cells sensed correspond to multiple binary pages, one for each of the multi-bits. The binary pages are outputting in each cycle, while in multiple of cycles the multi-bit sensing is performed. The multiple being the same as the number of bits in the multi-bits.

Additional features and advantages of the present invention will be understood from the following description of its preferred embodiments, which description should be taken in conjunction with the accompanying drawings.

BRIEF DESCRIPTION OF THE DRAWINGS

FIG. 13 is a simplified version of FIG. 10 that shows some specific elements that are relevant to the present discussion in a two-bit embodiment of the present invention FIG. 14 indicates the latch assignment for the same elements as FIG. 13 for upper page program where the lower page data is read in.

FIG. 22 is a table showing the number of states that needs to be tracked during various phases of a 4-state upper page or full sequence programming employing QWP.

FIG. 38A is a schematic timing diagram for cache reading a logical page encoded with the LM code.

FIG. 38B is a schematic timing diagram for cache reading with LM code in the special case of reading a lower-bit logical page when the upper-bit logical page has not yet been programmed.

FIG. 39 illustrates a schematic timing diagram for cache read with all-bit sensing for a 2-bit memory.

DETAILED DESCRIPTION OF THE PREFERRED EMBODIMENTS

Figure 1A:
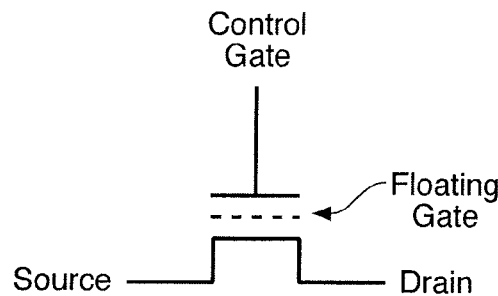
FIGS. 1A-1E illustrate schematically different examples of non-volatile memory cells.
Figure 1B:
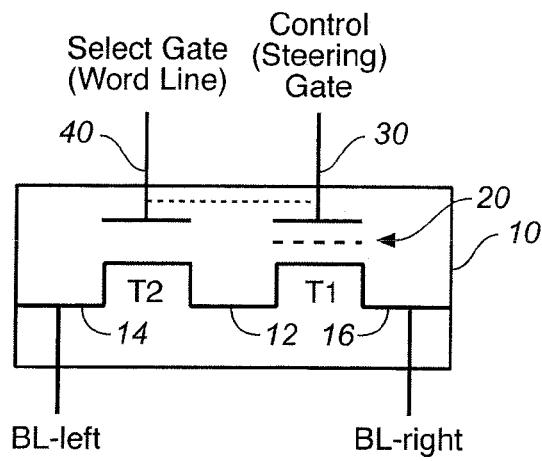
Figure 1C:
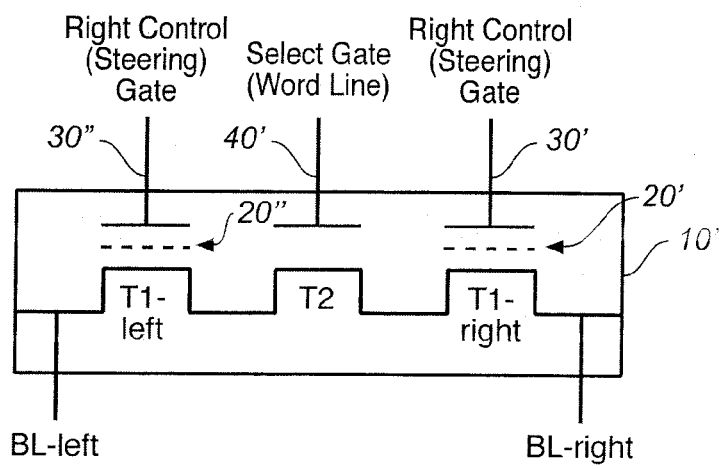
Figure 1D:
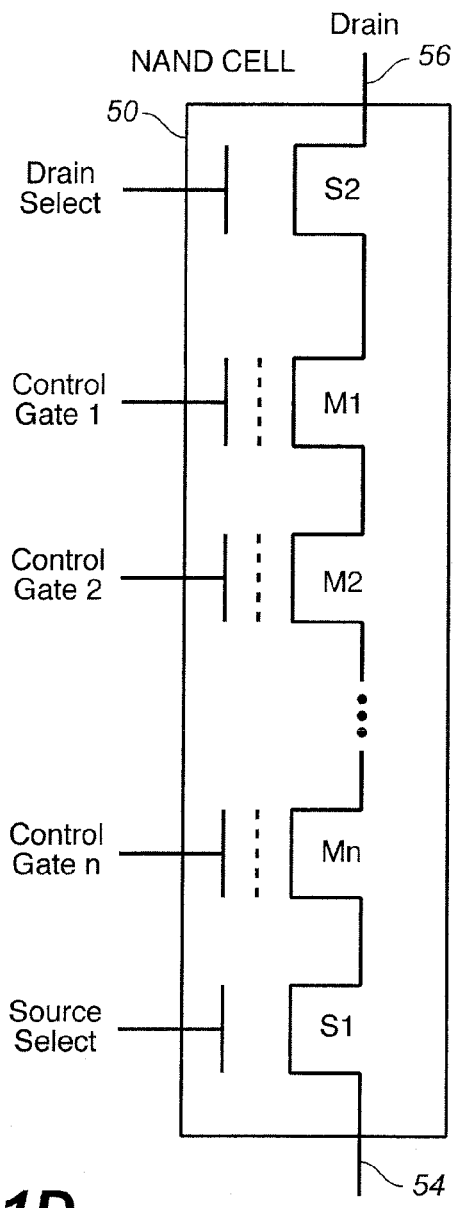
Figure 1E:
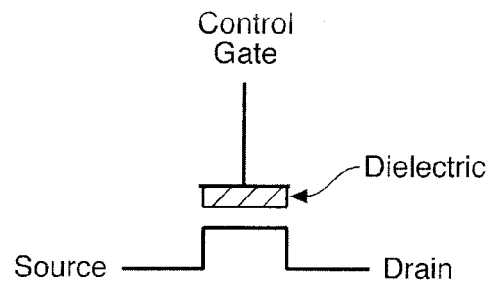
Figure 2:
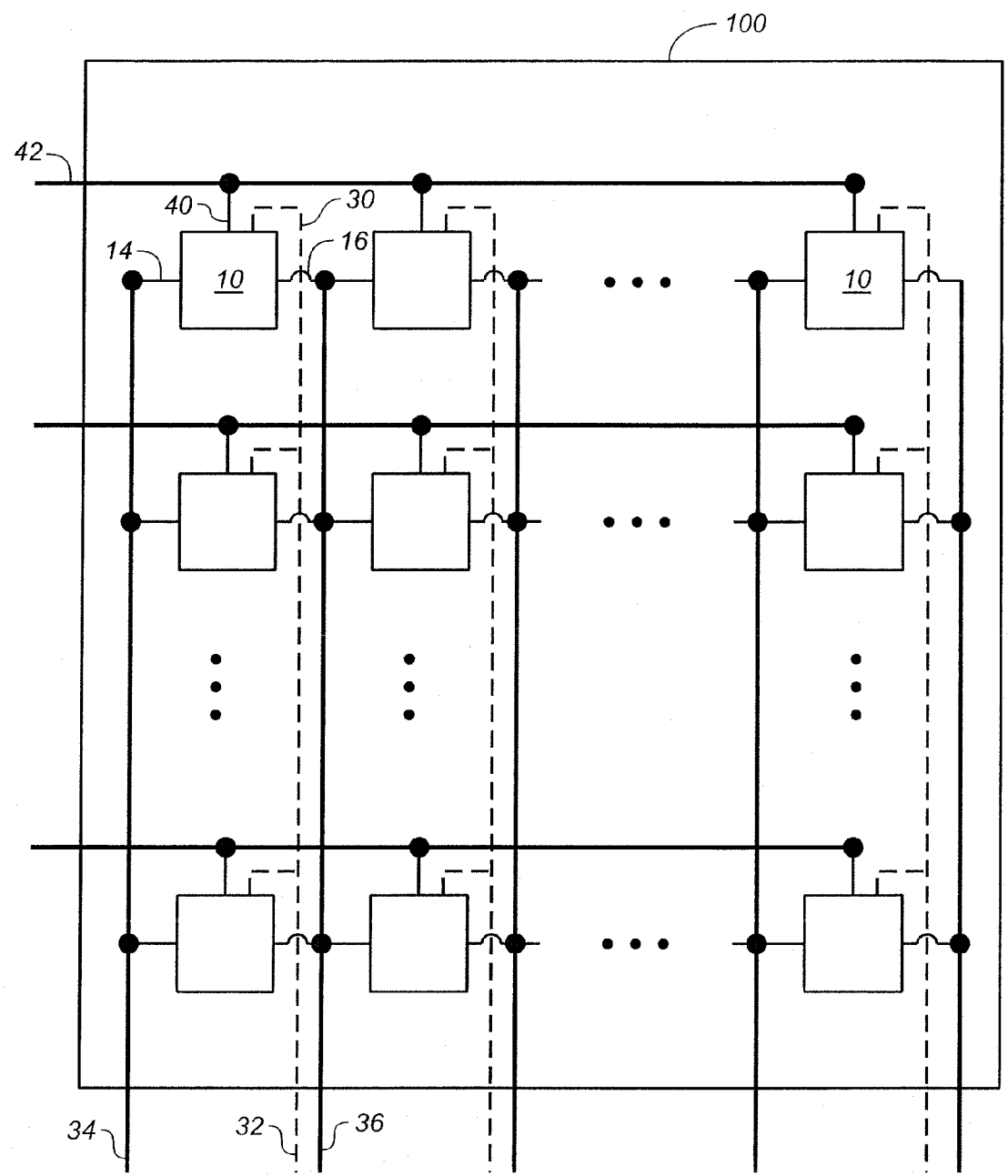
FIG. 2 illustrates an example of an NOR array of memory cells.
Figure 3:
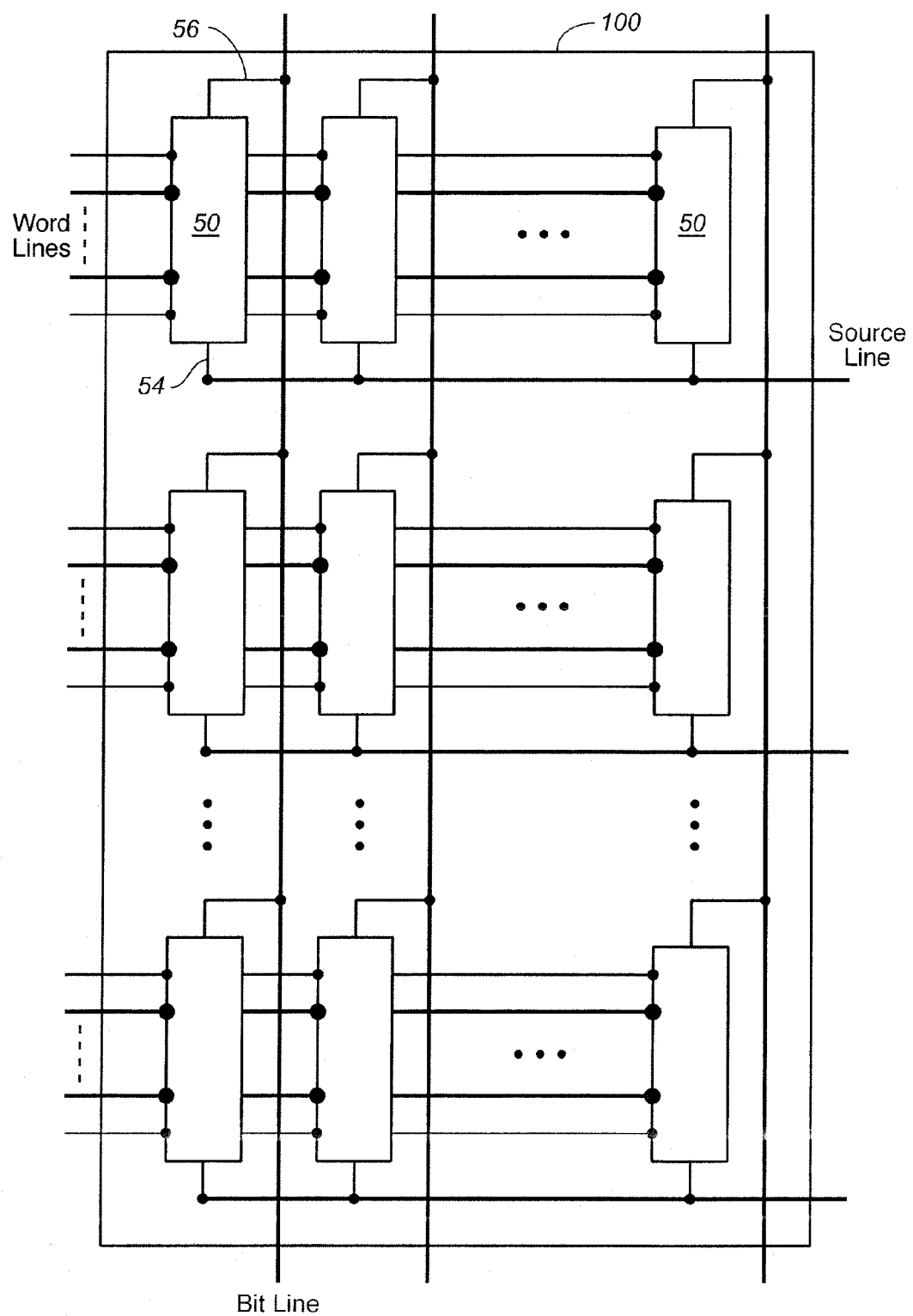
FIG. 3 illustrates an example of an NAND array of memory cells, such as that shown in FIG. 1D.
Figure 4:
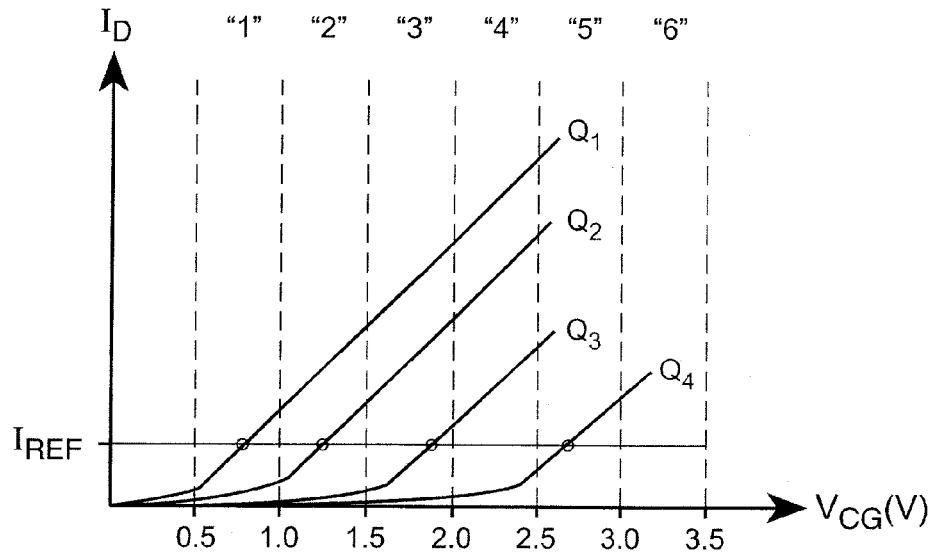
FIG. 4 illustrates the relation between the source-drain current and the control gate voltage for four different charges Q1-Q4 that the floating gate may be storing at any one time.
Figure 5:
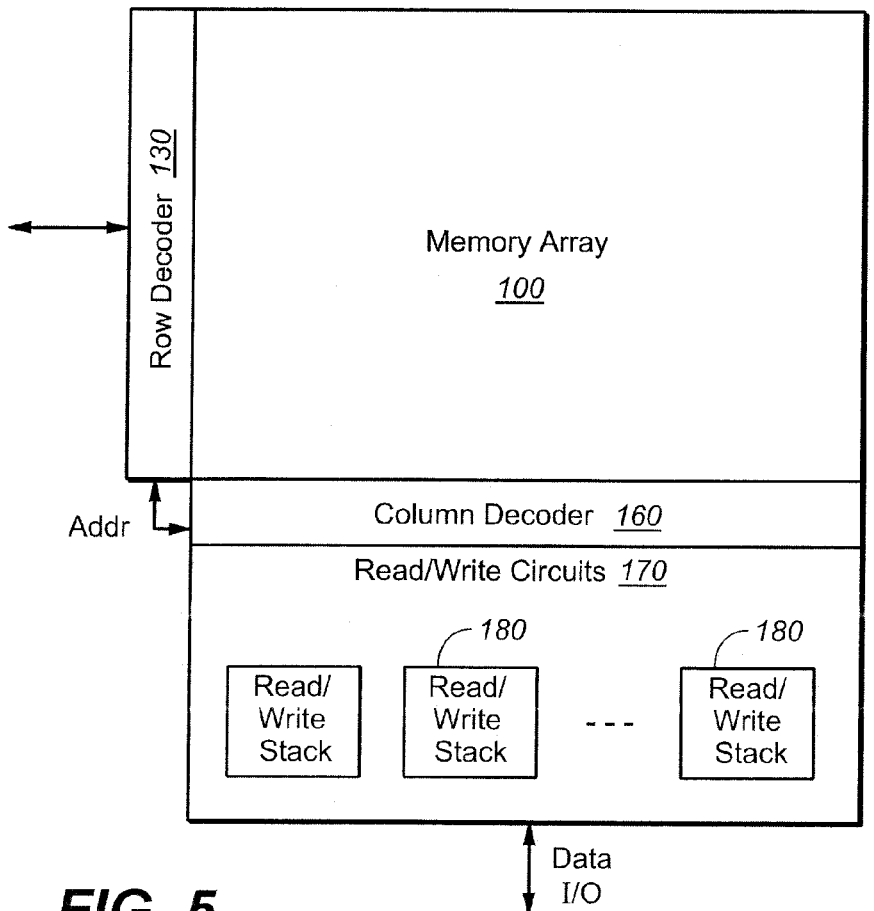
FIG. 5 illustrates schematically a typical arrangement of a memory array accessible by read/write circuits via row and column decoders.
Figure 6A:
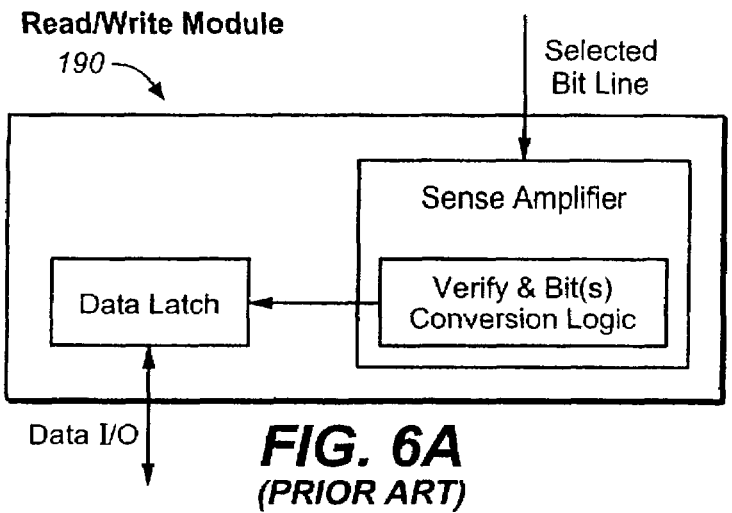
FIG. 6A is a schematic block diagram of an individual read/write module.
Figure 6B:
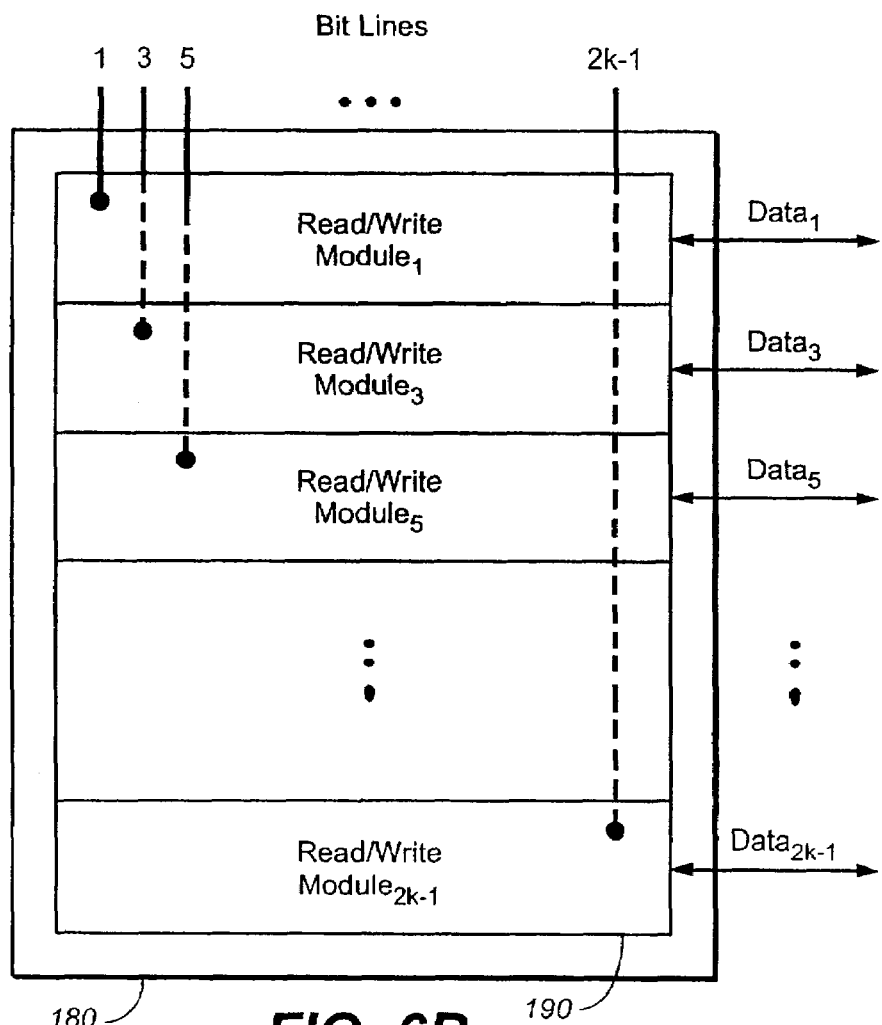
FIG. 6B shows the read/write stack of FIG. 5 implemented conventionally by a stack of read/write modules.
Figure 7A:
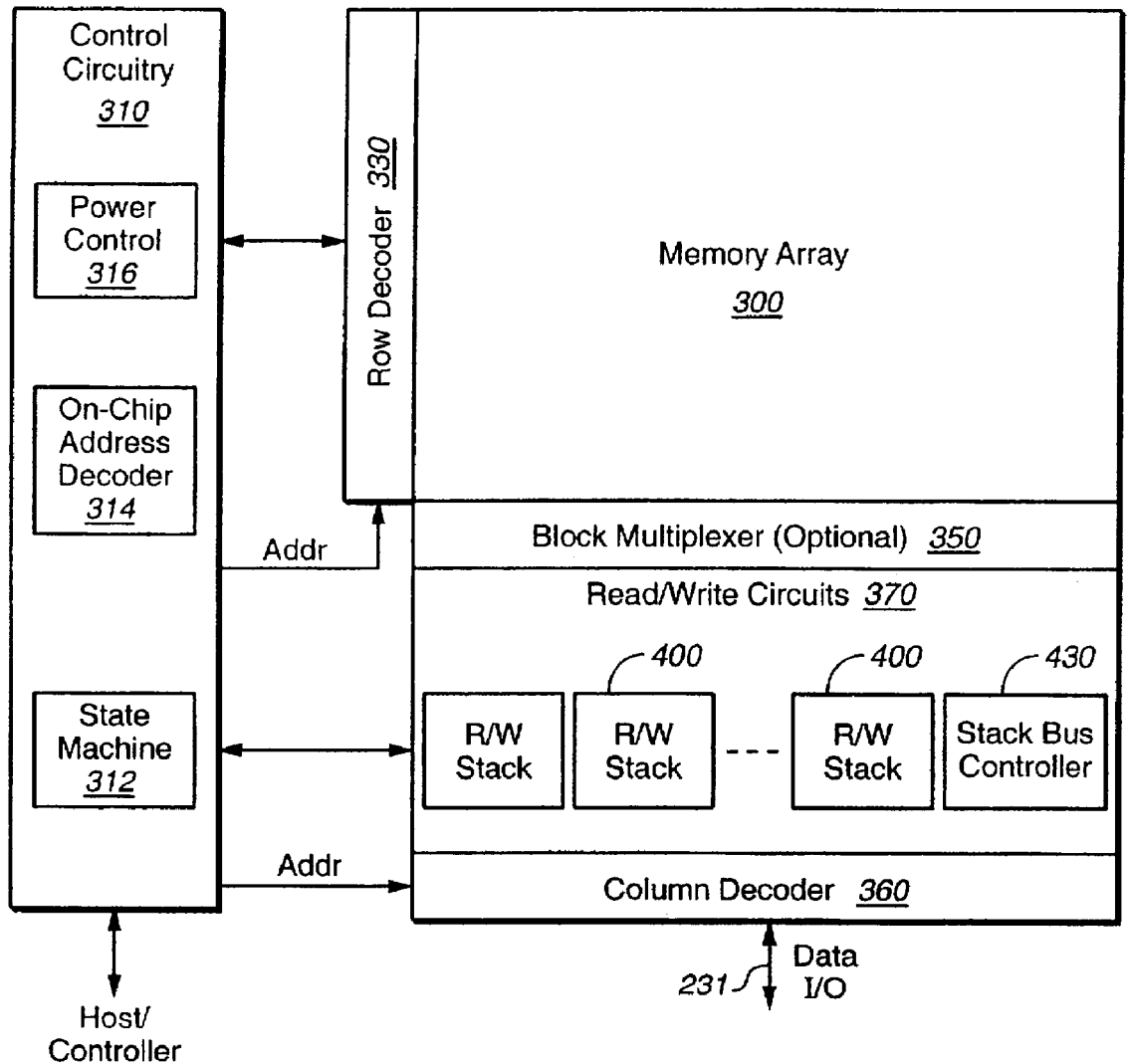
FIG. 7A illustrates schematically a compact memory device having a bank of partitioned read/write stacks, in which the improved processor of the present invention is implemented.

FIG. 7A illustrates schematically a compact memory device having a bank of partitioned read/write stacks, in which the improved processor of the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of partitioned read/write stacks 400 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 7B:
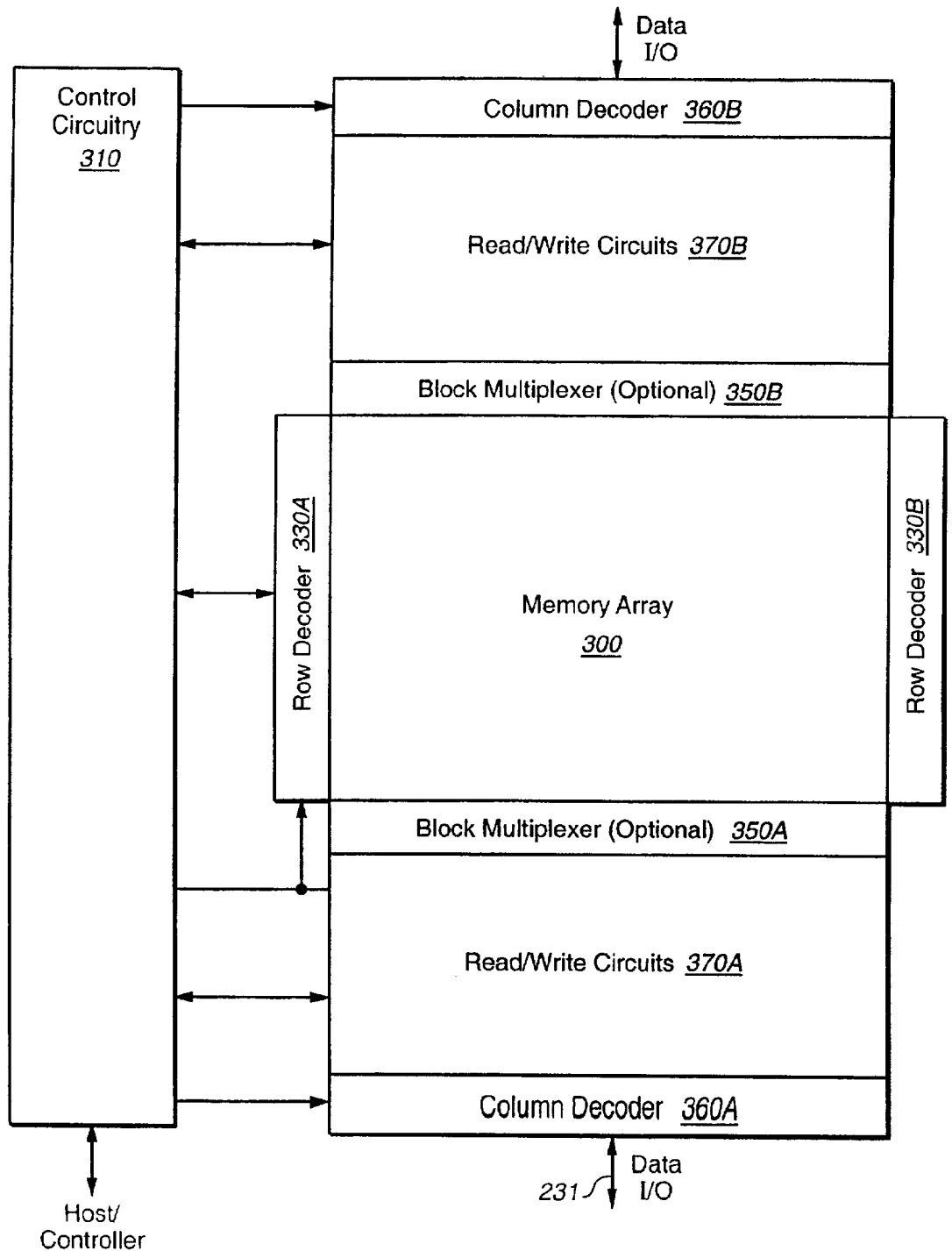
FIG. 7B illustrates a preferred arrangement of the compact memory device shown in FIG. 7A.

FIG. 7B illustrates a preferred arrangement of the compact memory device shown in FIG. 7A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the partitioned read/write stacks 400, is essentially reduced by one half.

Figure 8:
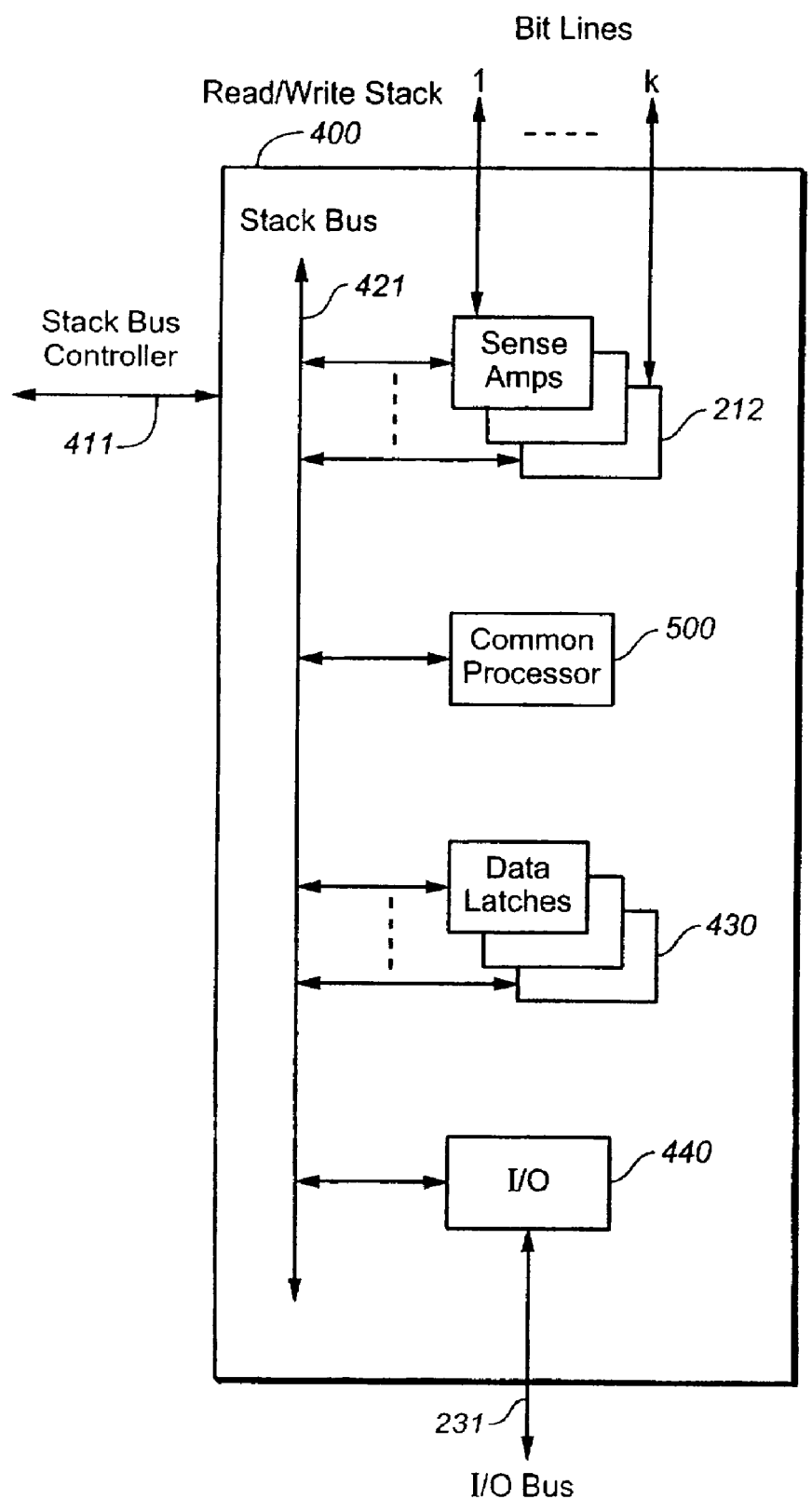
FIG. 8 illustrates schematically a general arrangement of the basic components in a read/write stack shown in FIG. 7A.

FIG. 8 illustrates schematically a general arrangement of the basic components in a read/write stack shown in FIG. 7A. According to a general architecture of the invention, the read/write stack 400 comprises a stack of sense amplifiers 212 for sensing k bit lines, an I/O module 440 for input or output of data via an I/O bus 231, a stack of data latches 430 for storing input or output data, a common processor 500 to process and store data among the read/write stack 400, and a stack bus 421 for communication among the stack components. A stack bus controller among the read/write circuits 370 provides control and timing signals via lines 411 for controlling the various components among the read/write stacks.

Figure 9:
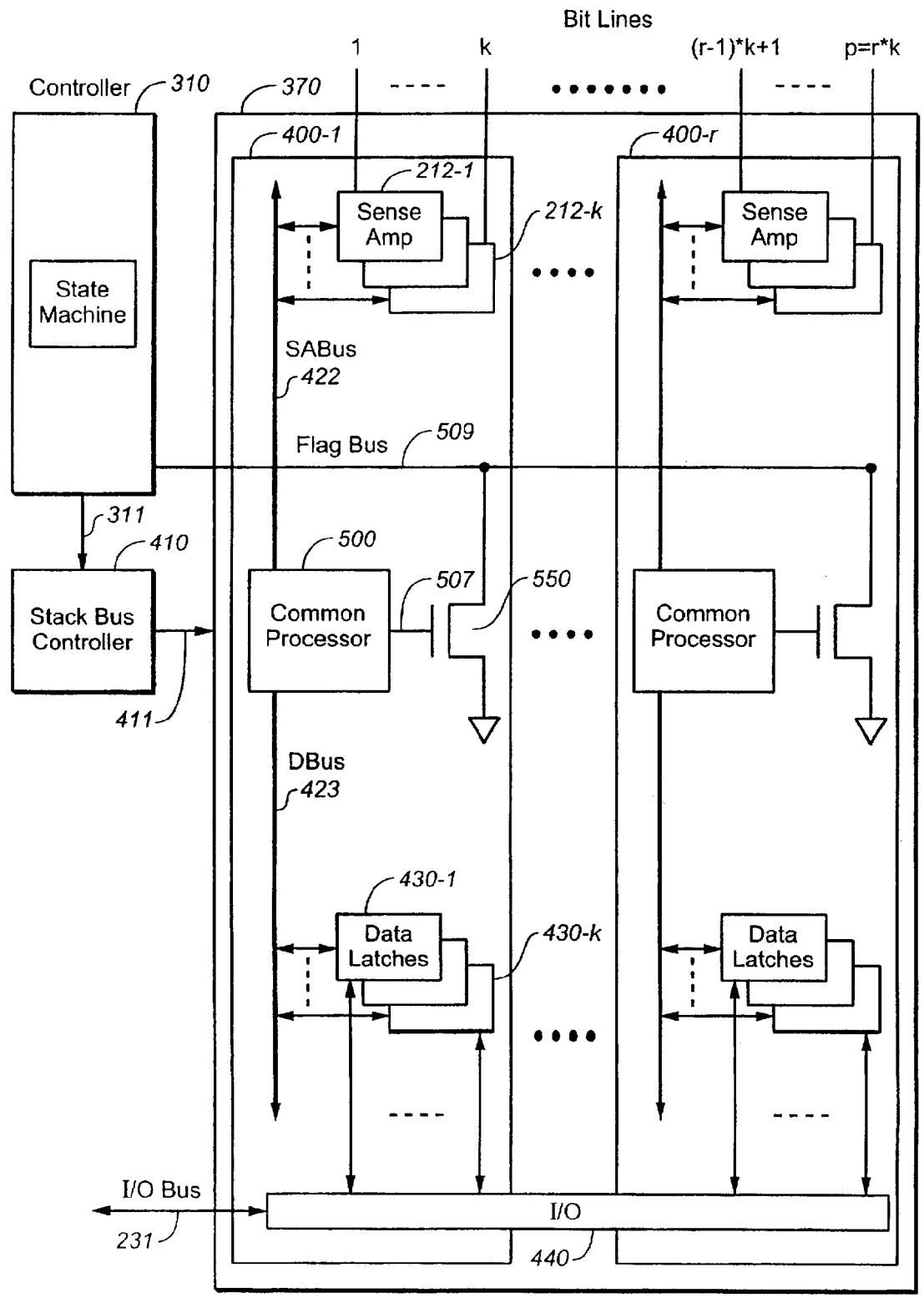
FIG. 9 illustrates one preferred arrangement of the read/write stacks among the read/write circuits shown in FIGS. 7A and 7B.

FIG. 9 illustrates one preferred arrangement of the read/write stacks among the read/write circuits shown in FIGS. 7A and 7B. Each read/write stack 400 operates on a group of k bit lines in parallel. If a page has p=r*k bit lines, there will be r read/write stacks, 400-1, . . . , 400-r.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=512 bytes (512×8 bits), k=8, and therefore r=512. In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells.

Each read/write stack, such as 400-1, essentially contains a stack of sense amplifiers 212-1 to 212-k servicing a segment of k memory cells in parallel. A preferred sense amplifier is disclosed in United States Patent Publication No. 2004-0109357-A1, the entire disclosure of which is hereby incorporated herein by reference.

The stack bus controller 410 provides control and timing signals to the read/write circuit 370 via lines 411. The stack bus controller is itself dependent on the memory controller 310 via lines 311. Communication among each read/write stack 400 is effected by an interconnecting stack bus 431 and controlled by the stack bus controller 410. Control lines 411 provide control and clock signals from the stack bus controller 410 to the components of the read/write stacks 400-1.

In the preferred arrangement, the stack bus is partitioned into a SABus 422 for communication between the common processor 500 and the stack of sense amplifiers 212, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Figure 10:
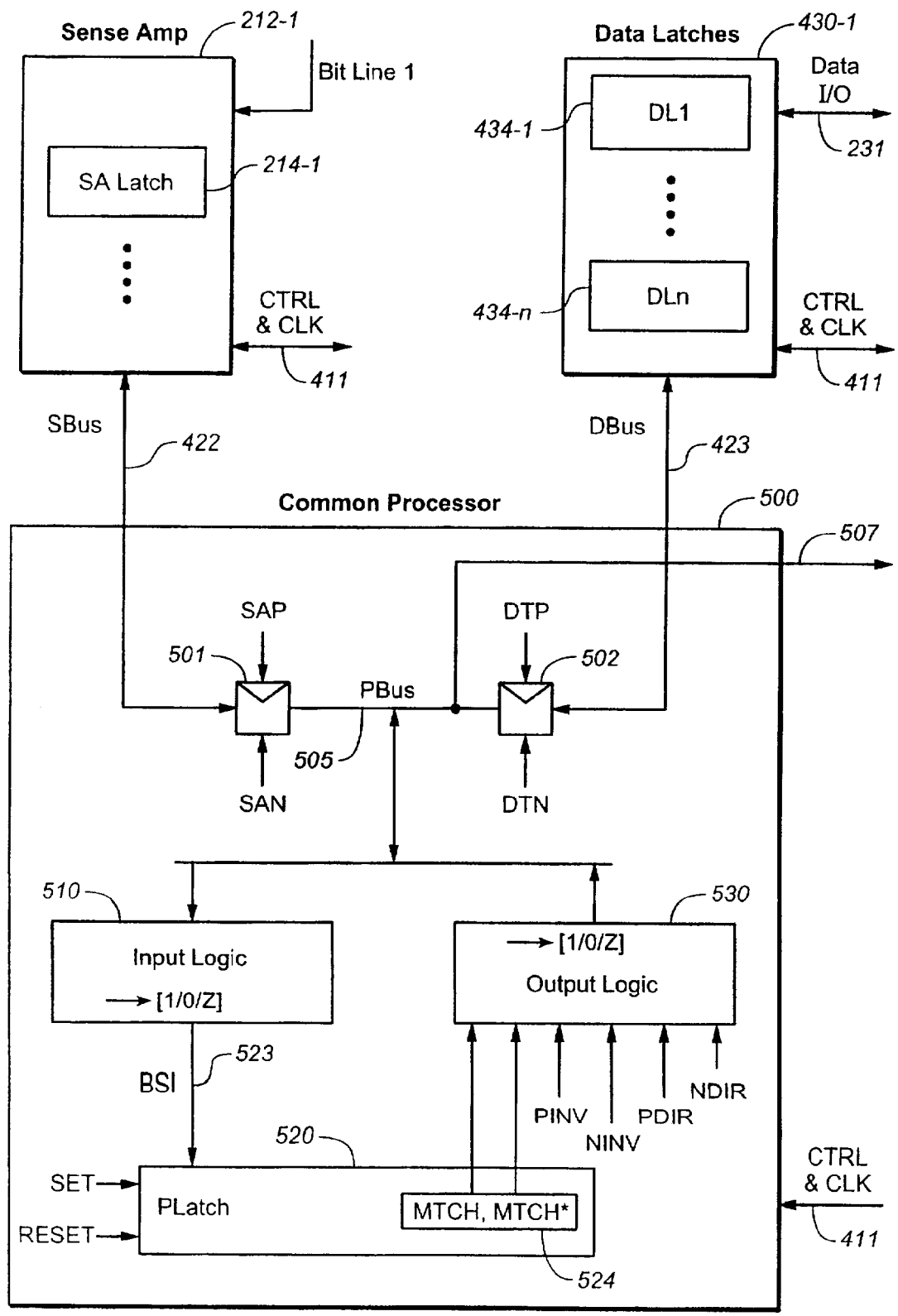
FIG. 10 illustrates an improved embodiment of the common processor shown in FIG. 9.

FIG. 10 illustrates an improved embodiment of the common processor shown in FIG. 9. The common processor 500 comprises a processor bus, PBUS 505 for communication with external circuits, an input logic 510, a processor latch PLatch 520 and an output logic 530.

The input logic 510 receives data from the PBUS and outputs to a BSI node as a transformed data in one of logical states "1", "0", or "Z" (float) depending on the control signals from the stack bus controller 410 via signal lines 411. A Set/Reset latch, PLatch 520 then latches BSI, resulting in a pair of complementary output signals as MTCH and MTCH*.

The output logic 530 receives the MTCH and MTCH* signals and outputs on the PBUS 505 a transformed data in one of logical states "1", "0", or "Z" (float) depending on the control signals from the stack bus controller 410 via signal lines 411.

At any one time the common processor 500 processes the data related to a given memory cell. For example, FIG. 10 illustrates the case for the memory cell coupled to bit line 1. The corresponding sense amplifier 212-1 comprises a node where the sense amplifier data appears. In the preferred embodiment, the node assumes the form of a SA Latch, 214-1 that stores data. Similarly, the corresponding set of data latches 430-1 stores input or output data associated with the memory cell coupled to bit line 1. In the preferred embodiment, the set of data latches 430-1 comprises sufficient data latches, 434-1, . . . , 434-n for storing n-bits of data.

The PBUS 505 of the common processor 500 has access to the SA latch 214-1 via the SBUS 422 when a transfer gate 501 is enabled by a pair of complementary signals SAP and SAN. Similarly, the PBUS 505 has access to the set of data latches 430-1 via the DBUS 423 when a transfer gate 502 is enabled by a pair of complementary signals DTP and DTN. The signals SAP, SAN, DTP and DTN are illustrated explicitly as part of the control signals from the stack bus controller 410.

Figures 11A, 11B:
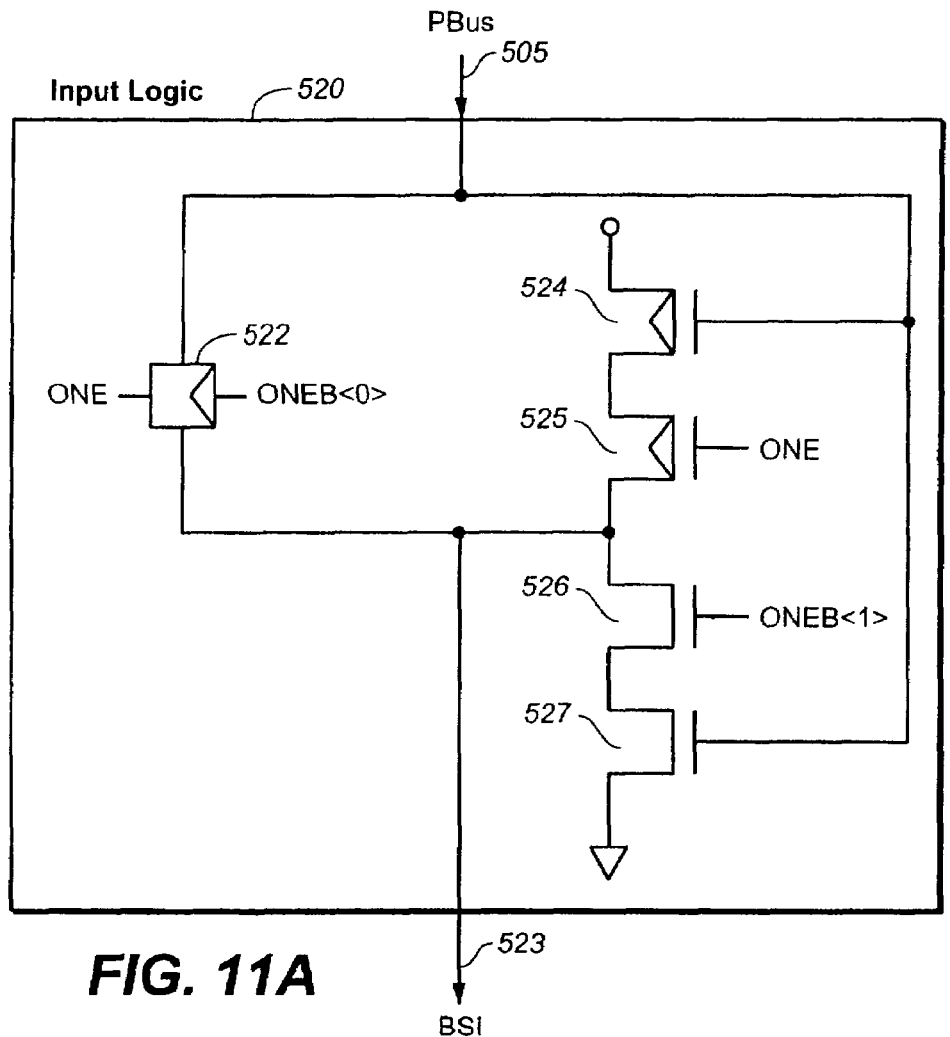
FIG. 11A illustrates a preferred embodiment of the input logic of the common processor shown in FIG. 10.
FIG. 11B illustrates the truth table of the input logic of FIG. 11A.

FIG. 11A illustrates a preferred embodiment of the input logic of the common processor shown in FIG. 10. The input logic 520 receives the data on the PBUS 505 and depending on the control signals, either has the output BSI being the same, or inverted, or floated. The output BSI node is essentially affected by either the output of a transfer gate 522 or a pull-up circuit comprising p-transistors 524 and 525 in series to Vdd, or a pull-down circuit comprising n-transistors 526 and 527 in series to ground. The pull-up circuit has the gates to the p-transistor 524 and 525 respectively controlled by the signals PBUS and ONE. The pull-down circuit has the gates to the n-transistors 526 and 527 respectively controlled by the signals ONEB<1> and PBUS.

FIG. 11B illustrates the truth table of the input logic of FIG. 11A. The logic is controlled by PBUS and the control signals ONE, ONEB<0>, ONEB<1> which are part of the control signals from the stack bus controller 410. Essentially, three transfer modes, PASSTHROUGH, INVERTED, and FLOATED, are supported.

In the case of the PASSTHROUGH mode where BSI is the same as the input data, the signals ONE is at a logical "1", ONEB<0> at "0" and ONEB<1> at "0". This will disable the pull-up or pull-down but enable the transfer gate 522 to pass the data on the PBUS 505 to the output 523. In the case of the INVERTED mode where BSI is the invert of the input data, the signals ONE is at "0", ONEB<0> at "1" and ONE<1> at "1". This will disable the transfer gate 522. Also, when PBUS is at "0", the pull-down circuit will be disabled while the pull-up circuit is enabled, resulting in BSI being at "1". Similarly, when PBUS is at "1", the pull-up circuit is disabled while the pull-down circuit is enabled, resulting in BSI being at "0". Finally, in the case of the FLOATED mode, the output BSI can be floated by having the signals ONE at "1", ONEB<0> at "1" and ONEB<1> at "0". The FLOATED mode is listed for completeness although in practice, it is not used.

Figures 12A, 12B:
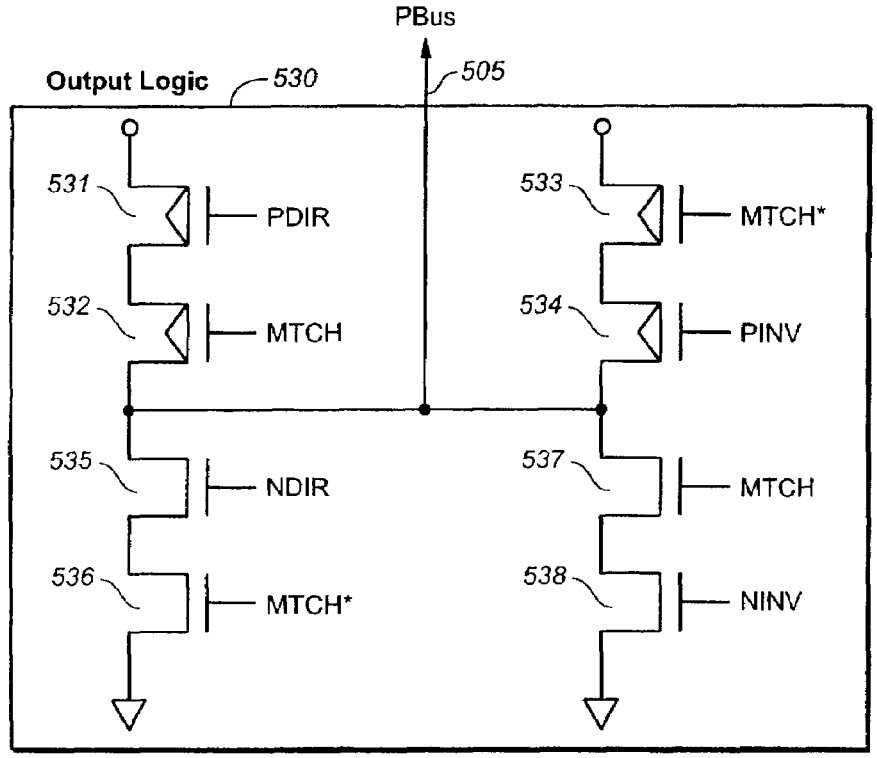
FIG. 12A illustrates a preferred embodiment of the output logic of the common processor shown in FIG. 10.
FIG. 12B illustrates the truth table of the output logic of FIG. 12A.

FIG. 12A illustrates a preferred embodiment of the output logic of the common processor shown in FIG. 10. The signal at the BSI node from the input logic 520 is latched in the processor latch, PLatch 520. The output logic 530 receives the data MTCH and MTCH* from the output of PLatch 520 and depending on the control signals, outputs on the PBUS as either in a PASSTHROUGH, INVERTED OR FLOATED mode. In other words, the four branches act as drivers for the PBUS 505, actively pulling it either to a HIGH, LOW or FLOATED state. This is accomplished by four branch circuits, namely two pull-up and two pull-down circuits for the PBUS 505. A first pull-up circuit comprises p-transistors 531 and 532 in series to Vdd, and is able to pull up the PBUS when MTCH is at "0". A second pull-up circuit comprises p-transistors 533 and 534 in series to ground and is able to pull up the PBUS when MTCH is at "1". Similarly, a first pull-down circuit comprises n-transistors 535 and 536 in series to Vdd, and is able to pull down the PBUS when MTCH is at "0". A second pull-up circuit comprises n-transistors 537 and 538 in series to ground and is able to pull up the PBUS when MTCH is at "1".

One feature of the invention is to constitute the pull-up circuits with PMOS transistors and the pull-down circuits with NMOS transistors. Since the pull by the NMOS is much stronger than that of the PMOS, the pull-down will always overcome the pull-up in any contentions. In other words, the node or bus can always default to a pull-up or "1" state, and if desired, can always be flipped to a "0" state by a pull-down.

FIG. 12B illustrates the truth table of the output logic of FIG. 12A. The logic is controlled by MTCH, MTCH* latched from the input logic and the control signals PDIR, PINV, NDIR, NINV, which are part of the control signals from the stack bus controller 410. Four operation modes, PASSTHROUGH, INVERTED, FLOATED, and PRECHARGE are supported.

In the FLOATED mode, all four branches are disabled. This is accomplished by having the signals PINV=1, NINV=0, PDIR=1, NDIR=0, which are also the default values. In the PASSTHROUGH mode, when MTCH=0, it will require PBUS=0. This is accomplished by only enabling the pull-down branch with n-transistors 535 and 536, with all control signals at their default values except for NDIR=1. When MTCH=1, it will require PBUS=1. This is accomplished by only enabling the pull-up branch with p-transistors 533 and 534, with all control signals at their default values except for PINV=0. In the INVERTED mode, when MTCH=0, it will require PBUS=1. This is accomplished by only enabling the pull-up branch with p-transistors 531 and 532, with all control signals at their default values except for PDIR=0. When MTCH=1, it will require PBUS=0. This is accomplished by only enabling the pull-down branch with n-transistors 537 and 538, with all control signals at their default values except for NINV=1. In the PRECHARGE mode, the control signals settings of PDIR=0 and PINV=0 will either enable the pull-up branch with p-transistors 531 and 531 when MTCH=1 or the pull-up branch with p-transistors 533 and 534 when MTCH=0.

Common processor operations are developed more fully in U.S. patent application Ser. No. 11/026,536, Dec. 29, 2004, which is hereby incorporated in its entirety by this reference.

Use of Data Latches in Cache Operations

A number of aspects of the present invention make use of the data latches of the read/write stacks described above in FIG. 10 for cache operations that will data in and out while the internal memory is doing other operations such as read, write, or erase. In the above-described architectures, data latches are shared by a number of physical pages. For example, as on the read/write stacks of the bit lines, shared by all of the word lines, so while one operation is going on, if any of these latches are free, they can cache data for future operations in the same or another word line, saving transfer time as this can be hidden behind another operation. This can improve performance by increasing the amount of pipelining of different operations or phases of operations. In one example, in a cache program operation, while programming one page of data another page of data can be loaded in, saving on transfer time. For another example, in one exemplary embodiment, a read operation on one word line is inserted into a write operation on another word line, allowing the data from the read to be transferred out of the memory while the data write continues on.

Note that this allows data from another page in the same block, but on a different word line, to be toggled out (to, for example, do an ECC operation) while the write or other operation is going on for the first page of data. This interphase pipelining of operations allows the time needed for the data transfer to be hidden behind the operation on the first page of data. More generally, this allows a portion of one operation to be inserted between phases of another, typically longer, operation. Another example would be to insert a sensing operation between phases of, say, an erase operation, such as before an erase pulse or before a soft programming phase used as the later part of the erase.

To make the relative times needed for some of the operations discussed, a set of exemplary time values for the system described above can be take as:

Data write: ~700 μs (lower page~600 μs, upper page 800 μs)
Binary data write: ~200 μs
Erase: ~2,500 μs
Read: ~20-40 μs
Read and toggle out data: 2 KB data, ~80 μs; 4 KB~160 μs; 8 KB~320 μs These values can be used for reference to give an idea of the relative times involved for the timing diagrams below. If have a long operation with different phases, a primary aspect will interpose in a quicker operation using the shared latches of the read/write stacks if latches available. For example, a read can be inserted into a program or erase operation, or a binary program can be inserted into an erase. The primary exemplary embodiments will toggle data in and/or out for one page during a program operation for another page that shares the same read write stacks, where, for example, a read of the data to be toggled out and modified is inserted into the verify phase of the data write.

The availability of open data latches can arise in a number of ways. Generally, for a memory storing n bits per cell, n such data latches will be needed for each bit line; however, not all of these latches are needed at all times. For example, in a two-bit per cell memory storing data in an upper page/lower page format, two data latches will be needed while programming the lower page. More generally, for memories storing multiple pages, all of the latches will be needed only when programming the highest page. This leaves the other latches available for cache operations. Further, even while writing the highest page, as the various states are removed from the verify phase of the write operation, latches will free up. Specifically, once only the highest state remains to be verified, only a single latch is needed for verification purposes and the others may be used for cache operations.

The following discussion will be based on a four state memory storing two-bits per cell and having two latches for data on each bit line and one additional latch for quick pass write, as described in U.S. patent application entitled "Use of Data Latches in Multi-Phase Programming of Non-Volatile Memories" filed concurrently with the present application that was incorporated above. The operations of writing the lower page, or erasing, or doing a post erase soft program are basically a binary operation and have one of the data latches free, which can use it to cache data. Similarly, where doing an upper page or full sequence write, once all but the highest level has verified, only a single state needs to verify and the memory can free up a latch that can be used to cache data. An example of how this can be used is that when programming one page, such as in a copy operation, a read of another page that shares the same set of data latches, such as another word line on the same set of bit lines, can be slipped in during the verify phase of the write. The address can then be switched to the page being written, allowing the write process to pick up where it left off without having to restart. While the write continues, the data cached during the interpolated read can be toggled out, checked or modified and transferred back to be present for writing back in once the earlier write operation completes. This sort cache operation allows the toggling out and modification of the second page of data to be hidden behind the programming of the first page.

Figure 13:
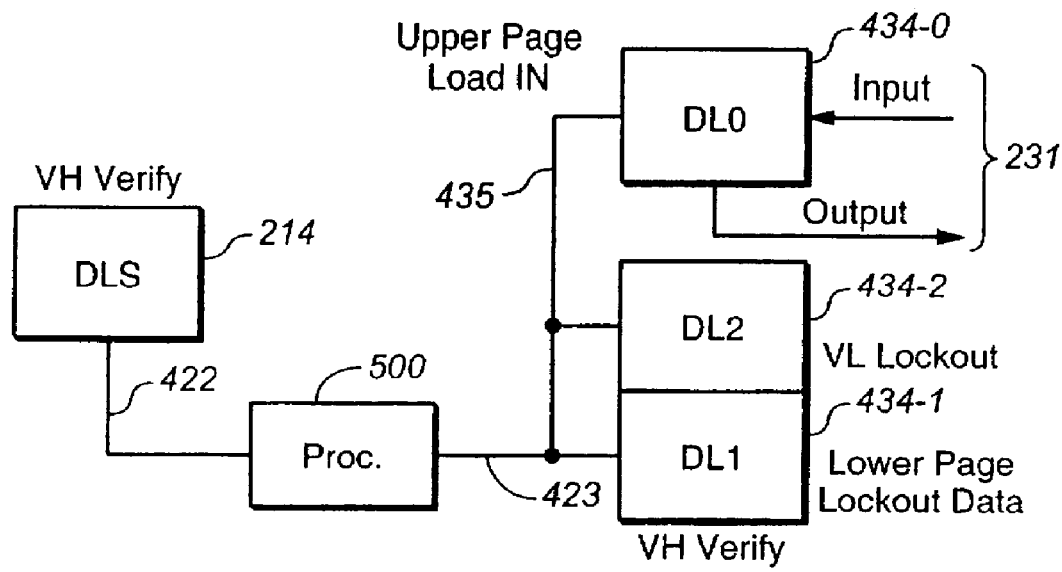

As a first example, a cache program operation for a two-bit memory operating in single page (lower page/upper page format) program mode. FIG. 13 is a simplified version of FIG. 10 that shows some specific elements that are relevant to the present discussion in a two-bit embodiment, the other elements being suppressed to simplify the discussion. These include data latch DL0 434-0, which is connected Data I/O line 231, data latch DL1 434-1, connected to common processor 500 by line 423, data latch DL2 434-2, commonly connected with the other data latches by line 435, and sense amp data latch DLS 214, which is connected to common processor 500 by line 422. The various elements of FIG. 13 are labeled according to their disposition during the programming of the lower page. The latch DL2 434-2 is used for the lower verify (VL) in quick pass write mode, as is described in U.S. patent application entitled "Use of Data Latches in Multi-Phase Programming of Non-Volatile Memories" filed concurrently with the present application; the inclusion of the register, and of using quick pass write when it is included, are optional, but the exemplary embodiment will include this register.

The programming of the lower page can include the following steps:

(1) The process begins by resetting data latches DL0 434-0 the default value "1". This convention is used to simplify partial page programming as cells in a selected row that are not to be programmed will be program inhibited.

(2) Program data is supplied to DL0 434-0 along I/O line 231.

(3) The program data will be transferred to DL1 434-1 and DL2 434-2 (if this latch is included and quick pass write is implemented).

(4) Once the program data is transferred to DL1 434-1, data latch DL0 434-0 can be reset to "1" and, during program time, the next data page can be loaded to DL0 434-0 along I/O line 231, allowing the caching of a second page while a first page is being written.

(5) Once the first page is loaded into DL1 434-1, programming can begin. DL1 434-1 data is used for lockout of the cell from further programming. DL2 434-2 data is used for the lower verify lockout that governs the transition to the second phase of quick pass write, as described in U.S. patent application entitled "Use of Data Latches in Multi-Phase Programming of Non-Volatile Memories" filed concurrently with the present application.

(6) Once programming begins, after a programming pulse, the result of the lower verify is used to update DL2 434-2; the result of the higher verify is used to update DL1 434-1. (This discussion is based on the "conventional" coding, where the lower page programming is to the A state. This, and other codings are discussed further in U.S. patent applications entitled "Use of Data Latches in Multi-Phase Programming of Non-Volatile Memories" filed concurrently with the present application and entitled "Non-Volatile Memory and Method with Power-Saving Read and Program-Verify Operations", filed Mar. 16, 2005. The extension of the present discussion to other codings follows readily.)

(7) In determining of whether programming is complete, only the DL1 434-1 registers of the cells of row (or appropriate physical unit of program) are checked.

Figure 14:
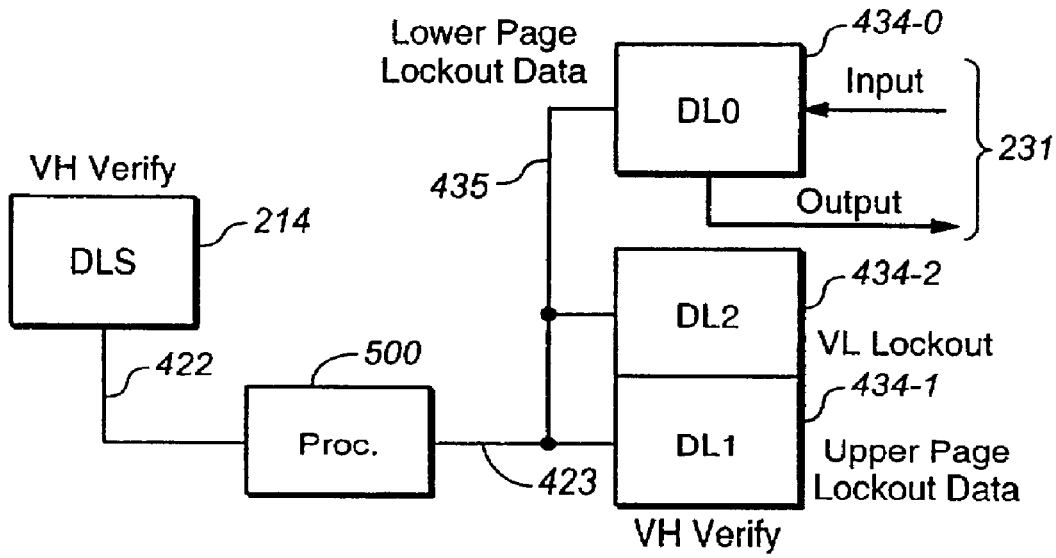

Once the lower page is written, the upper page can be programmed. FIG. 14 shows the same elements as FIG. 13, but indicates the latch assignment for upper page program where the lower page data is read in. (The description again uses conventional coding, so that the programming of the upper page is to the B and C states.) The programming of the upper page can include the following steps:

(1) Once the lower page finishes programming, the upper page (or next page) write will begin with a signal from the state machine controller where the (unexecuted) cache program commands are kept.

(2) The program data will be transferred from DL0 434-0 (where it was loaded into in step (3) during lower page write) to DL1 434-1 and DL2 434-2.

(3) The lower page data will be read in from the array and placed into DL0 434-0.

(4) DL1 434-1 and DL2 434-2 are again respectively used for the verify high and verify low lockout data. Latch DL0 434-0 (holding the lower page data) is checked as program reference data, but is not updated with the verify results.

(5) As part of verifying the B state, after sensing at the lower verify VBL, the data will be updated in DL2 434-2 accordingly, with DL1 434-1 data being updated with the high verify VBH results. Similarly, the C verify will have corresponding commands to update latches DL2 434-2 and DL1 434-1 with the respective VCL and VCH results.

(6) Once the B data is completed, then the lower page data (held in DL0 434-0 for reference) is not needed as only the verify for the C state needs to be performed. DL0 434-0 is reset to "1" and another page of program data can be loaded in from I/O line 231 and cached in latch DL0 434-0. The common processor 500 can set an indication that that only the C state is to be verified.

(7) In determining of whether upper page programming is completed, for the B state, both of latches DL1 434-1 and DL0 434-0 are checked. Once the cells being programmed to the B state and only the C state is being verified, only the latch DL1 434-1 data needs to be checked to see if there are any bits not programmed.

Note that under this arrangement, in step 6, the latch DL0 434-0 is no longer required and can be used to cache data for the next programming operation. Additionally, in embodiments using quick pass write, once the second, slowly programming phase is entered, the latch DL2 434-2 could also be made available for caching data, although, in practice, it is often the case that this is only available in this way for a fairly short time period that does not justify the additional overhead that is often required to implement this feature.

Figure 15:
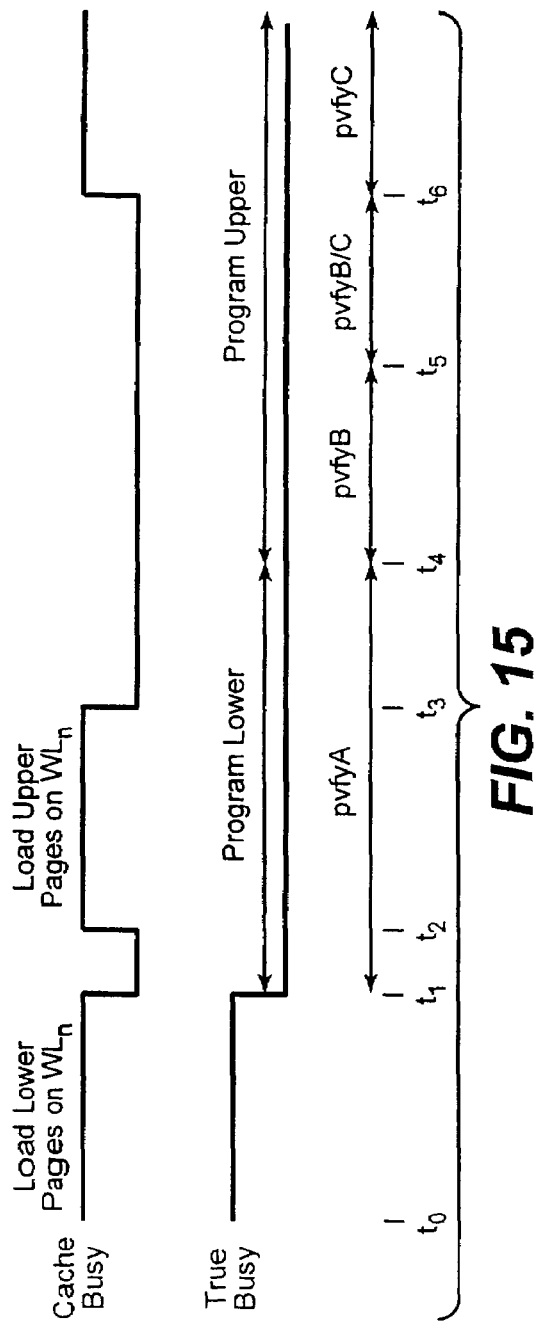
FIG. 15 illustrates aspects of cache program in the single page mode.

FIG. 15 can be used to illustrate many of the aspects of cache program in the single page mode that has been described in the last few paragraphs. FIG. 15 shows the relative timing of what events are occurring internally to the memory (the lower "True Busy" line) and as seen from external to the memory (the upper "Cache Busy" line).

At time $t_o$ the lower page to be programmed onto the selected word line (WLn) is loaded into the memory. This assumes the first lower page of data has not been previously cached, as it will be for the subsequent pages. At time $t_1$ the lower page is finished loading and the memory begins to write it. Since this is equivalent to a binary operation at this point, only the state A needs to be verified ("pvfyA") and the data latch DL0 434-0 is available to receive the next page of data, here taken as the upper pages to be programmed into WLn, at time $t_2$, which is consequently cached in latch DL0 434-0 during the programming of the lower page. The upper page finishes loading at time $t_3$ and can be programmed as soon as the lower page finishes at $t_4$. Under this arrangement, although all of the data (lower and upper page) to be written into physical unit of programming (here, word line WLn), the memory must wait from time $t_3$ to time $t_4$ before the upper page data can be written, unlike the full sequence embodiment described below.

The programming of the upper page begins at time $t_4$, where initially only the B state is verified ("pvfyB"), the C state being added at $t_5$ ("pvfyB/C"). Once the B state is no longer being verified at $t_6$, only the C state needs to be verified ("pvfyC") and the latch DL0 434-0 is freed up. This allows the next data set to be cached while the upper page finishes programming.

As noted, according to the single page algorithm with cache program, as shown in FIG. 15, even though the upper page data may be available at time $t_3$, the memory will wait until time $t_4$ before starting to write this data. In a conversion to a full sequence program operation, such as is developed more fully in U.S. patent application Ser. No. 11/013,125, once the upper page is available the upper and lower page data can be programmed concurrently.

The algorithm for cache program in full sequence (low to full conversion) write begins with lower page program as above. Consequently, steps (1)-(4) are as for the lower page process in single page program mode:

(1) The process begins by resetting data latches DL0 434-0 the default value "1". This convention is used to simplify partial page programming as cells in a selected row that are not to be programmed will be program inhibited.

(2) Program data is supplied to DL0 434-0 along I/O line 231.

(3) The program data will be transferred to DL1 434-1 and DL2 434-2 (if this latch is included and quick pass write is implemented).

(4) Once the program data is transferred to DL1 434-1, data latch DL0 434-0 can be reset to "1" and, during program time, the next data page can be loaded to DL0 434-0 along I/O line 231, allowing the caching of a second page while a first page is being written.

Once the second page of data is loaded, if correspond to the upper of the lower page being written and the lower page is not yet finished programming, the conversion to full sequence write can be implemented. This discussion focuses on the use of the data latches in such an algorithm, with many of the other details being developed more full in co-pending, commonly assigned U.S. patent application Ser. No. 11/013,125.

(5) After the upper page data is loaded into latch DL0 434-0, a judgment will be done in the address block to check if the 2 pages are on the same word line and the same block, with one page is the lower page and one is upper page. If so, then the program state machine will trigger a lower page program to full sequence program conversion if this is allowed. After any pending verify is complete, the transition is then effected.

(6) Some operation parameters will be typically be changed when the program sequence changed from lower page to full sequence. In the exemplary embodiment these include:

(i) Maximum program loop for the number of pulse verify cycles will be changed from that of the lower page algorithm to that of the full sequence if the lower page data has not been locked out, but the number of program loops completed will not be reset by the conversion.

Figure 16:
FIG. 16 shows a programming waveform that can be used in a lower page to full sequence conversion.

(ii) As shown in FIG. 16, the programming waveform starts with the value VPGM_L used in the lower page programming process. If the programming waveform has progressed to where it exceeds the beginning value VPGM_U used in the upper page process, at conversion to full sequence, the staircase will drop back down to VPGM_u prior to continuing up the staircase.

(iii) The parameters determining the step size and maximum value of the program pulse are not changed.

(7) A full sequence read of the current state of the memory cells should be performed to guarantee the right data will be programmed for multi-level coding. This ensures that states that may have formerly locked out in the lower page programming, but which require further programming to take account of their upper page data, are not program inhibited when the full sequence begins.

(8) If quick pass write is activated, the data of latch DL2 434-2 will be updated as well to reflect the upper page program data, since this was formerly based on the lower verify for only the A state.

(9) The programming then resumes with the multi-level, full sequence program algorithm. If the program waveform in the lower page process has increased beyond the upper page starting level, the waveform is stepped back to this level at conversion time, as shown in FIG. 16.

Figure 17:
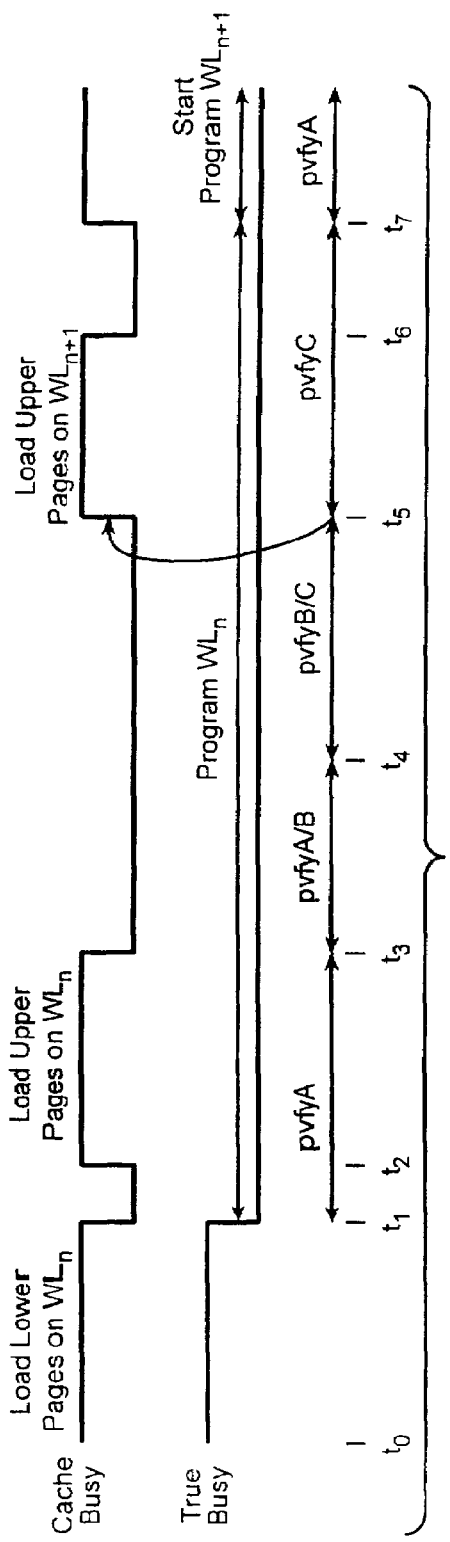
FIG. 17 illustrates the relative timing in a cache program operation with a full sequence conversion.

FIG. 17 is a schematic representation of the relative times involved in the lower page to full sequence conversion write process. Up until time $t_3$, the process is as described above for the process in FIG. 15. At $t_3$ the upper page of data has been loaded and the transition is made to the full sequence algorithm the verification process is switched to include the B states with the A states. Once all of the A states lock out, the verify process switches to checking for the B and C states at time $t_4$. Once the B states have verified at $t_5$, only the C state needs to be checked and a register can be freed up to load the next data to be programmed, such as the lower page on the next word line ($WL_{n+1}$) as indicated on the Cache Busy line. At time $t_6$ this next data set has been cached and one the programming of the C data for the previous set concludes at $t_7$, this next data set begins programming. Additionally, while the (here) lower page on word line $WL_{n+1}$ is programming, the next data (such as the corresponding upper page data) can be loaded into the open latch DL0 434-0.

During the full sequence write, a status report is implemented in a way that gives lower page and upper page status independently. At the end of the program sequence, if there are unfinished bits, a scan of physical page can be performed. A first scan can check latch DL0 434-0 for unfinished upper page data, a second scan can check DL1 434-1 for unfinished lower page data. Since, the verification of the B state will change both DL0 434-0 and DL1 434-1 data, an A state verification should be performed in the way that DL1 434-1 data "0" will be changed to "1" if the bit's threshold value is higher than the A verify level. This post verify will check on whether any under programmed B levels are passing at the A level; if they are passing at the A level, then the error is only on upper page and not on lower page; if they are not passing at the A level, then both lower and upper pages have error.

If the cache program algorithm is used, after the A and B data are programmed, the C state will be transferred to latch DL1 434-1 to finish programming. In this case, the scan of latch is not necessary for lower page, because the lower page will have already passed program without any failed bits.

Another set of exemplary embodiments of the present invention relate to page copy operations, where a data set is relocated from one location to another. Various aspects of data relocation operations are described in U.S. patent applications Ser. No. 10/846,289, filed May 13, 2004; Ser. No. 11/022,462, Dec. 21, 2004; and Ser. No. 10/915,039, filed Aug. 9, 2004; and U.S. Pat. No. 6,266,273, which are all hereby incorporated by reference, which are all hereby incorporated by reference. When data is copied from one location to another, the data is often toggled out to be checked (for error, for example), updated (such as updating a header), or both (such correcting detected error). Such transfers are also to consolidate date in garbage collection operations. A principal aspect of the present invention allows for a data read to an open register to be interpolated during the verify phase of a write operation, with this cached data then being transferred out of the memory device as the write operation continues, allowing the time for toggling the data out to hide behind the write operation.

Figure 18:
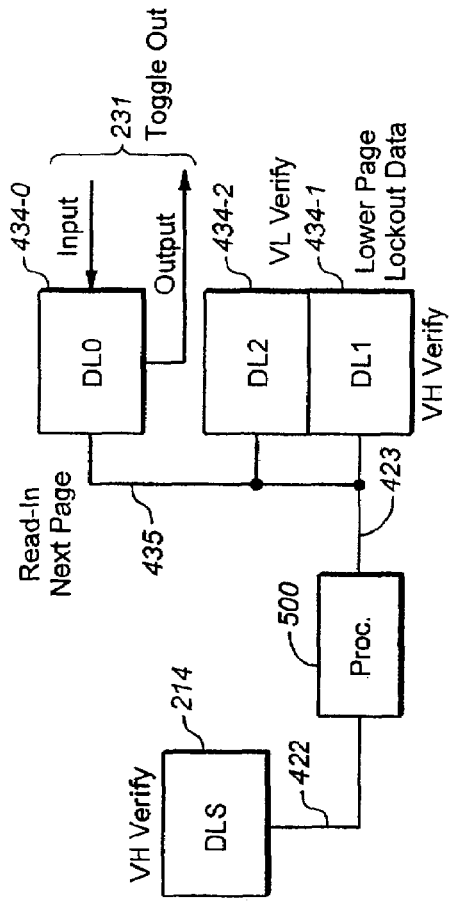
FIG. 18 describes the disposition of latches in a cache page copy operation.

The following presents two exemplary embodiments of a cache page copy operation. In both cases, an implementation that uses a quick pass write implementation is described. FIG. 18 indicates the disposition of the exemplary arrangement of latches as the process progresses.

The first version of cache page copy will write to a lower page and can include the following steps, where read addresses are labeled M, M+1, . . . , and write addresses are labeled N, N+1, . . . :

(1) The page to be copied ("page M") is read into latch DL1 434-1. This can be either an upper or lower page of data (2) Page M is then transferred into DL0 434-0.

(3) The data in DL0 434-0 is then toggle out and modified, after which it is transferred back into the latch.

(4) The program sequence can then begin. After data to be written into the lower page N is transferred to DL1 434-1 and DL2 434-2, the latch DL0 434-0 is ready for cache data. This lower page will be programmed. For this embodiment, the program state machine will stop here.

(5) The next page to be copied is then read into DL0 434-0. Programming can then resume. The state machine, stopped at the end of step (4), will restart the program sequence from the beginning.

(6) Programming continues until the lower page finishes.

The copy destination page address will determine whether a write is to a lower or an upper page. If the program address is an upper page address, then the programming sequence will not be stopped until the programming finishes and the read of step (5) will be executed after the write is complete.

In a second cache page copy method, the program/verify process can be paused to insert a read operation and then restart the write operation, picking up at the point where it left off. The data that was read during this interleaved sensing operation can then be toggled out while the resumed write operation continues on. Also, this second process allows for the page copy mechanism to be used in an upper page or full sequence write process once only the C state is being verified and one latch on each bit line opens up. The second cache page copy operation begins with the same first three steps as in the first case, but then differs. It can include the following steps:

(1) The page to be copied ("page M") is read into latch DL1 434-1. This can be either a lower or upper page
(2) The data from page M is then transferred into DL0 434-0. (As before, N, etc. will denote a write address, M, etc., for a read address.)
(3) The data in DL0 434-0 is then toggled out, modified, and then transferred back to the latch.
(4) The state machine program will go to an infinite wait state until the command a read command is entered and then a read of another page, say the next page M+1, to latch DL0 434-0 will begin.
(5) Once the read of step (4) is complete, the address is switched back to word line and block address to program the data in steps (1-3) into page N (here, a lower page) and the programming is resumed.
(6) After the read of page M+1 is finished, the data can be toggled out, modified, and returned. Once the process is complete, the write can be converted to a full sequence operation if the two pages are the corresponding upper and lower pages on the same WL.
(7) Once the A and B levels are done in the full sequence write, the data in DL0 434-0 will be transferred to DL1 434-1, as in the normal cache program described earlier, and a read command for another page (e.g., page M+2) can be issued. If there is not a single page to full sequence conversion, the lower page will finish the writing and then the upper page will start. After the B level state is done completely, the same DL0 434-0 to DL1 434-1 data transfer will occur, and the state machine will go into state of waiting for the read command for page M+2.
(8) Once the read command arrives, the address is switched to the read address and the next page (page M+2) is read out.
(9) Once the read is complete, the address will be switched back to previous upper page address (program address N+1) until the write finishes.

As noted above, the exemplary embodiments include the latch DL2 434-2 used for the lower verify of the quick pass write technique in addition to the latches DL0 434-0 and DL1 434-1 used in holding the (here, 2 bits) of data that can be programmed into each of the memory cells. Once the lower verify is passed, the latch DL2 434-2 may also be freed up and used to cache data, although this is not done in the exemplary embodiments.

Figure 19A:
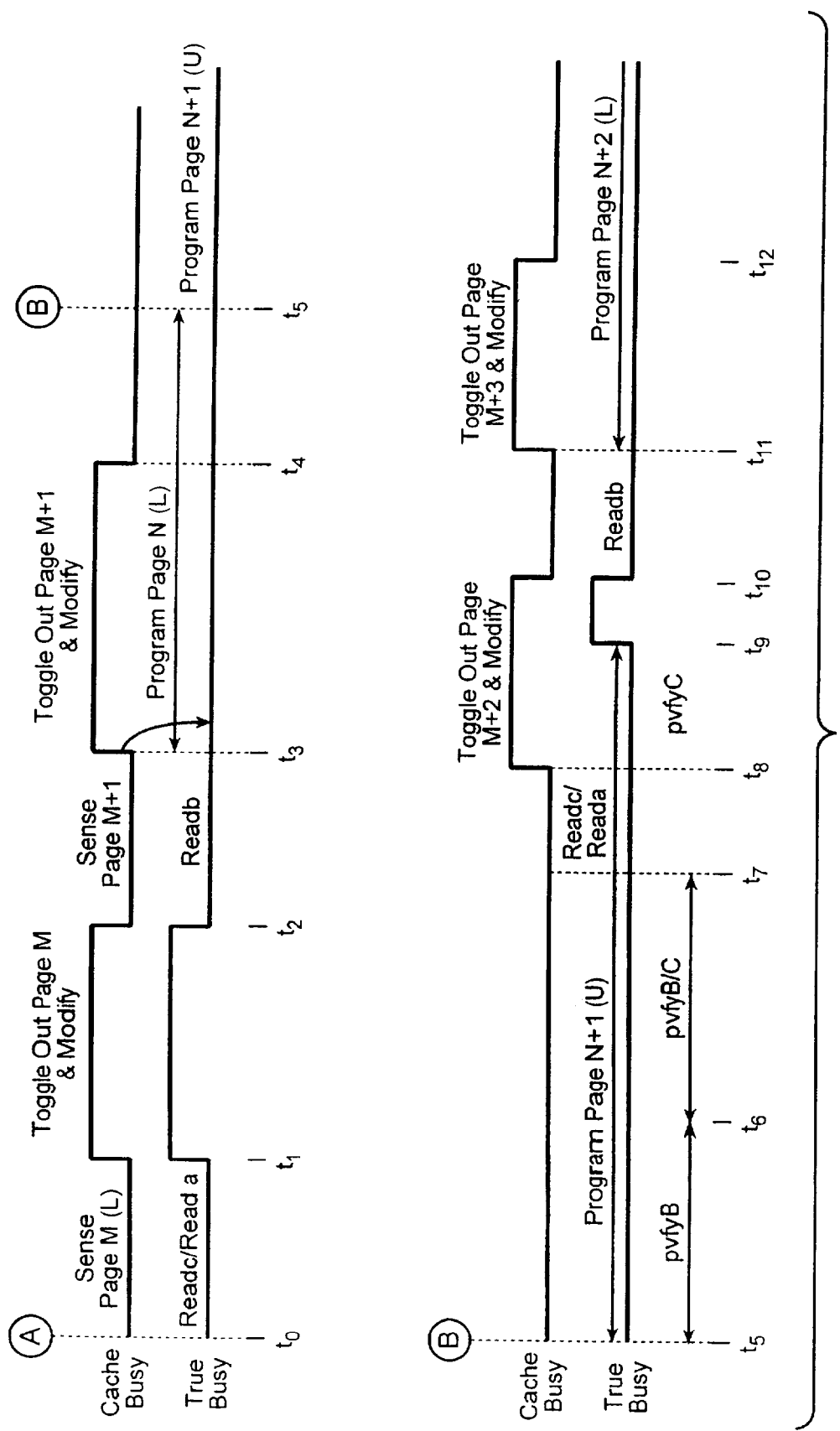
FIGS. 19A and 19B illustrate the relative timings in cache page copy operations.
Figure 19B:
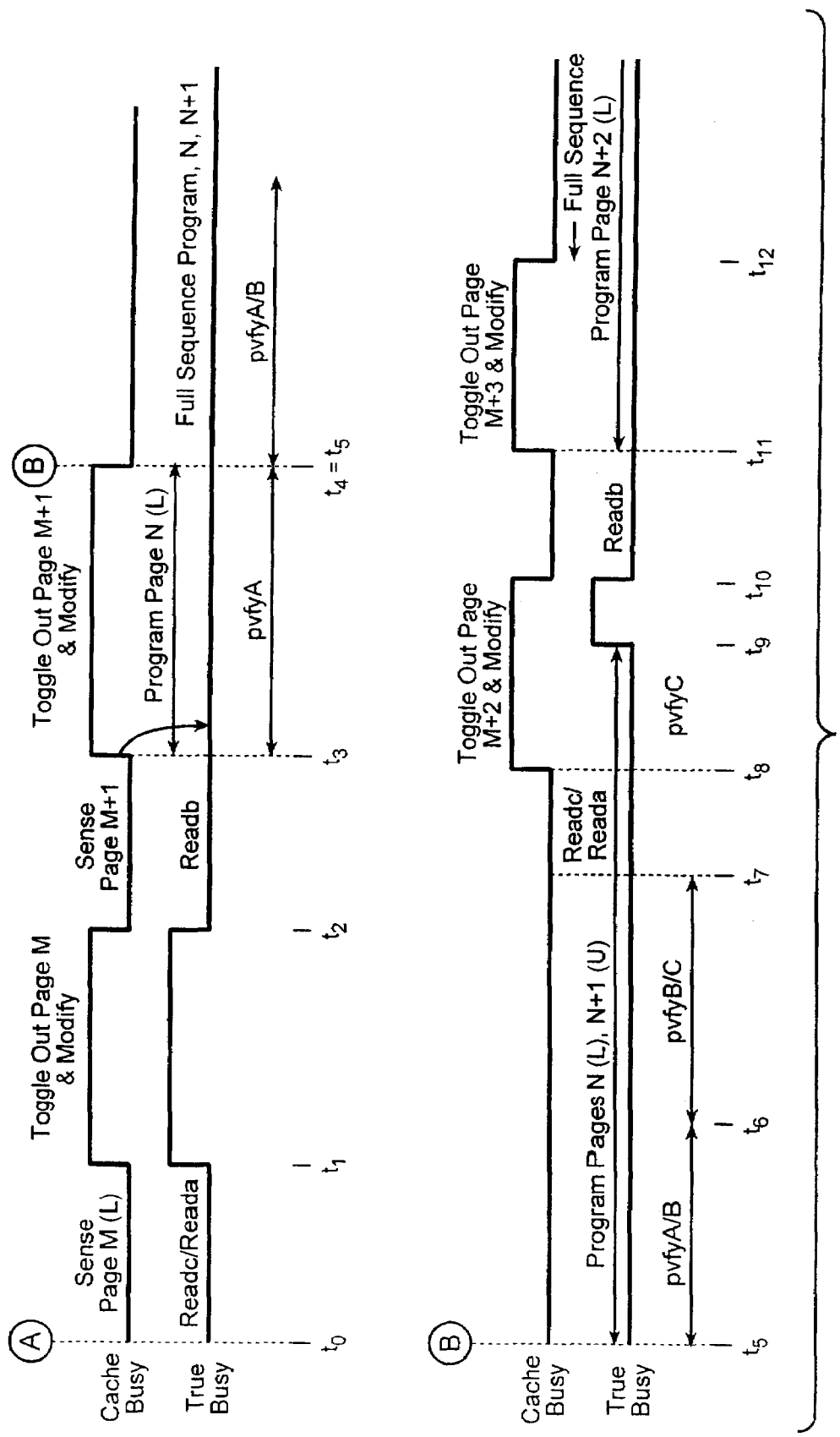

FIGS. 19A and 19B illustrate the relative timing of the second cache page copy method, where FIG. 19B illustrates the algorithm with the full sequence write conversion and FIG. 19A illustrates the algorithm without. (Both FIGS. 19A and 19B are composed of two parts, the first, upper part beginning at the broken vertical line A, corresponding to $t_0$, and ending with the broken vertical line B, corresponding to $t_5$; the second, lower part is a continuation of the upper portion and begins with the broken vertical line B, corresponding to $t_5$. In both cases the line B at time $t_5$ is same in the upper portion as in the lower portion, being just a seam in two parts allowing it to be displayed on two lines.)

FIG. 19A shows a process that starts with reading of a first page (page M) that is taken to be a lower page in this example, assumes no data has previously been cached, and operates in single page mode, waiting until the lower page has finished writing before beginning to write the upper page. The process starts at time $t_o$ with a read of the page M (Sense page M (L)), which here is a lower that is sensed by a read at the A and C levels in this coding. At time at time $t_1$ the read is complete and page M can be toggled out and checked or modified. Beginning at time $t_2$ a next page (here page M+1, the upper page corresponding to the same physical as lower page M) is sensed by reading at the B level, a process that finishes at time $t_3$. At this point, the first page (originating from Page M) (lower) is ready to be programmed back into the memory at page N and the data read from page M+1 is being held in a latch and can be transferred out to be modified/checked. Both of these processes can start at the same time, here $t_3$. Using the typical time values described above, the data from page M+1 has been toggled out and modified by time $t_4$; however, for the embodiment not implementing a full sequence conversion, the memory will wait until page N finishes at time $t_5$ to begin writing the second read page of data (originating from Page M+1) into page N+1.

As page N+1 is an upper page, its write begins initially with a verification at the B level, the C level being added at $t_6$. Once the storage elements having a target state B all lock out (or the maximum count is reached) at time $t_7$, the B state verification is dropped. As described above, according to several principal aspects of the present invention, this allows a data latch to be freed up, an ongoing write operation is suspended, a reading operation (at a different address than the suspended program/verify operation) is interposed, the write then resumes where it left off, and the data sensed the interposed write operation can be toggled out while the resumed write operation runs on.

At time $t_7$ the interposed write operation is performed for the, here, lower page M+2. This sensing is finished at time $t_8$ and the write of page N+1 picks back up and the data from page M+2 is concurrently toggled out and modified. In this example, page N+1 finishes programming at time $t_9$ before page M+2 is finished at time $t_{10}$. At time $t_{10}$ a write of the data originating from page M+2 could begin; however, in this embodiment, instead a read of page M+3 is first executed, allowing for this page's data to be toggled out and the modification to be hidden behind the writing of the data originating from page M+2 into page N+2, beginning at time $t_{11}$. The process then continues on as in the earlier parts of the diagram, but with the page numbers shifted, with time $t_{11}$, corresponding to time $t_3$, time $t_{12}$ corresponding to time $t_4$, and so on until the copy process is stopped.

FIG. 19B again shows a process that starts with reading of a lower page, page M that is taken to be a lower page, and assumes no data has previously been cached. FIG. 19B differs from FIG. 19A by implementing a conversion to full sequence write at time $t_4$. This roughly speeds up the process by the time $(t_5-t_4)$ of FIG. 19A. At time $t_4$ (=$t_5$ in FIG. 19A), the various changes related to the full sequence conversion are implemented as described previously. Otherwise, the process is similar to that of FIG. 19A, including those aspects of the present invention found between times $t_7$ and $t_{12}$.

In both the page copy processes and the other techniques described here that involve writing data, which states are verified at a given time can be selected intelligently, along the lines describe in U.S. patent publication number US-2004-0109362-A1, which is hereby incorporated by reference. For example, in the full sequence write, the write process can begin verifying only the A level. After ever A verify, it is checked to see whether any bits have passed. If so, the B level can be added to the verify phase. The A level verify will be removed after all storage units with it as their target values verify (or except a maximum count based on a settable parameter). Similarly, after the verifications at the B level, a verify of the C level can be added, with the B level verify being removed after all storage units with it as their target values verify (or except a maximum count based on a settable parameter).

Caching Operations in Data Latches During Program Operations

Programming operation with background data caching for other operations is described with respect to a preferred multi-state coding.

Exemplary Preferred "LM" Coding for a 4-state Memory

Figure 20A:
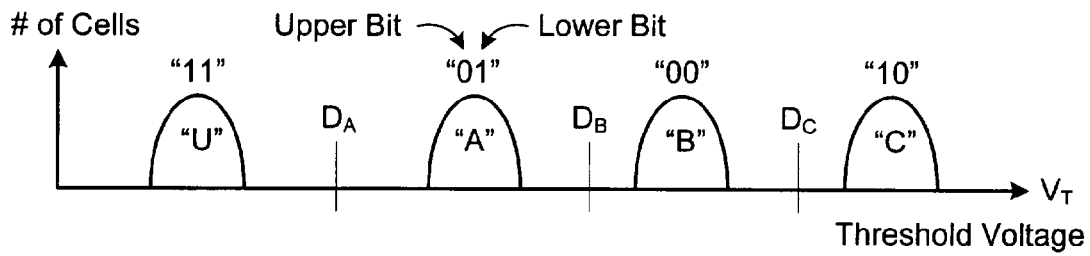
FIG. 20A illustrates threshold voltage distributions of the 4-state memory array when each memory cell stores two bits of data using the LM code.

FIGS. 20A-20E illustrate the programming and reading of the 4-state memory encoded with a 2-bit logical code ("LM" code). This code provides fault-tolerance and alleviates the neighboring cell coupling due to the Yupin Effect. FIG. 20A illustrates threshold voltage distributions of the 4-state memory array when each memory cell stores two bits of data using the LM code. The LM coding differs from the conventional Gray code in that the upper and lower bits are reversed for states "A" and "C". The "LM" code has been disclosed in U.S. Pat. No. 6,657,891 and is advantageous in reducing the field-effect coupling between adjacent floating gates by avoiding program operations that require a large change in charges. As will be seen in FIGS. 20B and 20C, each programming operation results in moderate change in the charges in the charge storage unit as evident from the moderate change in the threshold voltages $V_T$.

The coding is designed such that the 2 bits, lower and upper, may be programmed and read separately. When programming the lower bit, the threshold level of the cell either remains in the unprogrammed region or is moved to a "lower middle" region of the threshold window. When programming the upper bit, the threshold level in either of these two regions is further advanced to a slightly higher level not more than one quarter of the threshold window.

Figure 20B:
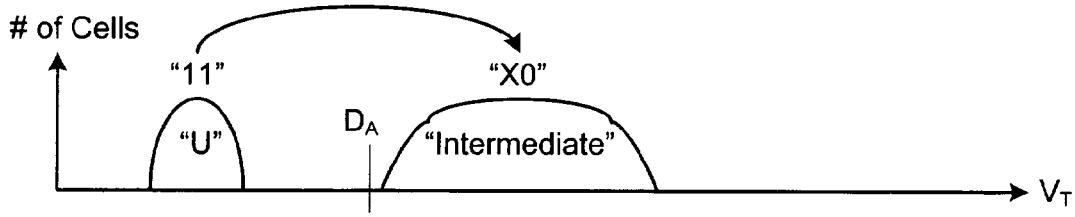
FIG. 20B illustrates the lower page programming in an existing, 2-round programming scheme using the LM code.

FIG. 20B illustrates the lower page programming in an existing, 2-round programming scheme using the LM code. The fault-tolerant LM code essentially avoids any upper page programming to transit through any intermediate states. Thus, the first round lower page programming has the logical state (1, 1) transits to some intermediate state (x, 0) as represented by programming the "unprogrammed" memory state "U" to an "intermediate" state designated by (x, 0) with a programmed threshold voltage among a broad distribution that is greater than $D_A$ but less than $D_C$. During programming, the intermediate state is verified relative a demarcation $DV_A$.

Figure 20C:
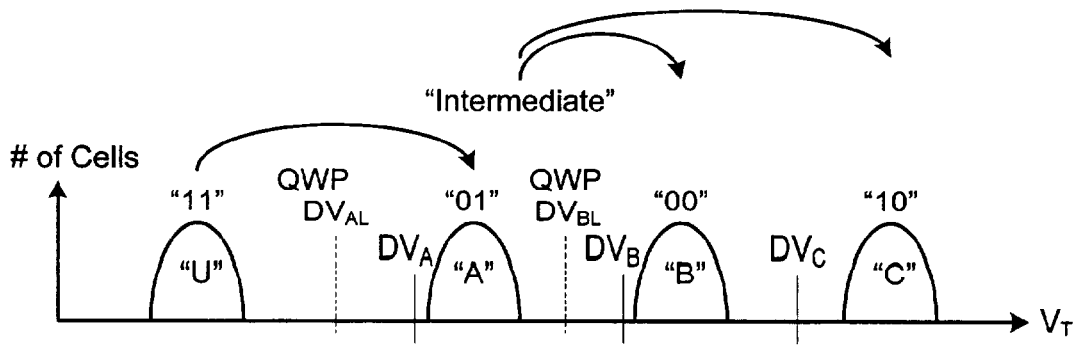
FIG. 20C illustrates the upper page programming in an existing, 2-round programming scheme using the LM code.

FIG. 20C illustrates the upper page programming in an existing, 2-round programming scheme using the LM code. In the second round of programming the upper page bit to "0", if the lower page bit is at "1", the logical state (1, 1) transits to (0, 1) as represented by programming the "unprogrammed" memory state "U" to "A". During programming to "A", the verifying is relative to the $DV_A$. If the lower page bit is at "0", the logical state (0, 0) is obtained by programming from the "intermediate" state to "B". The program verifying is relative to a demarcation $DV_B$. Similarly, if the upper page is to remain at "1", while the lower page has been programmed to "0", it will require a transition from the "intermediate" state to (1, 0) as represented by programming the "intermediate" state to "C". The program verifying is relative to a demarcation $DV_C$. Since the upper page programming only involves programming to the next adjacent memory state, no large amount of charges is altered from one round to another. The lower page programming from "U" to a rough "intermediate" state is designed to save time.

In the preferred embodiment, "Quick Pass Write" programming technique mentioned in an earlier section is implemented. For example in FIG. 20C, initially the program-verify ("pvfyA$_L$") is with respect to $DV_{AL}$ which is set at margin lower than $DV_A$. Once the cell is program-verified at $DV_{AL}$, subsequent programming will be at a finer step and program-verify (pvfyA) will be with respect to $DV_A$. Thus an additional transitional state $A_{LOW}$ must be latched during the programming operation to indicate that the cell has been program-verified to $D_{AL}$. Similarly, if QPW is implemented for programming to the "B" state, there will be an additional transitional state $B_{LOW}$ to latch. The program verifying for $B_{LOW}$ will be relative to the demarcation $DV_{BL}$ and the program verifying for "B" will be relative to the demarcation $DV_B$. When in the $A_{LOW}$ or $B_{LOW}$ state, the programming for the memory cell in question will be switched to a slower (i.e. finer) mode by suitable biasing of the bit line voltage or by modifying the programming pulses. In this way, larger programming steps can be used initially for rapid convergence without the danger of overshooting the target state. "QPW" programming algorithm has been disclosed in U.S. patent application Ser. No. 11/323,596, filed Dec. 29, 2005 and entitled, "Methods for Improved Program-Verify Operations in Non-Volatile Memories," the entire disclosure of which is hereby incorporated herein by reference.

Figure 20D:
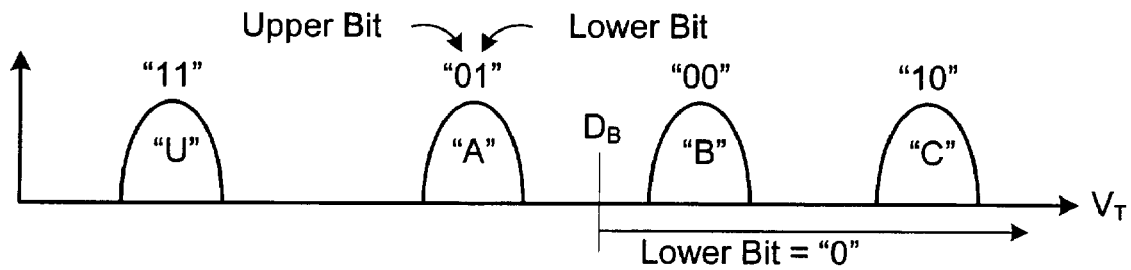
FIG. 20D illustrates the read operation that is required to discern the lower bit of the 4-state memory encoded with the LM code.

FIG. 20D illustrates the read operation that is required to discern the lower bit of the 4-state memory encoded with the LM code. The decoding will depend on whether the upper page has been programmed or not. If the upper page has been programmed, reading the lower page will require one read pass of readB relative to the demarcation threshold voltage $D_B$. On the other hand, if the upper page has not yet been programmed, the lower page is programmed to the "intermediate" state (FIG. 20B), and readB will cause error. Rather, reading the lower page will require one read pass of readA relative to the demarcation threshold voltage $D_A$. In order to distinguish the two cases, a flag ("LM" flag) is written in the upper page (usually in an overhead or system area) when the upper page is being programmed. During a read, it will first assume that the upper page has been programmed and therefore a readB operation will be performed. If the LM flag is read, then the assumption is correct and the read operation is done. On the other hand, if the first read did not yield a flag, it will indicate that the upper page has not been programmed and therefore the lower page would have to be read by a readA operation.

Figure 20E:
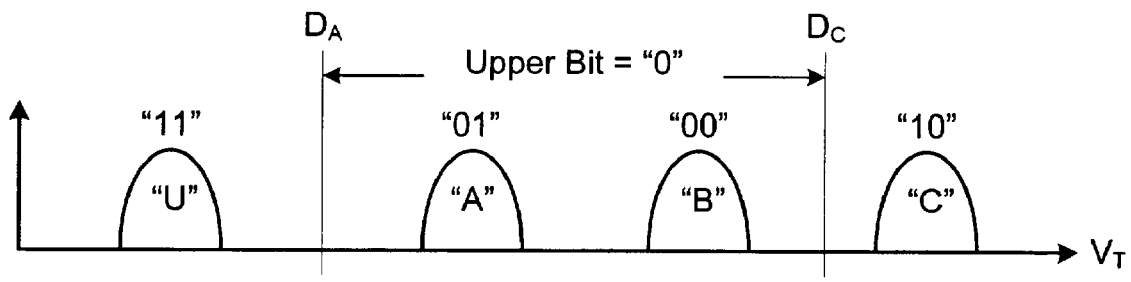
FIG. 20E illustrates the read operation that is required to discern the upper bit of the 4-state memory encoded with the LM code.

FIG. 20E illustrates the read operation that is required to discern the upper bit of the 4-state memory encoded with the LM code. As is clear from the figure, the upper page read will require a 2-pass read of readA and readC, respectively relative to the demarcation threshold voltages $D_A$ and $D_C$. Similarly, the decoding of upper page can also be confused by the "intermediate" state if the upper page is not yet programmed. Once again the LM flag will indicate whether the upper page has been programmed or not. If the upper page is not programmed, the read data will be reset to "1" indicating the upper page data is not programmed.

Latch Utilization During Program Operation with the LM Code and QPW

As shown in FIG. 10, each bit line allows a read/write module to access a given memory cell along a selected row of the memory array. There is a page of p read/write modules operating in parallel on a page of memory cells in a row. Each read/write module comprises a sense amplifier 212-1 and data latches 430-1 coupled to a common processor 500. The sense amplifier 212-1 senses a conduction current of the memory cell via the bit line. The data is processed by the common processor 500 and stored in the data latches 430-1. Data exchange external to the memory array is effected by the I/O bus 231 coupled to the data latches (see FIGS. 13 and 14). In a preferred architecture, the page is formed by a contiguous run of p memory cells along a row sharing the same word lines and accessible by p contiguous bit lines of the memory array. In an alternate architecture, the page is formed by either even or odd memory cells along a row. The data latches 430-1 are implemented with a minimum of n latches, sufficient to perform the various required memory operations, from DL1 to DLn. FIGS. 13 and 14 illustrate a preferred configuration for a 4-state memory where there are three latches, DL0-DL2.

Next Page Program Data loading During Current Page Programming

Figure 21:
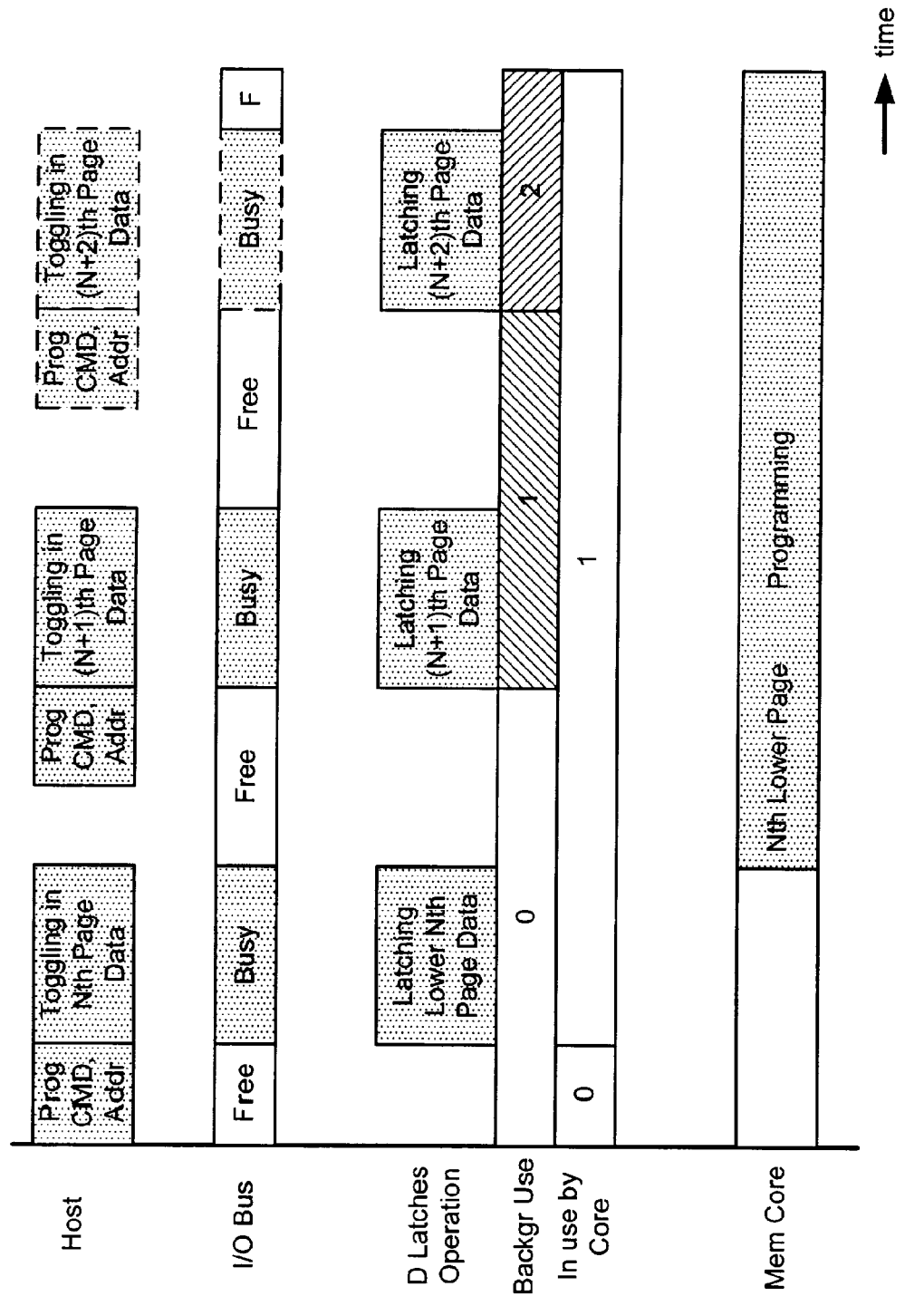
FIG. 21 is a schematic timing diagram for a lower page programming, illustrating background operation of loading a next page of program data into unused data latches.

FIG. 21 is a schematic timing diagram for a lower page programming, illustrating background operation of loading a next page of program data into unused data latches. The activities of the host, the I/O bus, the data latches and memory core are shown contemporaneously. The lower page programming in the LM code is illustrated in FIG. 20B where the erased or unprogrammed state (1,1) is programmed to a "Lower Middle" or intermediate state (X,0). In this case, one bit, viz., the lower bit, will be sufficient to distinguish between the unprogrammed "1" state from the intermediate "0" state. For example, DL2 (see FIGS. 13 and 14) can be used to store the lower bit.

When an Nth page of data is to be written, the host initially issues a write command to the memory for writing the page of data to a specified address. This is followed by sending the page of data to be programmed to the memory. The program data are toggled through the I/O bus and latched into DL2 of each read/write module. Thus the I/O bus is temporary busy during this toggling-in period, which for example may be of duration 300 µs.

The lower page programming is binary and need only distinguish between the "U" state from the "intermediate state" as demarcated by the $DV_A$ threshold level (see FIG. 20B). Each programming pulse applied to the word line is followed by a read back or program-verify to determine if the cell has reached the target state representing the program data. In this case the program-verify is ("pvfyA") with respect to $DV_A$. Thus only one latch from each read/write module is required to store one bit for each cell.

With regard to the data latches, DL2 containing the program data is actively being used for the current lower bit programming operation which is taking place in the memory array or the memory core. Thus, the number of latches in use by the core is one while the other two latches, namely DL0 and DL1 remain idle.

While programming at the core continues, the two idle latches and the free I/O bus can be used for setting up a next page of program data. The host can issue another command to write the (N+1)th page of data and toggle the data via the I/O bus to be latched in one of the two free latches, say DL0. In this way, once the core is done programming the Nth page, it can commence with programming of the (N+1)th page without having to wait another 300 µs to have the data toggled in.

At this point, two latches (e.g., DL2 and DL0) have been used, one for the on-going programming of the Nth page (lower page) and one for caching the (N+1)th page of program data. Thus, there is one more latch free, but utilization of it will depend on whether the already cached (N+1)th page is an upper page or a lower page.

If the (N+1)th page is an upper page, typically belonging to the same page cells or word line, the last free latch must, in a preferred embodiment, be reserved for optimizing subsequent programming of the upper page. This is because the implementation of "Quick Pass Write" ("QPW") programming algorithm (mentioned in an earlier section) requires an additional latch to store a flag to indicate if the cell has been programmed close to the target state.

If the (N+1)th page is another lower page belonging to another page of cells or word line, then the last free latch can optionally be used to cache another (N+2)th (lower or upper) page data if presented by the host.

FIG. 22 is a table showing the number of states that needs to be tracked during various phases of a 4-state upper page or full sequence programming employing QWP. The upper page or full sequence programming in the LM code is illustrated in FIG. 20C where some of the lower page states "U" or (1,1) and the "intermediate" state (X,0) are respectively further programmed to states "A" or (0,1), "B" or (0,0) and "C" or (1,0). In particular, the state "A" is programmed from "U" and the states "B" and "C" are programmed from "intermediate". With the QWP technique implemented for state "A" and "B" but not "C", the programming initially needs to distinguish between the basic states "A", "B", and "C" plus "$A_{LOW}$" and "$B_{LOW}$", which amounts to a total of five states. With three bit in three latches, there are $2^3$ or nine possible codes which are more than adequate to distinguish between those six states.

Several Phases During Programming May Arise as Programming Progresses:

"A" Done—after all cells in the page targeted for "A" state have been program-verified with respect to the $D_A$ demarcation. This would entail having first completed the program-verified with respect to the $D_{AL}$ demarcation. There are four states "L" (Program Lockout), "$B_L$", "B" and "C" to keep track of. This would require two latches storing two bits with a predefined coding provided by a code table two-bit 2CT ("A").

"B" Done—after all cells in the page targeted for "B" state have been program-verified with respect to the $D_B$ demarcation. This would entail having first completed the program-verified with respect to the $D_{BL}$ demarcation. There are four states "L", "$A_L$", "A" and "C" to keep track of This would require two latches storing two bits with a predefined coding provided by a two-bit code table 2CT("B").

"C" Done—after all cells in the page targeted for "C" state have been program-verified with respect to the $D_C$ demarcation. There are five states "L", "$A_L$", "A", "$B_L$" and "B" to keep track of. This would require three latches storing three bits with a predefined coding provided by a three-bit code table 3CT("C").

"A"+"B" Done—after all cells in the page targeted for "A" state and "B" state have been program-verified respectively to the $D_A$ demarcation and $D_B$ demarcation. There are two states "L" and "C" to keep track of. This would require one latch storing one bit with a predefined coding provided by a one-bit code table 1CT("A"+"B").

"A"+"C" Done—after all cells in the page targeted for "A" state and "C" state have been program-verified respectively to the $D_A$ demarcation and $D_C$ demarcation. There are three states "L", "$B_L$" and "B" to keep track of. This would require two latches storing two bits with a predefined coding provided by a two-bit code table 2CT("A"+"C").

"B"+"C" Done—after all cells in the page targeted for "B" state and "C" state have been program-verified respectively to the $D_B$ demarcation and $D_C$ demarcation. There are three states "L", "$A_L$" and "A" to keep track of. This would require two latches storing two bits with a predefined coding provided by a two-bit code table 2CT("B"+"C").

"A"+"B"+"C" Done—after all cells in the page targeted for "A" state, "B" state and "C" state have been program-verified respectively to the $D_A$ demarcation, $D_B$ demarcation and $D_C$ demarcation. All targeted states of the page have been program-verified and the programming for the page is completed. No latch will be needed.

Figure 23:
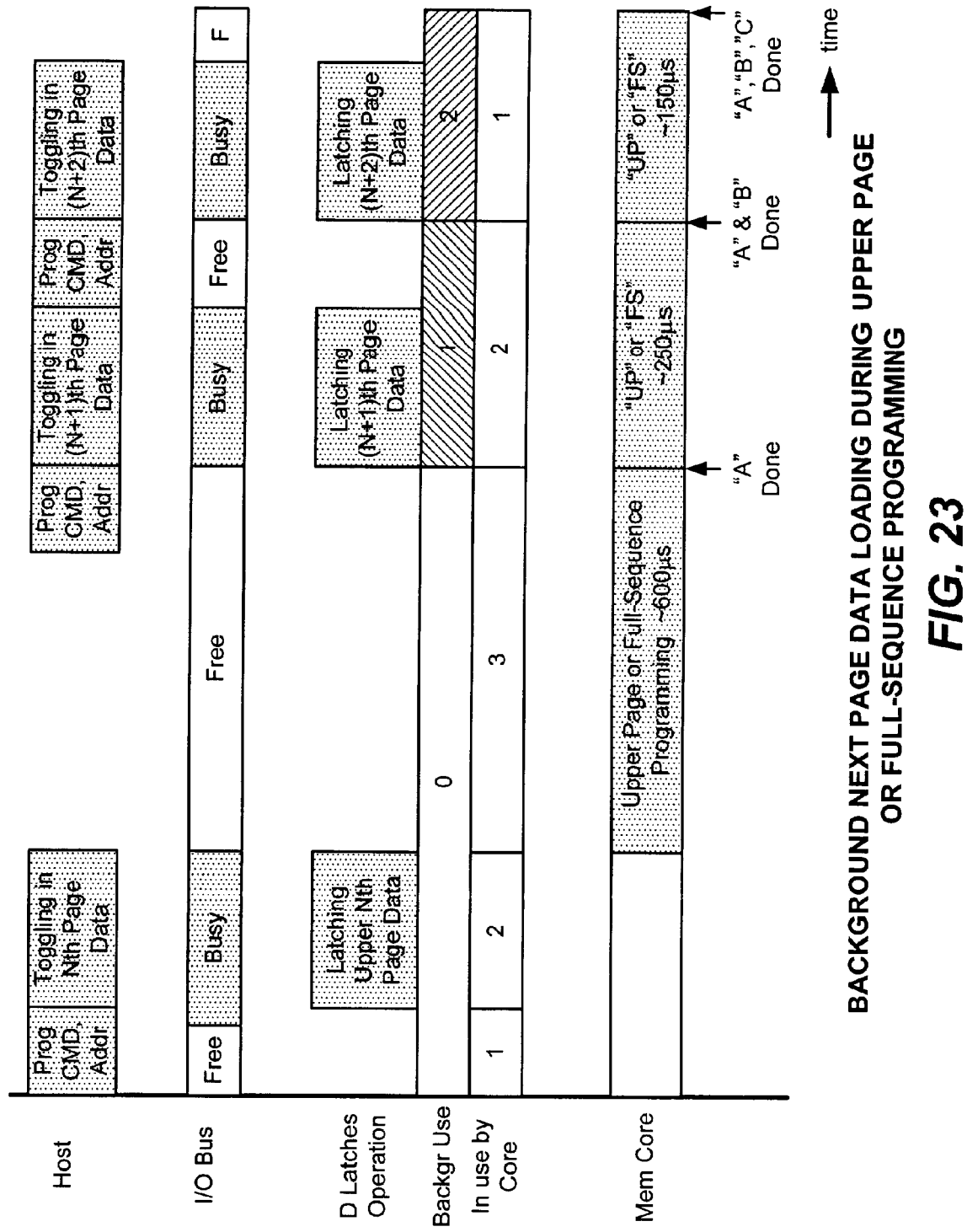
FIG. 23 is a schematic timing diagram for an upper page or full sequence programming, illustrating background operation of loading a next page of program data into unused data latches.

FIG. 23 is a schematic timing diagram for an upper page or full sequence programming, illustrating background operation of loading a next page of program data into unused data latches. The activities of the host, the I/O bus, the data latches and memory core are shown contemporaneously.

When an Nth page of upper page data is to be written, reference must be made to a previously programmed lower page data. The previously programmed lower page is already latched in DL2 of each read/write module. With the Nth page of upper page data, the host initially issues a write command to the memory for writing the page of data to a specified address. This is followed by sending the page of data to be programmed to the memory. The program data are toggled through the I/O bus and latched into DL0 of each read/write module. Thus the I/O bus is temporary busy during this toggling-in period, which for example may be of duration 300 μs.

The upper page or full sequence programming is multi-state with the states "A", "B" and "C" demarcated by the $D_A$, $D_B$ and $D_C$ respectively (see FIG. 20C). Each programming pulse applied to the word line is followed by a read back or program-verify to determine if the cell has reached the target state representing the program data.

As shown in FIG. 22, the number of latches required during programming varies as to what phase the programming has proceeded to. For example, initially all three latches are employed. When all the "A" states have been program-verified ("A" Done") only two latches (e.g., DL2 and DL1) are required by the memory core during subsequent programming to store four possible states. This leave one latch (e.g., DL0) free for cache operation.

While programming at the core continues, the free latch and the free I/O bus can be used for setting up a next page of program data. The host can issue another command to write the (N+1)th page of data (lower page data) and toggle the data via the I/O bus to be latched in the free latch DL0. In this way, once the core is done programming the Nth page, it can commence with programming of the (N+1)th page without having to wait another 300 μs to have the data toggled in. The same consideration applies to other programming phases where there is at least one free latch as shown in FIG. 22.

Another possibility is when the programming enters a phase that only requires one latch to operate and thus has two free latches for cache operation. For example, as shown in FIG. 22, this happens when both "A" and "B" states have been program-verified. At this point, two latches are available. If one is already used up for loading (N+1) lower page data, then the remaining one may be used to load (N+2) Upper or lower page data.

If the (N+1)th page is an upper page, typically belonging to the same page cells or word line, the last free latch must, in a preferred embodiment, be reserved for optimizing subsequent programming of the upper page. This is because the implementation of "Quick Pass Write" ("QPW") programming algorithm (mentioned in an earlier section) requires an additional latch to store one or two flags to indicate if the cell has been programmed close to the target state.

If the (N+1)th page is another lower page belonging to another page of cells or word line, then the last free latch can optionally be used to cache another (N+2)th (lower or upper) page data if presented by the host.

According to one aspect of the invention, when the multiple phases of a write operation vary as to the number of states to track, a phase-dependent coding enables efficient utilization of the available data latches, thereby allowing a maximum of surplus latches for background cache operations.

Figure 24:
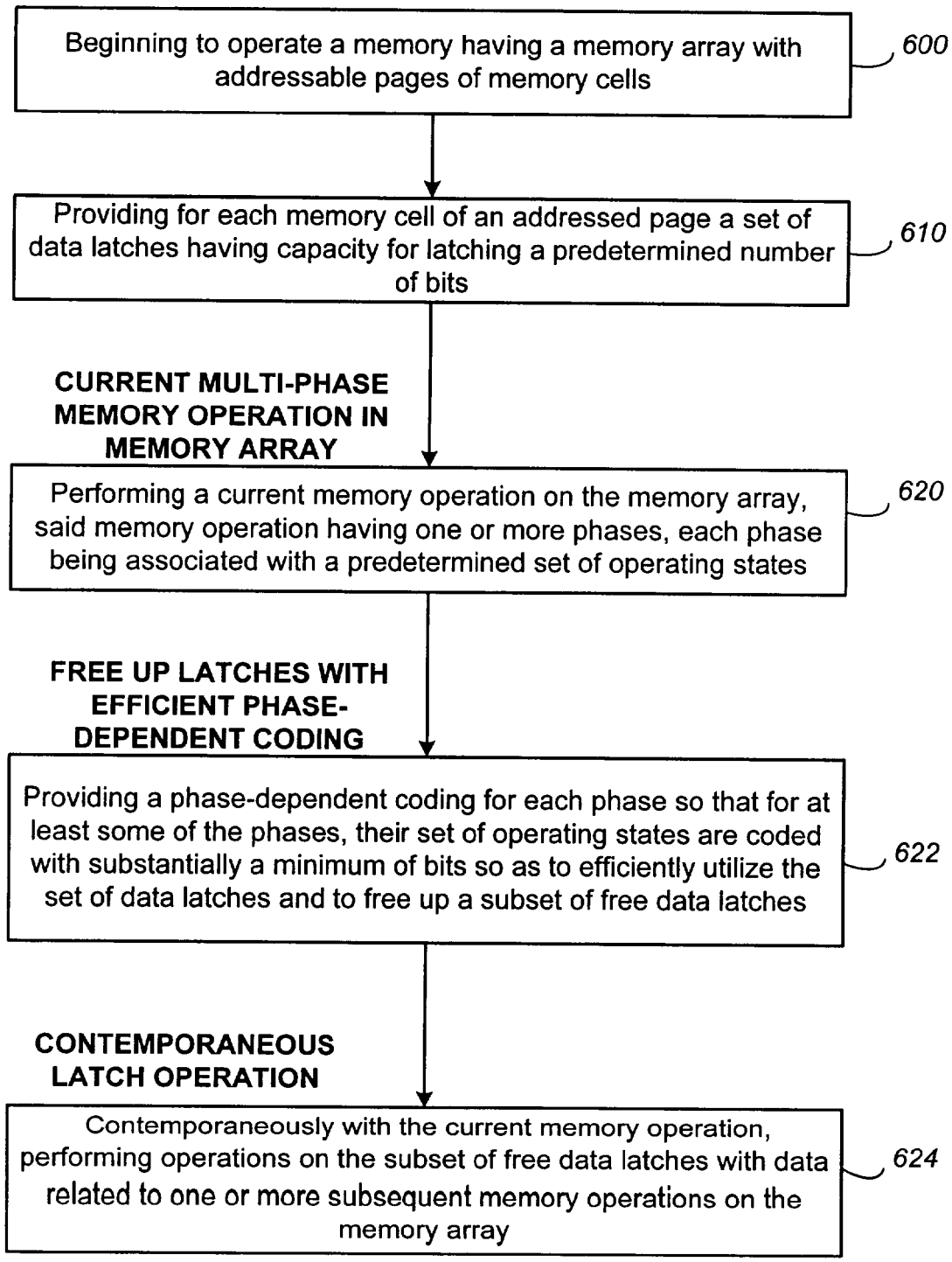
FIG. 24 is a flowchart illustrating latch operations contemporaneous with a current multi-phase memory operation, according to a general embodiment of the invention.

FIG. 24 is a flowchart illustrating latch operations contemporaneous with a current multi-phase memory operation, according to a general embodiment of the invention.

STEP 600: Beginning to operate a memory having a memory array with addressable pages of memory cells.

STEP 610: Providing for each memory cell of an addressed page a set of data latches having capacity for latching a predetermined number of bits.

Current Multi-Phase Memory Operation in Memory Array

STEP 620: Performing a current memory operation on the memory array, said memory operation having one or more phases, each phase being associated with a predetermined set of operating states.

Freeing Up Latches With Efficient Phase-Dependent Coding

STEP 622: Providing a phase-dependent coding for each phase so that for at least some of the phases, their set of operating states are coded with substantially a minimum of bits so as to efficiently utilize the set of data latches and to free up a subset of free data latches.

Contemporaneous Latch Operation

STEP 624: Contemporaneously with the current memory operation, performing operations on the subset of free data latches with data related to one or more subsequent memory operations on the memory array.

Read Interrupt During Current Programming

Figure 25:
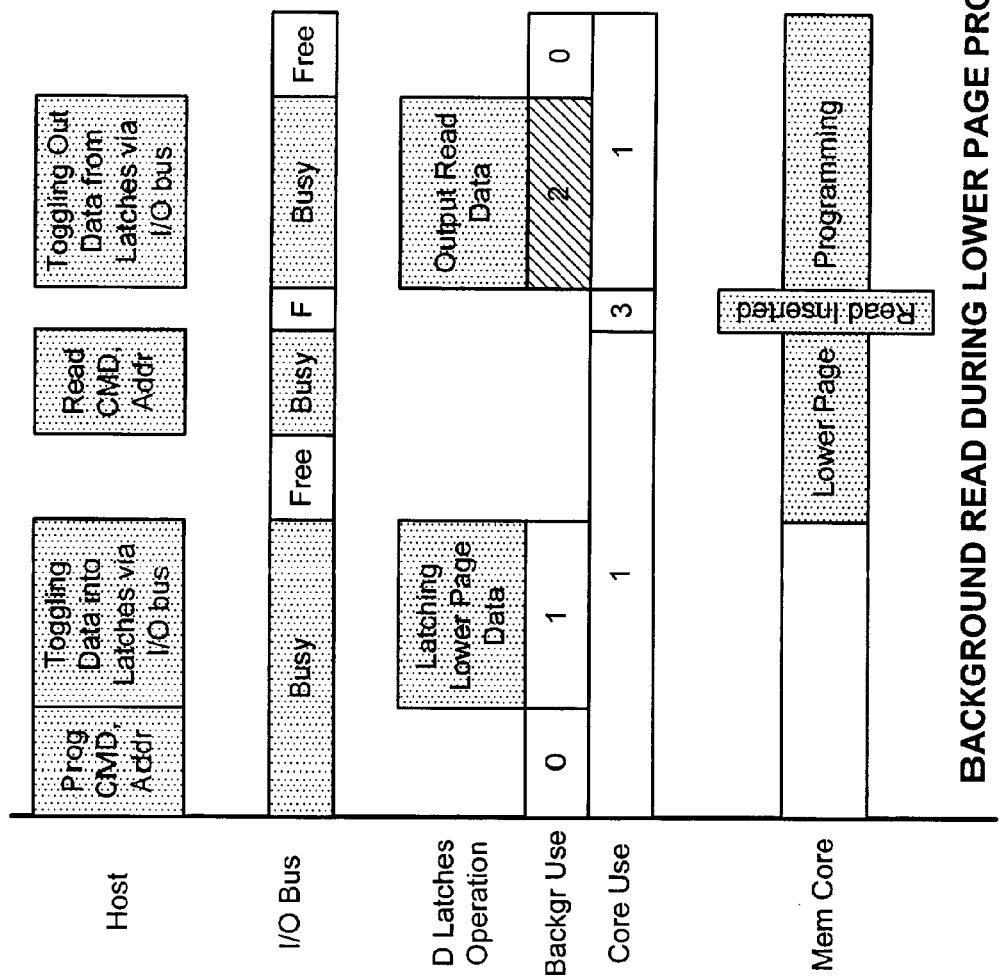
FIG. 25 is a schematic timing diagram for a lower page programming, illustrating a read interrupt operation using available latches.

FIG. 25 is a schematic timing diagram for a lower page programming, illustrating a read interrupt operation using available latches. The activities of the host, the I/O bus, the data latches and memory core are shown contemporaneously.

When an Nth page of data is to be written, the host initially issues a write command to the memory for writing the page of data to a specified address. This is followed by sending the page of data to be programmed to the memory. The program data are toggled through the I/O bus and latched into DL2 of each read/write module (see FIGS. 13 and 14). Thus the I/O bus is temporary busy during this toggling-in period, which for example may be of duration 300 μs.

The lower page programming is binary and need only distinguish between the "U" state from the "intermediate state" as demarcated by the $D_A$ threshold level (see FIG. 20A). Each programming pulse applied to the word line is followed by a read back or program-verify to determine if the cell has reached the target state representing the program data. In this case the program-verify is ("pvfyA") with respect to $D_A$. Thus only one latch from each read/write module is required to store one bit for each cell.

With regard to the data latches, DL2 containing the program data is actively being used for the current lower bit programming operation which is taking place in the memory array or the memory core. Thus, the number of latches in used by the core is one while the other two latches, namely DL0 and DL1 remain idle.

While programming at the core continues, the two idle latches and the free I/O bus can be used for a read operation. A read operation requires sensing in the memory core (i.e., memory array) itself which is already preoccupied with the current programming operation. However, the actual sensing phase of a read operation is typically much shorter than a program operation (typically one-tenth of the programming time) that the latter can be interrupted to insert a sensing operation without incurring much penalty for performance. After the sensing, the read data are latched in one or more of the free data latches. A user can then toggle out the read data to the I/O bus. It is here that time can be saved since it is taking place at the same time as the program operation in the memory array.

Thus, while the lower page is being programmed, the host can issue a read command to interrupt the programming while saving the programming states in the data latches at the instance of the pause. Another page of data is sensed and latched in one of the two free latches, say DL0. Then the programming can resume with the saved programming states. The read data in the data latches can be toggled out to the I/O bus while the memory array is still occupied with the resumed programming.

As described earlier, in the example of a four-state (2-bit) memory, the preferred number of latches for each memory cell of the page is three. Only one latch to store the lower page program data is required for the lower page programming. This leaves two free latches. Only one free latch is needed in a typically read operation to latch the sensed data bit. In a preferred Look-ahead ("LA") read operation, two free latches are need. This will be described in more details in a later section.

Figure 26:
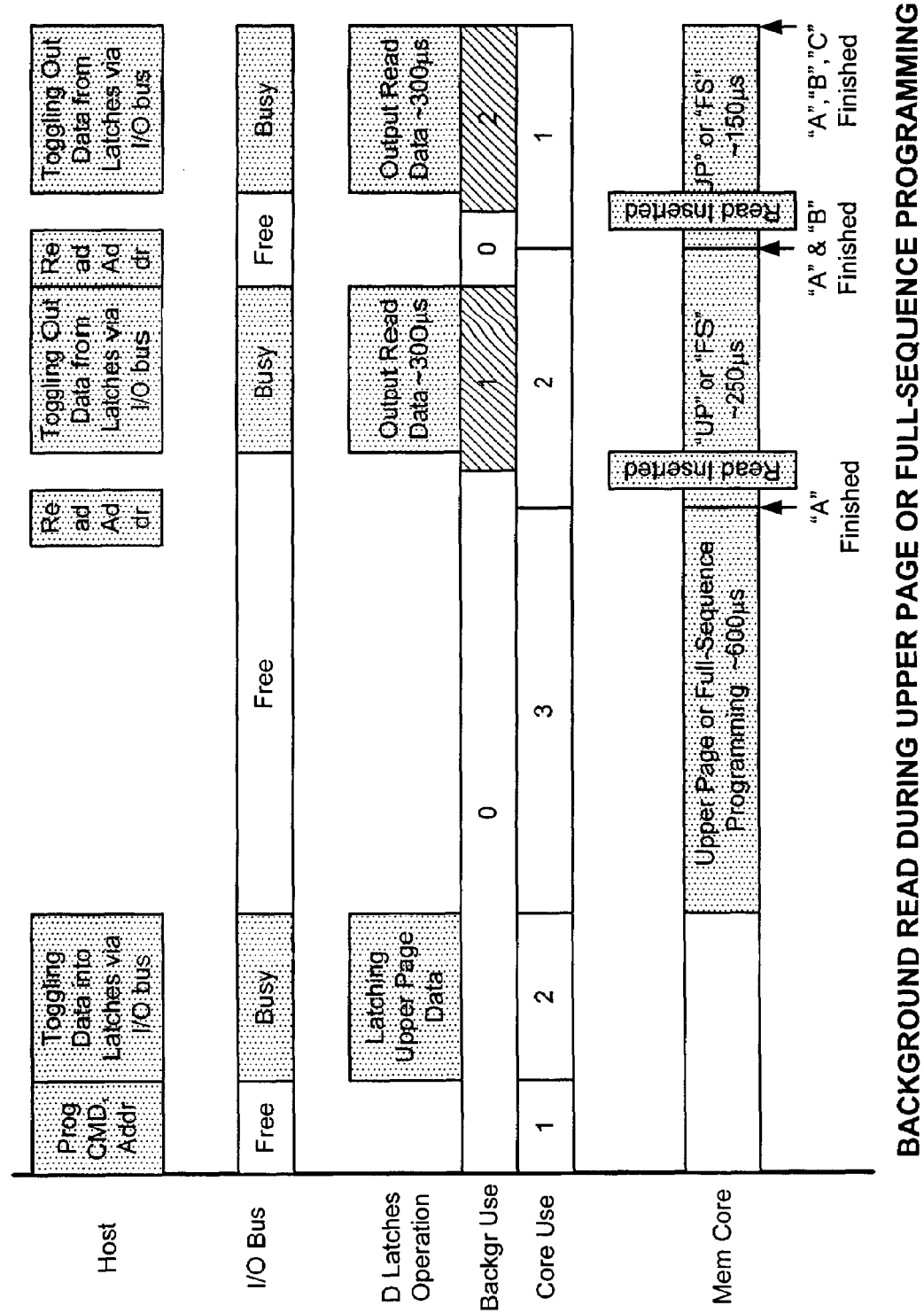
FIG. 26 is a schematic timing diagram for an upper page programming, illustrating a read interrupt operation using available latches.

FIG. 26 is a schematic timing diagram for an upper page programming, illustrating a read interrupt operation using available latches. The activities of the host, the I/O bus, the data latches and memory core are shown contemporaneously. The multi-phase programming has already been described in connection with FIG. 23, resulting in different number free data latches available during the different phases. For example, one data latch is free after State "A" has been program-verified and two data latches are free after both State "A" and State "B" have been program-verified.

Thus, after State "A" has been program-verified, the single free latch could be used to latch sensed data from a conventional read. On the other hand, if both State "A" and State "B" have been program-verified, the two available latches will be able to support a LA read as explained above.

Management of Multiple Cached Commands

Concurrent memory operations need to be managed in order to support cache operation where one memory operation is under execution in the memory's core while data for additional pending memory operations are being cached at the data latches or being transferred via the I/O bus. Conventional memory devices typically do not have sufficient number of free data latches to perform cache operations. Even if they do, the pending memory operation whose data are being cached is executed only after the current memory operation has completed.

Figures 27, 28:
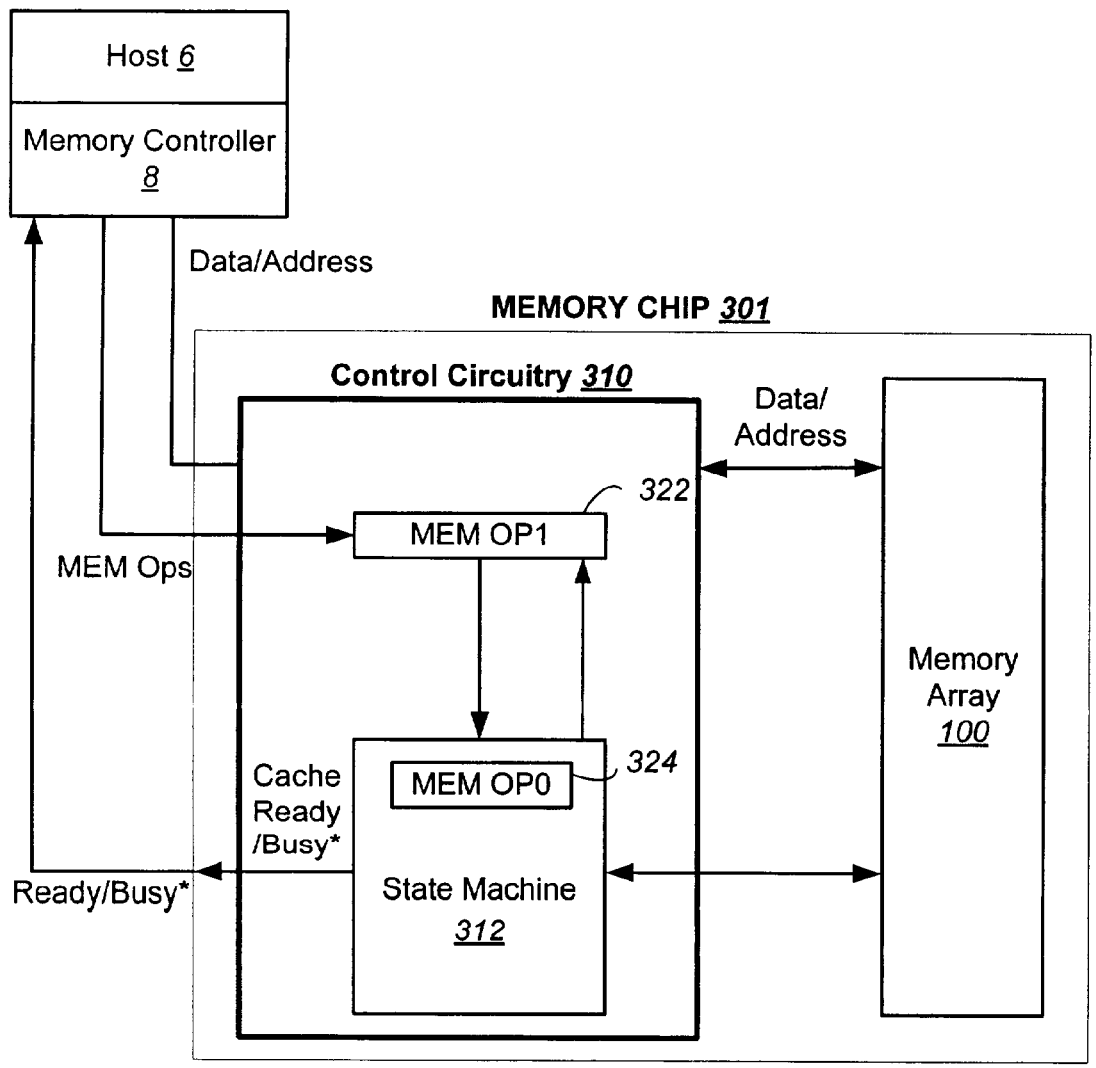
FIG. 27 illustrates the package of information associated with a typical memory operation.
FIG. 28 illustrates a conventional memory system that supports simple cache operations.

FIG. 27 illustrates the package of information associated with a typical memory operation. When a memory is requested to perform a memory operation, it receives a pre-command signifying the start of a specified memory operation. This is followed by the address in the memory array where the operation is to take place. In the case of an erase operation, the address is the block of memory cells to be erased. In the case of a program or read operation, the address is the page of memory cells to be operated on. If the operation specified is a program operation, program data will be supplied for loading into the data latches. When the program data is in place, an execute-command will be issued to execute the program operation with respect to the available program data. If the operation specified is a read operation, there will be no data sent to the memory. The execute-command will be issued to execute the read operation. The page of addressed memory cells will be sensed and the sensed data will be latched in the data latches for eventual toggling out via the I/O bus.

FIG. 28 illustrates a conventional memory system that supports simple cache operations. The memory system includes a memory controller 8 controlling a memory chip 301 via a memory controller 8. The memory chip has a memory array 100 controlled by an on-chip host interface/control circuitry 310. The control circuitry includes a state machine which manages the basic memory operations of the memory array. A host 6 engages the memory system via the memory controller 8 which performs higher level memory functions such as mapping and maintenance.

A status signal, Ready/Busy* allows the host or the memory controller to request a memory operation when the memory chip is not busy. The requested memory operation is held in a buffer 322 and released to the state machine 312 for execution when the state machine is not executing another memory operation. For example, the memory operation MEM OP0 is being executed in the memory array as controlled by the state machine. If there are free data latches available, the controller will be signaled to allow a pending memory operation MEM OP1 to be sent to the memory chip and buffered in the buffer 322. At the same time data associated with MEM OP1 will be toggled into the memory chip and latched into the data latches. As soon as MEM OP0 has completed execution, the state machine will release the MEM OP1 in the buffer to begin its execution. Thus, in convention memory systems, a pending memory operation is executed after the current one is completed.

In the example shown in FIG. 28, each command must wait until the last one is completed before it can begin execution, although its data is being cached during the execution of the last one. Thus, while MEM OP0 is executing in the memory core, Data1 associated with MEM OP1 is being latched. MEM OP1 will act on the cached Data1 after MEM OP0 is completed. Similarly, while MEM OP1 is executing in the memory core, Data2 associated with MEM OP2 is being latched. This scheme forestalls the possibility of loading both lower and upper logical pages of the same word line and efficiently programming multi-bits in the same programming operation.

There are two factors affecting the performance of program operation, particularly for sequential programming. The first relates to the time to load the program data. As the flash memory capacity becomes larger, their page size also increases with every new generation. The larger page of data to be programmed therefore takes longer to load into the data latches. In order to increase the program performance, it is desirable to hide the data loading time elsewhere. This is accomplished by caching as much program data as possible in the background while a program operation is busy with the memory core in the foreground but has its data latches and I/O bus idle.

One feature of the invention is to address the first factor by loading more pages into the data latches in the background during programming so that as soon as data latches are available, they are used for caching the pending program data. This includes allowing data associated with more than one command to be cached in the background during the same foreground operation.

The second factor for program performance relates to the time to program a page, particularly for programming the page of multi-bit cells with the same word line. As described before, a page of multi-bit cells can be treated as a collection of individual single-bit pages. For example, a 2-bit page can be programmed and read as two somewhat independent single-bit pages, namely a lower-bit page and an upper-bit page. In particular, the lower-bit page can be programmed as soon as the program data for the lower-bit page is available. The upper-bit page is programmed to the same page of memory cells in a second pass and the programming depends on the value of the lower page already programmed in the cells. In this way, the two bits can be programmed in two separate passes at two different times. However, a more efficient and more accurate way (with less program disturb) is to program the two bits in a single pass in what is known as "all-bit" or "full-sequence" programming. This is only possible if all the data bits are available during the programming. Thus, it is preferable in practice to perform all-bit programming if all the bits are available. On the other hand, if only the lower page data is available, the lower page will first be programmed. Later if the upper page data belonging to the same word line become available, the cells of the page will be programmed in a second pass. Alternatively, if the upper page data becomes available before the completion of the lower page programming, it would be desirable to cease the lower page programming and instead convert to perform the all-bit programming.

The scheme shown in FIG. 28 would not support queuing more than one command in the background and therefore not support caching more than one page of data. Furthermore, it cannot handle the situation when a lower page programming is terminated prematurely and instead converted to the execution of a different, "all-bit" programming when all the bits become available.

Another feature of the invention is to address the second factor by allowing all the bits necessary for all-bit programming to be cached so that all-bit programming can take place. Furthermore, a command queue manager manages multiple pending commands and allows certain commands to terminate before completion in favor of the next pending command, depending on the status of their associated data.

The two features of the invention work together to enhance the program performance by having more program data cached and allowing more efficient programming algorithm to be employed.

According to one aspect of the invention, a current memory operation may be under execution while other multiple pending memory operations are queued. Furthermore, when certain conditions are satisfied, some of these commands for individual operations are mergeable into a combined operation. In one case, when conditions are satisfied to merge one or more of the multiple pending memory operations in the queue with the current memory operation under execution, the current memory operation is terminated and replaced by the operation of the merged operations. In another case, when conditions are satisfied to merge two or more of the multiple pending memory operations in the queue, the operation of the merged operations will commence after the current operation under execution has completed.

One example is in programming a multi-bit page of memory cells sharing a common word line. Each of the multi-bits may be considered as forming the bit of a binary logical page. In this way, a page of 2-bit memory cells will have a lower logical page and an upper logical page. A page of 3-bit memory cells will have in addition a middle logical page. Each binary logical page can be programmed separately. Thus, for 2-bit memory cells, the lower logical page can be programmed in a first pass and the upper logical page can be programmed in a second pass. Alternately and more efficiently, if the program data for the 2 bits are available, the multi-bit page is preferably programmed in a single pass.

Several scenarios are possible with multiple binary programming or a merged and single-pass multi-bit programming depending on how many bits of program data is available. Ideally, if all the bits are available before programming, the multi-bit page of memory cells is programmed in a single pass. As described earlier, if only the lower logical page program data is available, single-bit programming of the lower logical page can commence. Subsequently, when the upper logical page program data is available, the same page of memory cells can be programmed in a second pass. Another possibility is that the upper page data becomes available before the completion of the lower page programming. In that case, to take advantage of the more efficient single-pass multi-bit or "full sequence" programming, the lower page programming is terminated and replaced by the multi-bit programming. It is as if the programming for the lower logical page and the upper page are merged or combined.

For memories with multi-bit cells, the pages of logical program data sent by a host could be a mixture of lower, upper or some other intermediate logical pages. Thus, generally it is desirable to cache as many pages of program data as the data latches would allow. This will increase the likelihood of merging the logical pages belong to the same page of memory cells so as to perform multi-bit programming.

Figure 29:
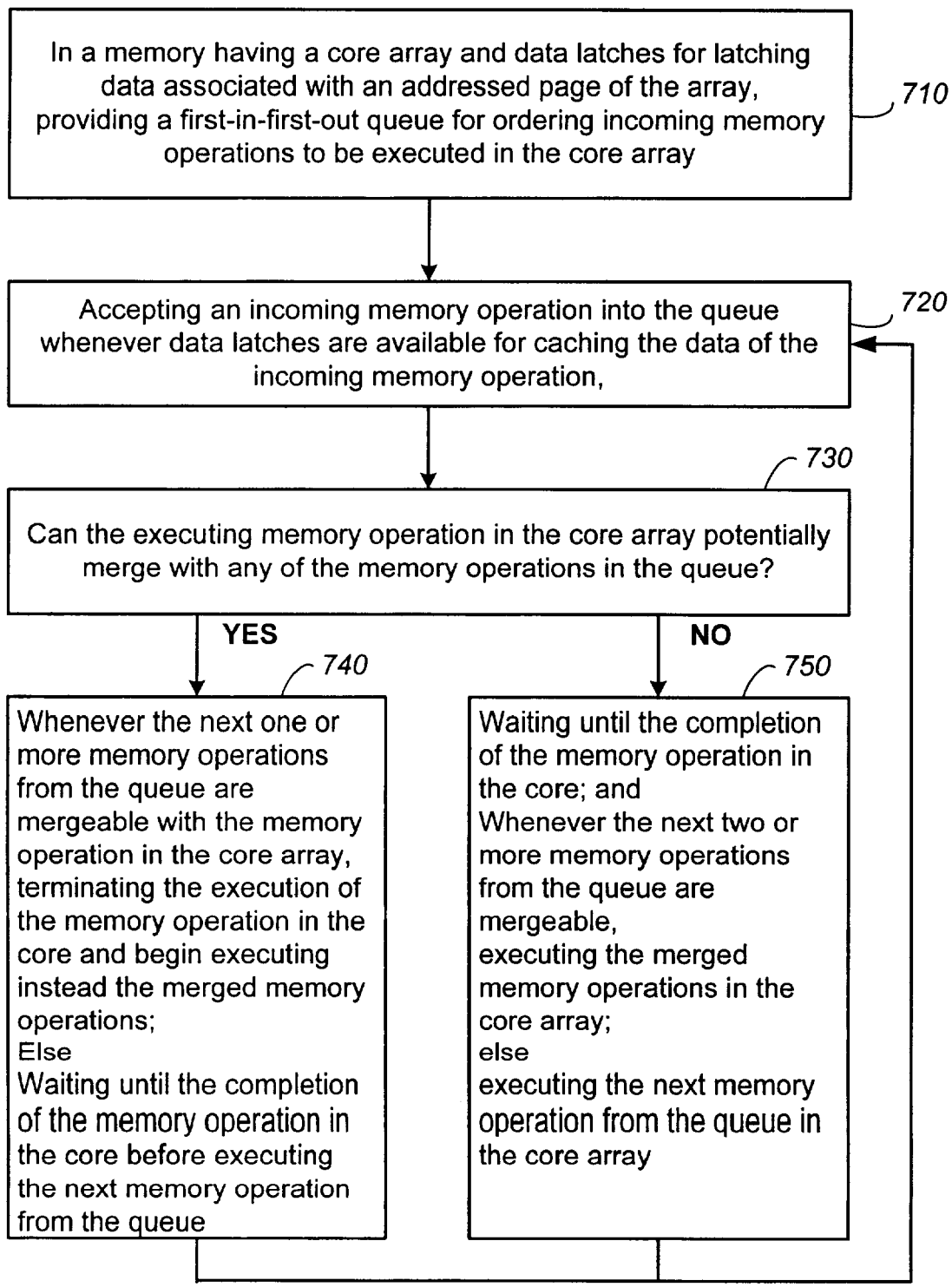
FIG. 29 is a flow diagram illustrating the queuing and possible merging of multiple memory operations.

FIG. 29 is a flow diagram illustrating the queuing and possible merging of multiple memory operations. The algorithm for managing multiple memory operations is applied to a memory having a core array and data latches for latching data associated with an addressed page of the array.

STEP 710: Providing a first-in-first-out queue for ordering incoming memory operations to be executed in the core array.

STEP 720: Accepting an incoming memory operation into the queue whenever the data latches are available for caching the data of the incoming memory operation.

STEP 730: Determining if the executing memory operation in the core array can potentially merge with any of the memory operations in the queue. If they are potentially mergeable, proceeding to STEP 740, otherwise proceeding to STEP 750.

(By "potentially mergeable", it is meant that at least two logical pages associated with the same page of memory cells can be programmed together in a single pass. For example, the two operations respectively to program a lower logical page and to program an upper logical page in a memory with 2-bit memory cells are potentially mergeable. Similarly, in a memory with 3-bit memory cells, the operations to program a lower logical page and an intermediate page are potentially mergeable. Also, the program operations for lower, intermediate and upper logical pages are potentially mergeable. Returning to the 2-bit cell example, if a lower logical page is under execution in the core array, it is potentially mergeable with the next program operation pending from the queue if the next program is to program the upper logical page belonging to the same page of memory cells. On the other hand, if an upper page is under execution in the core array, it is not potentially mergeable, since the next pending page to be programmed will have to come from a different page of memory cells. Similar considerations apply to when the memory operation is a read operation.)

STEP 740: Whenever the next one or more memory operations from the queue are mergeable with the memory operation in the core array,
   terminating the execution of the memory operation in the core and begin executing instead the merged memory operations;

Else
   Waiting until the completion of the memory operation in the core before executing the next memory operation from the queue. Proceeding to STEP 720.
   (By "mergeable" it is meant that the condition for mergeability is satisfied. In this case, the program data for both the lower and upper logical pages are available after they have been latched in the data latches. Similarly, "merged memory operations" would correspond to programming or sensing both lower and upper logical pages together.)

STEP 750: Waiting until the completion of the memory operation in the core; and
   whenever the next two or more memory operations from the queue are mergeable, executing the merged memory operations in the core array;

Else
   executing the next memory operation from the queue in the core array. Proceeding to STEP 720.

The management of the multiple commands is accomplished by the provision of a memory operation queue controlled by a memory operation queue manager. The memory operation queue manager is preferably implemented as a module in the state machine that controls the execution of a memory operation in the memory array.

Figure 30:
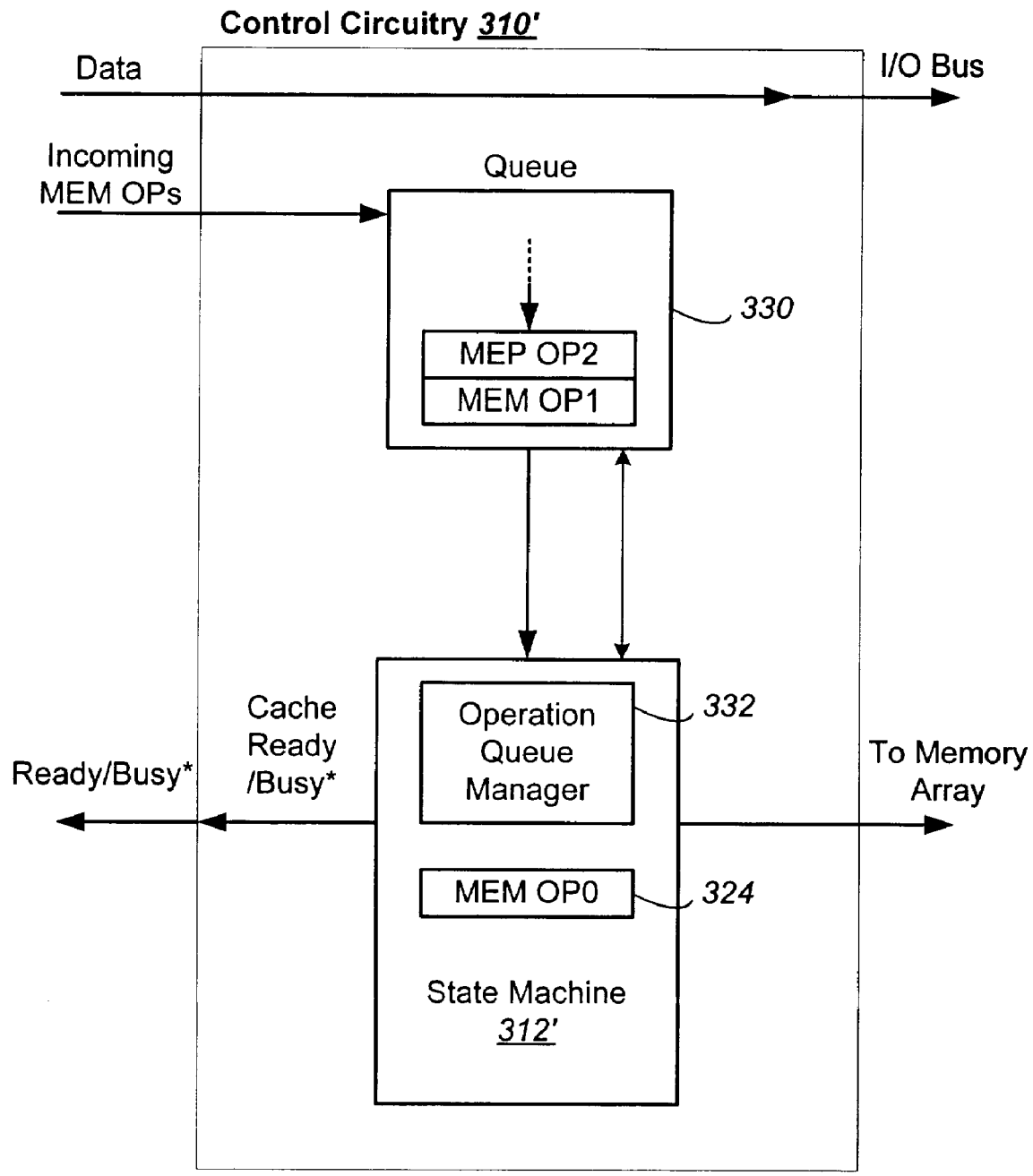
FIG. 30 illustrates a schematic block diagram of a preferred on-chip control circuitry incorporating a memory operation queue and a memory operation queue manager.

FIG. 30 illustrates a schematic block diagram of a preferred on-chip control circuitry incorporating a memory operation queue and a memory operation queue manager. The on-chip control circuitry 310' includes a finite state machine 312' that serves to control the basic operations of the memory array 100 (see also FIG. 28.) A memory operation queue 330 is implemented by a First-In-First-Out stack memory to hold any incoming memory operation requests. Typically, memory operation requests are issued from the host or the memory controller (see FIG. 28.)

A memory operation queue manager 332 is implemented as a module in the state machine 312' in order to manage a plurality of pending and executing memory operations. The queue manager 332 basically schedules pending memory operations in the queue 330 to be released into the state machine 312' for execution.

When a memory operation such as MEM OP0 is released from the queue into a program register 324 of the state machine, MEM OP0 will be executed on the memory array as controlled by the state machine. At any time, the state machine is aware of the number of free data latches available and this status is communicated to the host/memory controller via the signal Ready/Busy*. If one or more free data latches are available, the host will be able to request additional memory operations such as program or read. Thus, MEM OP1, MEM OP2, etc sent by the host are admitted into the queue 330. The maximum number of memory operations in the queue will be determined by the number of free data latches available.

While the memory operations are pending in the queue 330, the queue manager 332 will control the release of the pending memory operations from the queue 330 to the program register 324 in the state machine. Furthermore, it determines if any of the memory operations could be merged into a combined operation as described in connection with FIG. 29. In the case where two or more operations in the queue are mergeable, the queue manager 332 will release these mergeable operations from the queue 330 and the combined operation will be executed by the state machine 312' after the current operation in the state machine has completed execution. In the case where one or more operations in the queue are mergeable with the operation being executed by the state machine, the queue manager will have the state machine terminate the currently executing operation and execute the combined operation instead. Thus, the memory operation manager 332 cooperates with the rest of the state machine 312' to schedule and possibly merge multiple memory operations.

The invention has been described using an example with a 2-bit memory. As long as data latches are freed up during a current memory operation, they can be used to cache more data for any pending memory operations. This will allow more bits of data to be loaded into the available data latches as well as increase the likelihood of merging memory operations. Those skilled in the art will easily be able to apply the same principles to memory with cells that can each store more than two bits of data, e.g., a 3-bit or 4-bit memory. For example, in a 3-bit memory, the page of memory can be regarded as having three individual bit pages, namely lower-, middle- and upper-bit pages. These pages can be programmed individually at different times on the same page of memory cells. Alternatively, all three bits when available can be programmed together in the all-bit programming mode. This requires the cache program commands to be queued for many pages. In the 2-bit memory, two program commands can be executed together when full sequence conversion is possible. Similarly, in the 3-bit memory, three consecutive program commands can be executed together when converted to all-bit or full sequence mode. Again, the command queue manager will track which command has completed or terminated and which is next to execute. In this way, during programming as certain memory state milestones are reached, some data latches are freed up and can be efficiently used for caching pending program data.

Cache Operations During Erase—Background Read and Write Operations

The latency of an erase operation is one of the key contributors to overall performance overhead of a flash storage system. For example, the period for an erase operation may be four or five times longer than that of a program operation and ten times longer than that of a read operation. To improve the performance of the flash memory, background operations such as cache operation become very important to make use of the time waiting for the erase operation to finish. The invention is to make use of the data latches and I/O bus while the memory is busy occupying with an erase operation in the memory core. For example, data for the next program operation or data output from a read operation can be performed contemporaneously with the erase operation. In this way, when the next program or read operation does take place, the data input or output portion of that operation is already completed, thereby reducing program or read latency and increasing performance.

Erase operations can be implemented in a number of ways. One method disclosed in U.S. Pat. No. 5,172,338 is to erase by alternate erase pulsing followed by verifying. Once a cell has been erased verified, it is inhibited from further erase pulsing. Another erase operation, preferred for NAND memories, includes two phases. In the first phase, there is erasure by removing charges from the charge elements of the memory cells to some threshold level below a predefined "erased" or "ground" state. In the second phase, the threshold values of the erased cells are tighten to within a well-defined threshold distribution by a series of soft programming/verifying to the predefined "erased" threshold.

According to a general aspect of the invention, while the erase operation is taking place, any free data latches are used to cache data related to another pending memory operation.

Figure 31:
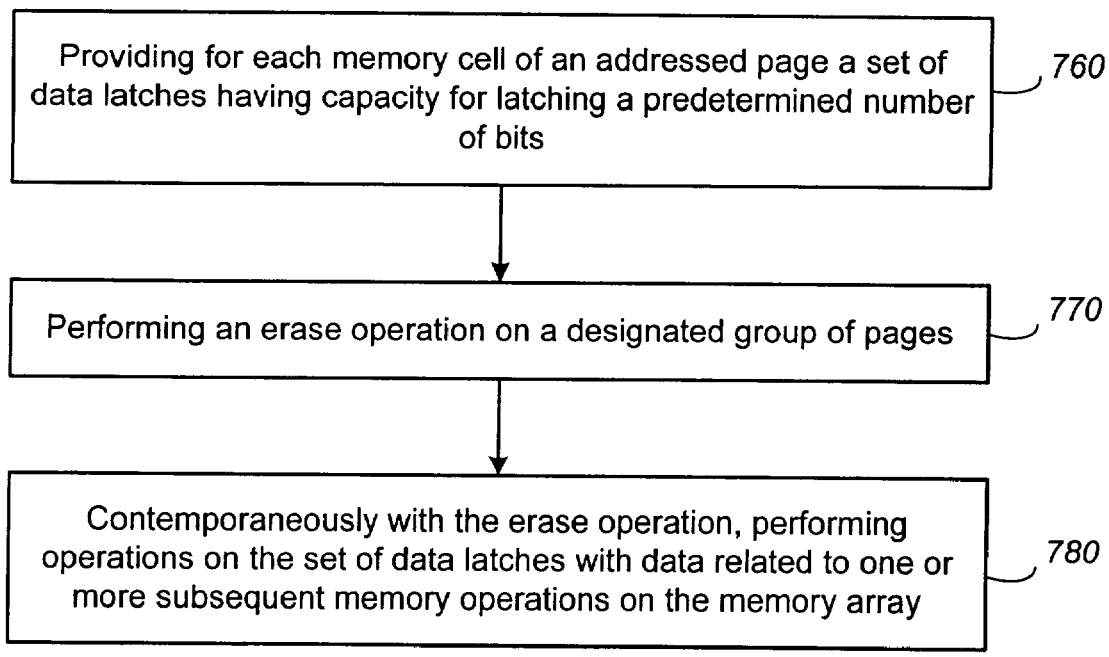
FIG. 31 is a schematic flow diagram illustrating a cache operation in the background during an erase operation.

FIG. 31 is a schematic flow diagram illustrating a cache operation in the background during an erase operation.

STEP 760: Providing for each memory cell of an addressed page a set of data latches having capacity for latching a predetermined number of bits.

STEP 770: Performing an erase operation on a designated group of pages.

STEP 780: Contemporaneously with the erase operation, performing operations on the set of data latches with data related to one or more subsequent memory operations on the memory array.

According to one aspect of the invention, while the erase operation is taking place, program data for a pending program operation is loaded into the data latches via the I/O bus. In particular, during the first phase of the erase operation when charges are being removed, all data latches are available for caching the program data. During the second phase of the erase operation when a soft-programming is taking place, all but one data latches are available for caching the program data since one of the data latches is required to store a program lockout condition after the soft programming has verified successfully at that location. If the memory architecture supports 2 bits per cell, there are at least 2 data latches, one for each bit. In the preferred embodiment, an additional data latch is used for storing certain conditions arising during the operation. Thus, depending on memory architecture, for a 2-bit cell, there are at least two and preferably three data latches provided for each cell. All these data latches are available for cache use during the first phase of the erase, and all but one of these data latches are available for cache use during the second phase of the erase operation. One or more pages of program data can therefore be loaded into the available data latches depending on the erase phase and the memory architecture.

Figure 32:
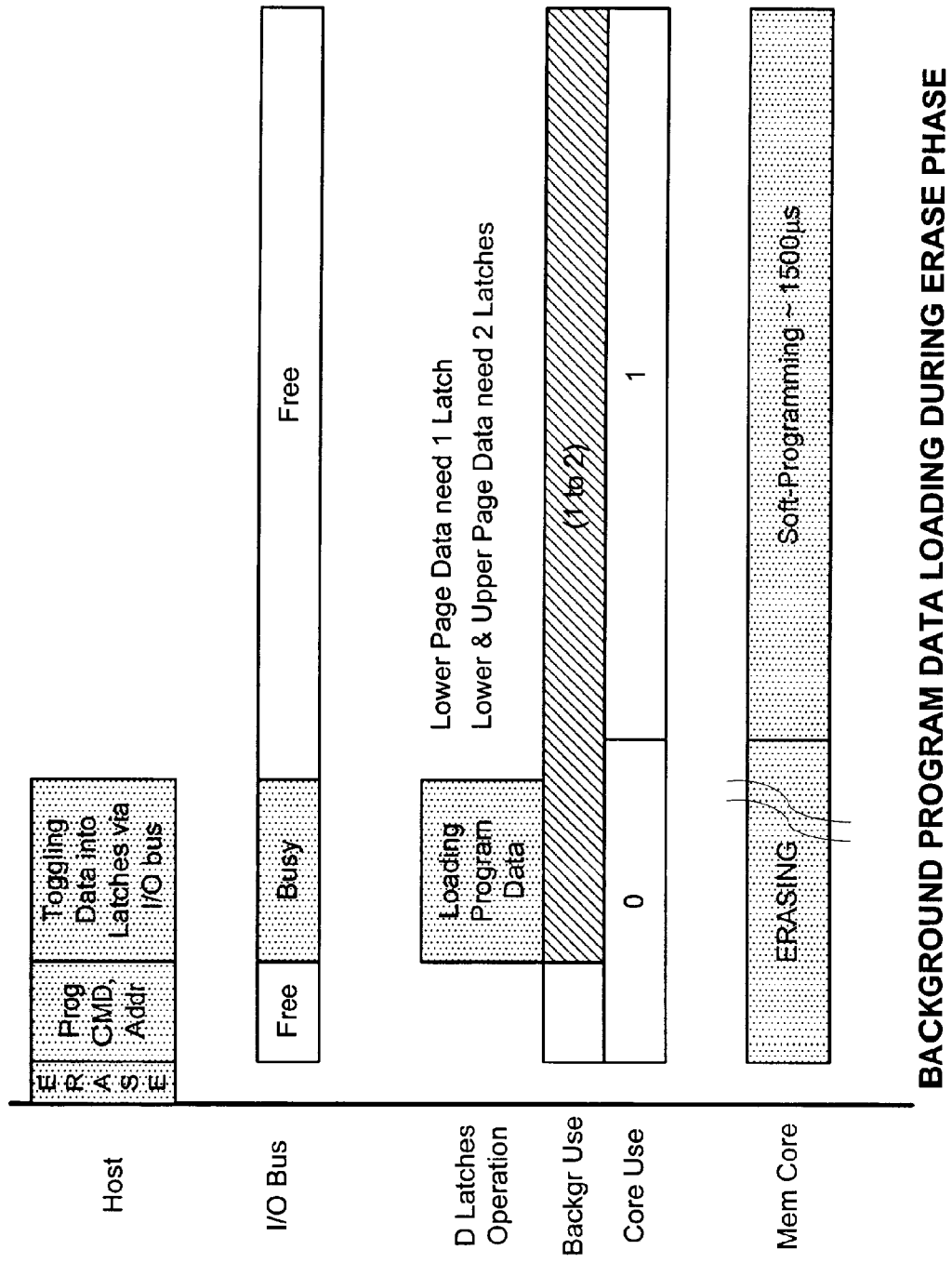
FIG. 32 is a schematic timing diagram for an erase operation on the memory array, illustrating a program data loading operation during the first, erase phase of the erase operation.

FIG. 32 is a schematic timing diagram for an erase operation on the memory array, illustrating a program data loading operation during the first, erase phase of the erase operation. The activities of the host, the I/O bus, the data latches and memory core are shown contemporaneously. As shown in the diagram, the erase operation at the memory core includes a first, erasing phase, followed by a second, soft programming/verifying phase.

During the first phase of an erase operation the memory array or core is preoccupied, but the data latches and the I/O bus are free for a background operation. During this time, the program data can be loaded into the data latches via the I/O bus. For example, in the preferred embodiment where there are three data latches for each cell, all these latches are available for cache operation during the first erase phase.

For example, when an Nth page of data is to be written, the host initially issues a write command to the memory for writing the page of data to a specified address. This is followed by sending the page of data to be programmed to the memory. The program data are toggled through the I/O bus and latched into DL2 of each read/write module (see FIGS. 13 and 14). Thus the I/O bus is temporary busy during this toggling-in period, which for example may be of duration 300 μs. With three data latches available, up to three pages of program data can in principle be cached. For example, a lower page portion of the Nth page may be loaded, or both lower and upper page portions of the Nth page may be loaded sequentially while the erase operation is on-going.

Figure 33:
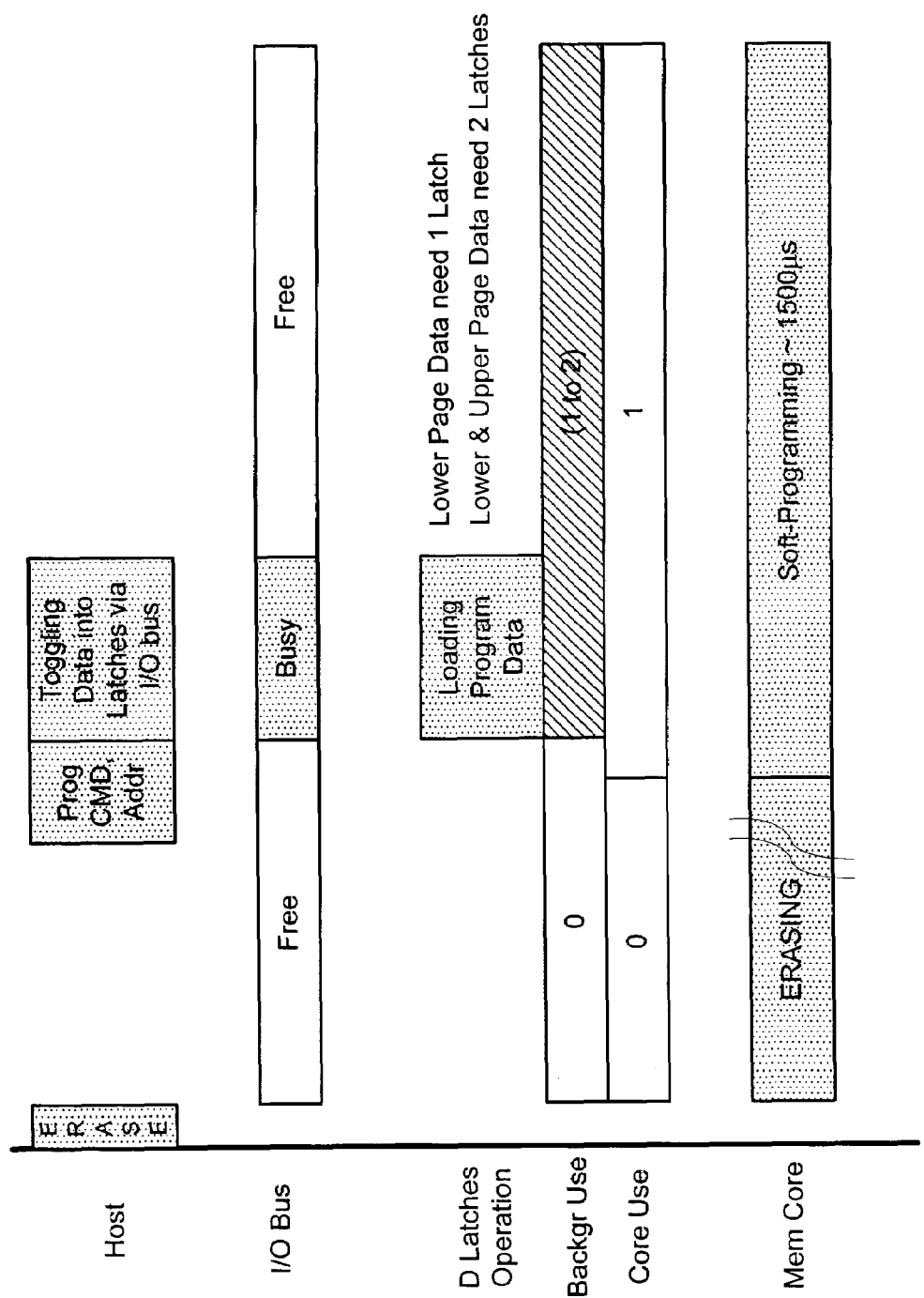
FIG. 33 is a schematic timing diagram for an erase operation on the memory array, illustrating a program data loading operation during the soft programming/verifying phase of the erase operation.

FIG. 33 is a schematic timing diagram for an erase operation on the memory array, illustrating a program data loading operation during the soft programming/verifying phase of the erase operation. The activities of the host, the I/O bus, the data latches and memory core are shown contemporaneously.

During the second, soft programming/verifying phase of an erase operation the memory array or core is also preoccupied. However, as described above, all but one of the data latches and the I/O bus are free. Program data can be loaded into the data latches not used by the erase operation. For example, in the preferred embodiment where there are three data latches for each cell, only one of the latches is employed by the soft programming/verifying operation. Therefore there are still two free latches available for cache operation.

For example, when an Nth page of data is to be written, the host initially issues a write command to the memory for writing the page of data to a specified address. This is followed by sending the page of data to be programmed to the memory. The program data are toggled through the I/O bus and latched into DL2 of each read/write module (see FIGS. 13 and 14). Thus the I/O bus is temporary busy during this toggling-in period, which for example may be of duration 300 μs. With two data latches available, up to two pages of program data can in principle be cached. For example, a lower page portion of the Nth page may be loaded, or both lower and upper page portions of the Nth page may be loaded sequentially while the erase operation is on-going.

In general, the maximum number of page can be loaded into the data latches is a function of the memory architecture as well as how many planes/banks and how many chips/dies are being programmed in parallel and the speed of data transfer rate.

According to another aspect of the invention, while the erase operation is taking place, a read operation can be inserted and the resultant read data in the data latches can be output during the erase operations. Preferably, the read operation is inserted in between the soft program/verify operation without breaking the soft programming pulse itself. Once data is sensed and latched into the unused data latches, they can be output to the host system via the I/O bus when erase is ongoing inside the array. This feature is ideal to hide system overheads, for example to perform read scrub operations and other system maintenance.

In prior art system, when an erase operation is interrupted, it will have to be restarted from the beginning of the cycle. This could be very time consuming especially in NAND memory.

The read operation can be inserted in between soft program and erase verify pulses. As many read as the number of soft program pulses can be inserted into the erase operation. The sense time is additional time, but of short duration compare to the overall soft program/verify operation. The benefit comes in toggling out the read data as it is taking place in parallel with the on-going program/verify operation. The read operation can also be used to perform background operation in managing internal control and data management.

One useful application for read during erase in a flash storage system is where read scrub operations are implemented to maintain the stored data in good condition. Portions of the memory where data have been stored are read periodically to check if the programmed charges in the cells have shifted over time or changes in their environment. If so, they are corrected by reprogramming the cells with the proper margins. Various schemes of read scrub have been disclosed in U.S. Pat. No. 7,012,835, the entire disclosure is incorporated therein by reference. Since a read scrub is a system operation extraneous to a host's operation, it is best to hide a read scrub behind some other operations where the memory will be busy anyway. In this case, during an erase operation, read scrub operation could be inserted so that the read latency can be hidden.

Figure 34:
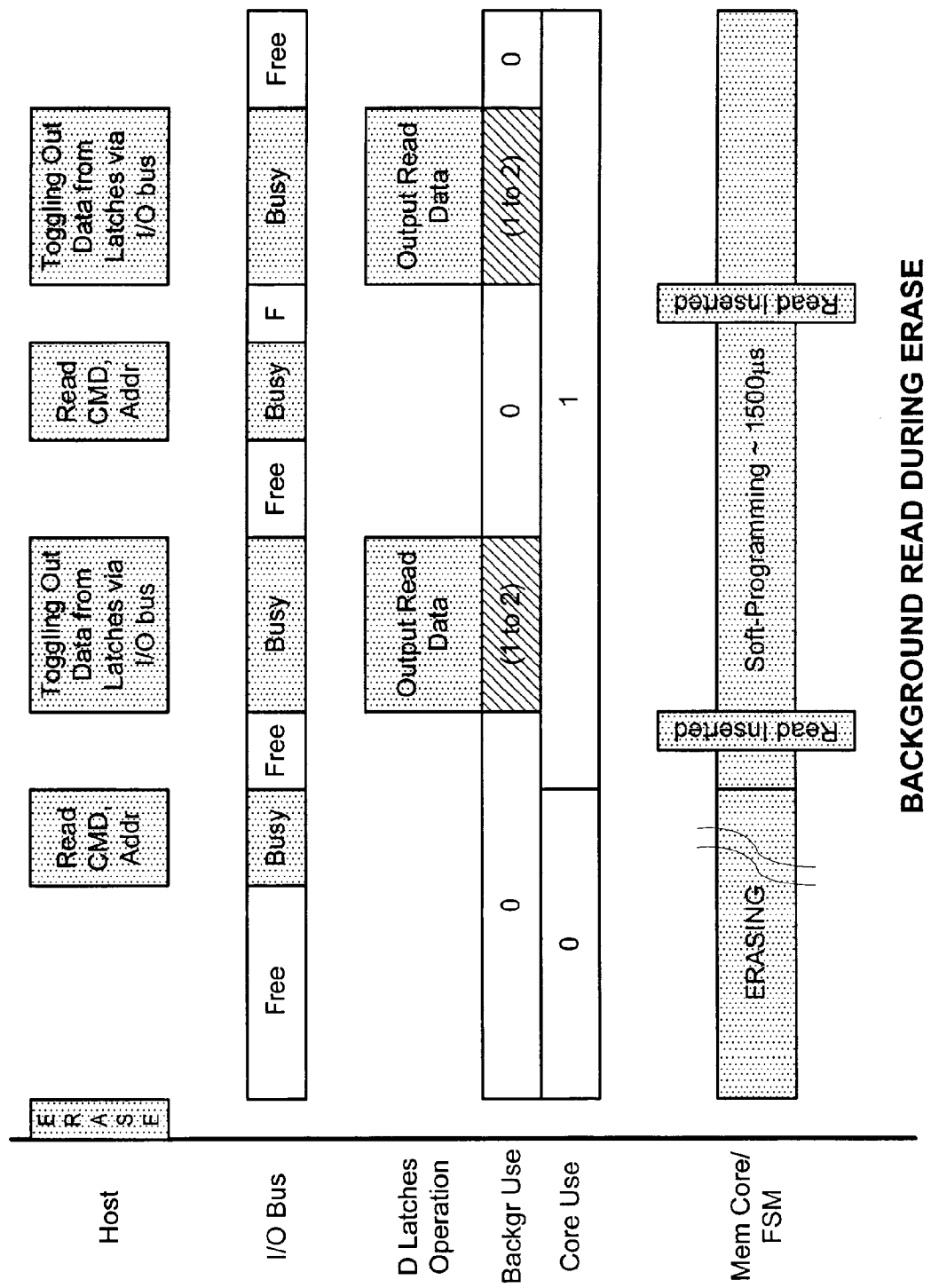
FIG. 34 is a schematic timing diagram for an erase operation on the memory array, illustrating a read operation being inserted and the resulting data output operation using available latches.

FIG. 34 is a schematic timing diagram for an erase operation on the memory array, illustrating a read operation being inserted and the resulting data output operation using available latches. The activities of the host, the I/O bus, the data latches and memory core are shown contemporaneously. As shown in the diagram, in the second phase of the erase operation the operation is soft programming/verifying. One or more read operations are preferably inserted without interrupting the completion of any soft program pulses.

While the chip is in the second phase of the erase operation, the algorithm for soft program/verify will execute. A status signal such as BUSY/READY* (not shown) will signals that the memory core is busy with internal erase operation. At the same time, another status signal as CACHEBUSY/CACHEREADY* (not shown) will go from busy to ready to accept read command input. As soon as a read command is entered, CACHEBUSY/CACHEREADY* will goes to busy to prevent another command from being entered. The read command will then wait until the current soft program pulse is finished internally before being executed on another addressed block in the same chip. After the read is done, the address is changed back to the erase block previously being operated on. The soft program/verify operation can resume on the erase block.

In the meantime, the read data in the data latches can be toggled out. The toggle out time is usually much longer than the read time. For example, the read time is about 25 μs while the toggle out time is about 200 μs. So the benefit of inserting a read in an erase operation is to salvage about 200 μs from the otherwise wasted time while waiting for erase to finish.

This cache read during erase can be inserted as many times as the erase time would allow. However, too many reads could elongate the total erase time and a balance should be struck between the time penalty on the erase operation the reads may incur and the toggling time salvaged from the reads. If there are still free time left during erase after one or more inserted reads, the available data latches can be used to cache any program data as described in an earlier section. If program data are loaded, the program operation can only start after the whole erase operation is completed. Enough free latches must be reserved for proper execution of the program operation, so in most cases other cache operations will not be possible after the program data are load.

Figure 35:
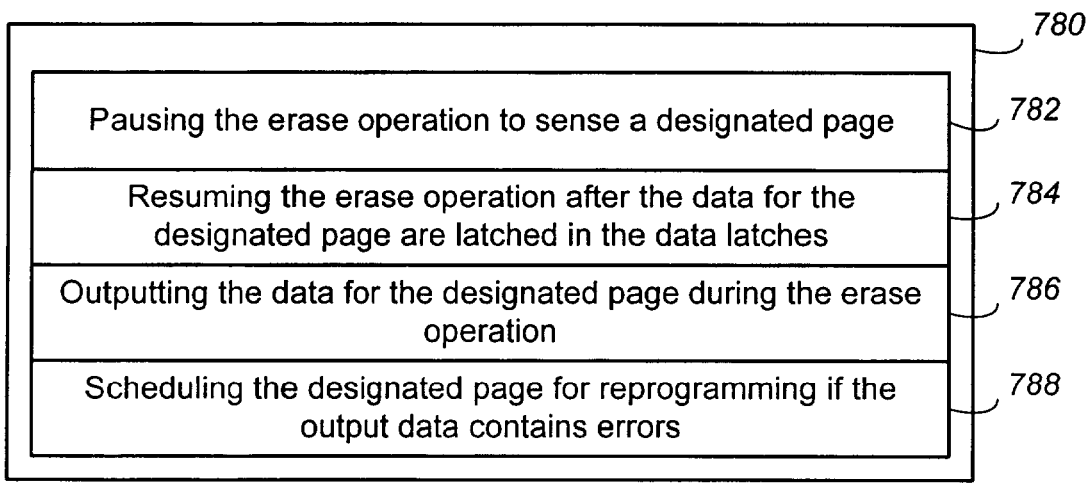
FIG. 35 is a schematic flow diagram illustrating a specific cache operation for read scrub application in the background during an erase operation in STEP 780 of FIG. 31.

FIG. 35 is a schematic flow diagram illustrating a specific cache operation for read scrub application in the background during an erase operation in STEP 780 of FIG. 31.

STEP 780 shown in FIG. 31 is further articulated as follows:

STEP 782: Pausing the erase operation to sense a designated page.

STEP 784: Resuming the erase operation after the data for the designated page are latched in the data latches.

STEP 786: Outputting the data for the designated page during the erase operation.

STEP 788: Scheduling the designated page for reprogramming if the output data contains errors.

The description for cache read so far has been made mostly to the second phase of the preferred erase operation. The preferred erase operation is where the first phase is to erase all cells to some threshold level below a predefined threshold and the second phase is to soft-program the cells to the predefined threshold. As described above, this erase scheme is preferred for flash memory with NAND structure since they require a fairly accurate ground state and the memory is erased by biasing the N-well, which takes time. Thus it is preferable to perform all the erasing together before soft-programming. In other memory architecture using the scheme of erase pulsing/verify/inhibit, caching operation is also contemplated. For example, a read operation may be inserted during a verify portion of the cycle.

Figure 36:
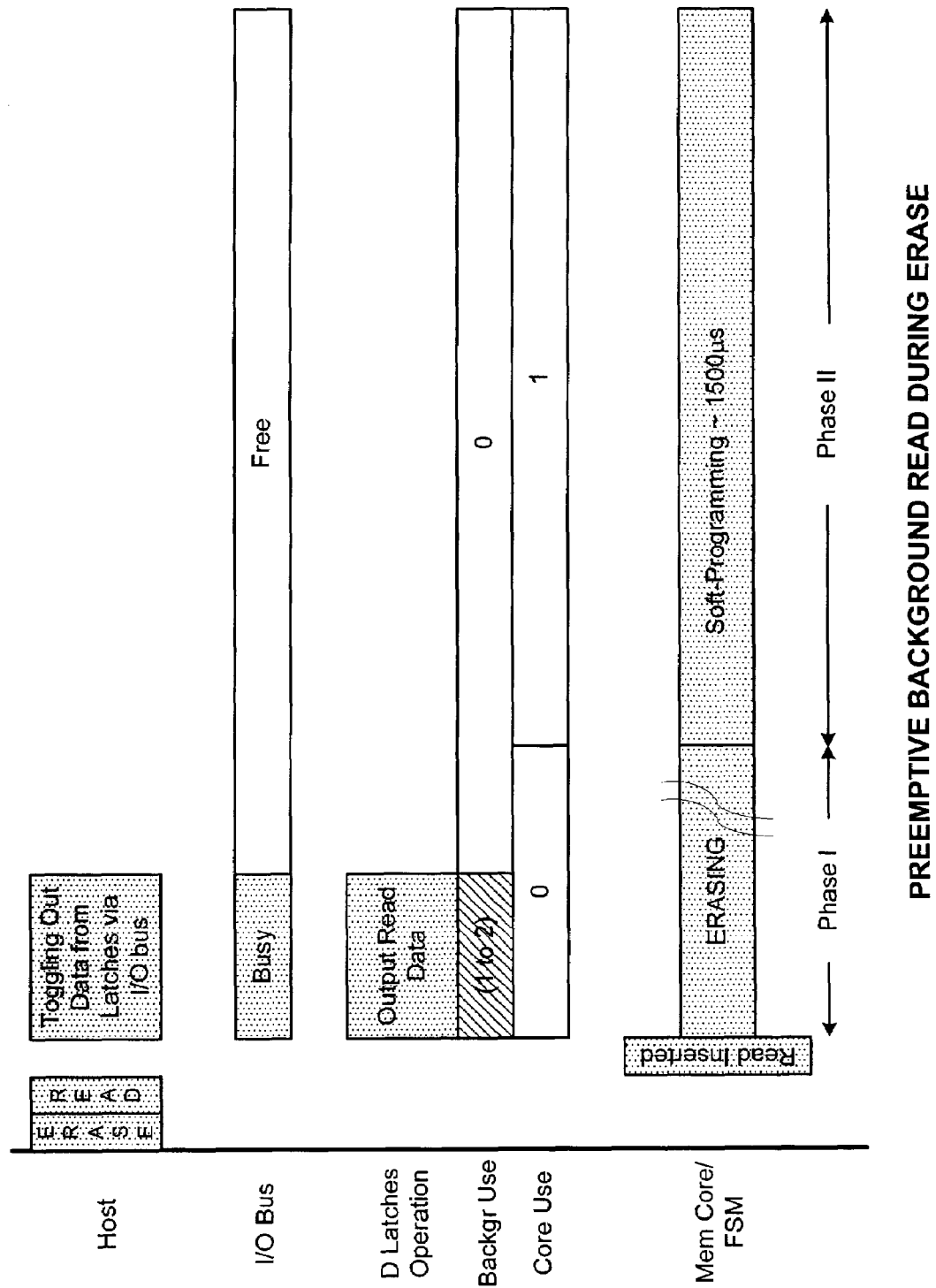
FIG. 36 illustrates a preemptive background read during erase.

FIG. 36 illustrates a preemptive background read during erase. This is a more preferably cache read when the read takes place just prior to the erase operation so that the erase operation need not be interrupted. This is possible if the read operation is known before the start of the erase operation. For example, the host may have a read request pending or if the memory system has some read operation scheduled. Alternatively, an intelligent algorithm may anticipate where the next read is likely to be and schedule such a read. Even if it turns out to be a miss later, no severe penalty will be incurred. If it is a hit, it can take advantage of the erase time to toggle out read data.

The two aspects of caching read data and caching program data during an erase operation can be combined to provide further flexibility to minimize overall system or memory overhead. Even with multiple planes and multi-chip data input operations, data input time might not fully utilize the busy time incurred by an erase operation. In such cases, read operation and or program operation can also be added to take full advantage of the erase time.

Ccahe Operations During Read—Background Read and Write Operations

Cache read is usually implemented to save time when many pages are sequentially read out. The sensing for a page can be hidden during the time to toggling out a previously sensed page so that the time for sensing does not incur extra waiting time for the user. A common scheme would be to sense the next page when the current page is being toggled out.

Figure 37:
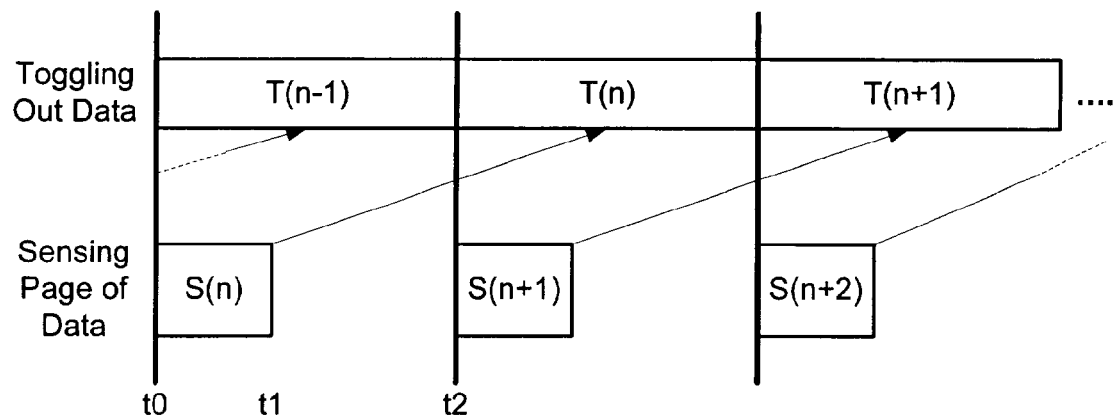
FIG. 37 illustrates schematically a typical read cache scheme.

FIG. 37 illustrates schematically a typical read cache scheme. The (n−1)th page was sensed in a previous cycle and latched in the data latches. At time t0, the (n−1)th page is being toggled out from the data latches via the I/O bus as indicated by T(n−1). While the toggling is taking place, the nth page can be sensed and latched as indicated by S(n). At t2, the toggling of the (n−1) page is done and therefore it can be followed by the toggling of the nth page of data from the data latches as indicated by T(n). Similarly, as the nth page is being toggled out, the (n+1) page of data can be sensed and latched as indicated by S(n+1). This (n+1) page can be toggled immediately after the nth page is done toggling. Ideally, the data latches and the I/O bus are fully engaged throughout the read caching so that any idle time is minimized.

According to one aspect of the invention, a read cache scheme is provided for the case of multi-state memory cells with the need to minimize perturbation between the memory cells (Yupin Effect.) In a preferred implementation, an efficient read caching scheme is employed for memory encoded with the "LM" coding and read with look-ahead ("LA") correction. Both the "LM" coding and "LA" correction require additional latch and bus activities besides the mere toggling of read data. A straight application of the conventional scheme described in connection with FIG. 37 would not yield an optimized read caching.

With ever higher integration in semiconductor memories, the perturbation of the electric field due to the stored charges between memory cells (Yupin effect) becomes more and more appreciable when the inter-cellular spacing is shrinking. It is preferably to encode the multi-state memory cells of a memory using LM coding, to program the pages in the memory in an optimal order, and to read the programmed pages using LA correction. An improved read operation will implement optimum cache operation.

Cache Read Algorithm for LM Code

When the page to be read is multi-state, implementation of read cache has to meet the requirements of the multi-state encoding used. As described before in connection with FIGS 20A-20E, the LM coding for a multi-state memory essentially minimizes the changes in the charge programmed in a memory cell between different programming passes. The examples shown are for a 2-bit memory for coding four possible memory states (e.g., "U", "A", "B", "C") in each cell as demarcated by three different demarcation threshold values (e.g., $D_A$, $D_B$, $D_C$). For example in the 2-bit memory cell, programming to the lower logical page advances the threshold level at most slightly below the middle of the threshold window of the cell. A subsequent upper logical page programming further advances the existing threshold level by about another quarter of the way. Thus, from the first lower to the second final upper programming pass, the net change is at most about one quarter of the threshold window, and this will be the maximum amount of perturbation a cell may experience from its neighbors along a wordline.

One feature of the LM coding is that each of the two bits, lower and upper bits, may be considered separately. However, the decoding of the lower-bit page will depend on whether the upper page has been programmed or not. If the upper page has been programmed, reading the lower page will require one read pass of readB relative to the demarcation threshold voltage $D_B$. If the upper page has not been programmed, reading the lower page will require one read pass of readA relative to the demarcation threshold voltage $D_A$. In order to distinguish the two cases, a flag ("LM" flag) is written in the upper page (usually in an overhead or system area) when the upper page is being programmed. During a read of a lower-bit page, it will first assume that the upper page has been programmed and therefore a readB operation will be performed. If the LM flag is read, then the assumption is correct and the read operation is completed. On the other hand, if the first read did not yield a flag, it will indicate that the upper page is not programmed and therefore the lower page would have to be re-read with the readA operation.

Decoding of the upper-bit page read will require operations readA and readC, respectively relative to the demarcation threshold voltages $D_A$ and $D_C$. Similarly, the decoding of upper page can also be confused if the upper page is not yet programmed. Once again the LM flag will indicate whether the upper page has been programmed or not. If the upper page is not programmed, the read data will be reset to "1" indicating the upper page data is not programmed.

When implementing cache read for memory using LM code, there is the additional consideration of needing to check the LM flag which is saved on the same area as the data. In order for the state machine to check the LM flag, it will have to be output from the data latches via the I/O bus. This would require allocation of the I/O bus for outputting the LM flag in addition to the toggling of sensed data during a read operation with caching.

FIG. 38A is a schematic timing diagram for cache reading a logical page encoded with the LM code. The general scheme of toggling the last page data while sensing the current page is similar to that of the conventional read shown in FIG. 37. However, the sensing in the LM code is complicated by potentially having to do two sensing passes with the checking of the LM flag in between.

At time t0, the (n−1) logical page sensed in the last cycle is being toggled out from the data latches to the I/O bus as indicated by T(n−1). At the same time $S_1(n)$ senses the next logical page (n). With the LM coding, two cases need be distinguished: reading of a lower-bit logical page; and reading of an upper-bit logical page.

For the case of reading a lower-bit logical page, a preferred sensing will begin with the assumption that the upper logical page has already been programmed so a first sensing $S_1(n)$ will be at readB relative to the demarcation threshold voltage $D_B$. At t1 $S_1(n)$ is done and will yield an LM flag. However, it can only be output at t2 after the I/O bus is finished toggling the (n−1) page. After the LM flag is communicated to the state machine, it is checked to determine if an upper page exists. If the LM flag is set, the assumption was correct and the lower-bit page was read correctly. The page (n) data that has been latched is ready to be toggled out in the next cycle.

For the case of reading an upper-bit logical page, $S_1(n)$ will step through readA and readC, respectively relative to the demarcation threshold voltages $D_A$ and $D_C$. The upper-bit page sensed data will be stored in DL2 and the DL0 data latch is used for toggle out data (see FIGS. 13 and 14.) At t2, the DL2 sensed data will be transferred to DL0. Again the LM flag will be checked after it has been outputted at the end of the toggling of the (n−1) page. If the upper page is programmed, all is fine and the sensed data (page (n)) in the latch is ready to be toggled out in the next cycle.

When reading an upper-bit logical page, if the LM flag is found to be not set, it would indicate that the upper page is not programmed. The sensed data from $S_1(n)$ will be reset to "1" so as to properly conform with the LM coding. The sensed data is then ready for output. Then the first byte will be pre-fetched out and followed by the whole page toggling out at the start of the next cycle.

FIG. 38B is a schematic timing diagram for cache reading with LM code in the special case of reading a lower-bit logical page when the upper-bit logical page has not yet been programmed. Again, at t0, a first sensing $S_1(n)$ is started and at t1, a LM flag is read. The LM flag is output for checking at t2. If the LM flag is found to be not set, $S_1(n)$ had read the lower-bit page incorrectly at readB. A second sensing, $S_2(n)$ will begin at t3 to be performed at readA. However, this additional sensing (finishing at t4) can not be hidden behind the time to toggling of the (n−1) page, e.g., T(n−1), since the checking of the flag from $S_1(n)$ before the second sensing will require access to the I/O bus and will have to wait until the T(n−1) toggling is done.

Cache Read Algorithm with All-bit Sensing

In an alternative scheme, when the page on a wordline to be read is multi-bits with multiple logical pages on the same physical page, all the multi-bits can be sensed together in one sensing operation to save power.

FIG. 39 illustrates a schematic timing diagram for cache read with all-bit sensing for a 2-bit memory. In the 2-bit case, the two bits representing the four memory states are sensed in the same operation. This would require sensing at readA, readB and readC to distinguish the four states. In this case, the sensing will occur in every other cycle. For example, the sensing is only occurring on the odd cycles and will be skipped on the even cycles. The two logical pages obtained in one sensing will be toggled out sequentially at each cycle.

In the 3-bit case where there are eight states, e.g, "U", "A", "B", "C", "D", "E", "F" and "G", the all-bit sensing will involve sensing at readA, readB, readC, readD, readE, readF and readG to distinguish the eight states.

In general any multi-bit, less than all-bit sensing will serve to reduce the number sensing needed to read all the bits of the page and will help in saving power. The memory operation queue and queue manager described in connection with FIG. 30 can be used to manage all-bit sensing operations by merging two or more binary-page sensing. The all-bit sensing scheme is applicable to memory with LM code and also to ones with LA correction, which will be described in the next section.

Cache Read Algorithm for LM code with LA Correction

As for perturbations between memory cells on adjacent wordlines, they can be mitigated during programming using a preferred programming scheme. This will effectively reduce the perturbation by half. The remaining half can also be corrected during read by using a preferred LA reading scheme.

A preferred programming scheme would have the pages associated with the wordlines programmed in an optimal sequence. For example, in the case of binary memory where every physical page holds a page of binary data, the pages are preferably programmed sequentially along a consistent direction, such as from bottom to top. In this way, when a particular page is being programmed, the pages on the lower side of it are already programmed. Whatever perturbative effects they may have on the current page, they are being accounted for as the current page is being program-verified in view of these perturbations. Essentially, the sequence of the programming the page should allow the current page being programmed to see a minimum of changes around its environment after it has been programmed. Thus, each programmed page is only perturbed by the pages on the upper side of it and the wordline to wordline Yupin effect is effectively reduced in half by this programming sequence.

In the case of a memory where each physical page of memory cells is multi-state, the sequence is less straight forward. For example in a 2-bit memory, each physical page associated with a wordline can be regarded as a single page of 2-bit data or two separate logical pages, lower and upper-bit of 1-bit data each. The physical page can therefore be programmed in one pass with the two bits or in two separate passes, first with the low-bit page and then later with the upper-bit page. When each physical page is to be programmed in two separate passes a modified optimal sequence is possible.

Figure 40:
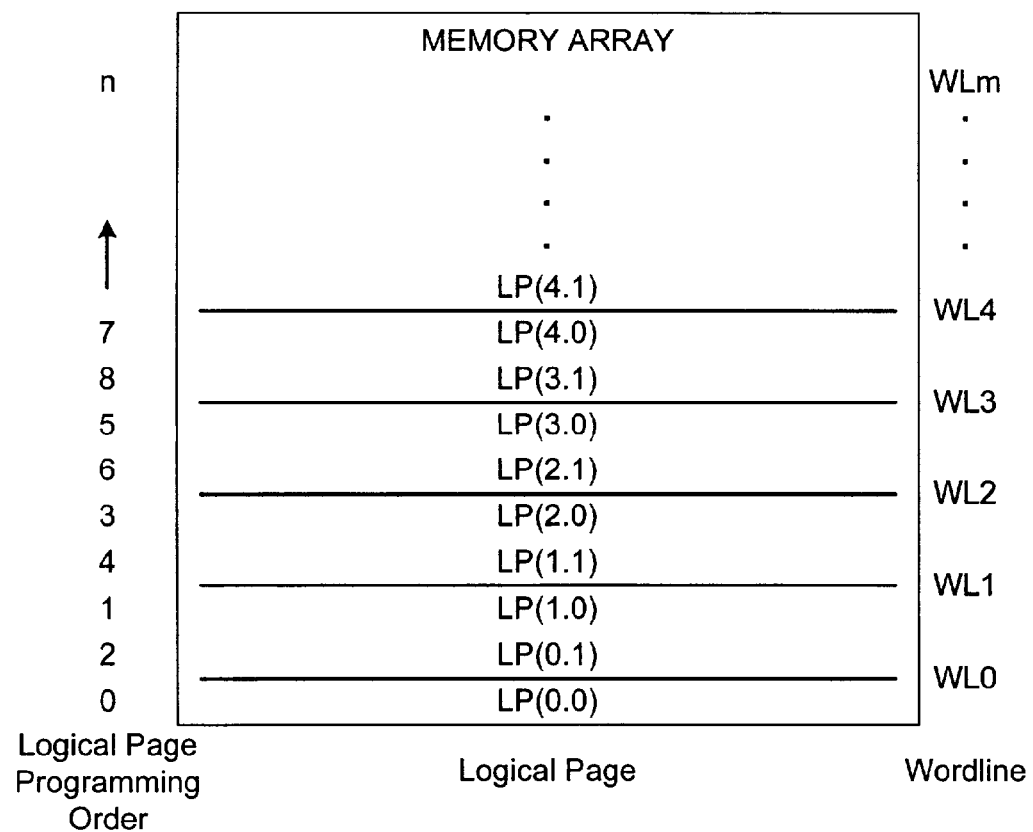
FIG. 40 illustrates an example of a memory having 2-bit memory cells and with its pages programmed in an optimal sequence so as to minimize the Yupin Effect between memory cells on adjacent wordlines.

FIG. 40 illustrates an example of a memory having 2-bit memory cells and with its pages programmed in an optimal sequence so as to minimize the Yupin Effect between memory cells on adjacent wordlines. For convenience the notation is such that the physical pages P0, P1, P2, . . . reside respectively on wordlines W0, W1, W2, . . . For a 2-bit memory, each physical page has two logical pages associated with it, namely lower-bit and upper-bit logical pages, each with binary data. In general a particular logical page is given by LP(Wordline.logical_page). For example, the lower-bit and upper-bit pages of P0 on W0 would respectively be labeled as LP(0.0) and LP(0.1), and the corresponding ones on W2 would be LP(2.0) and LP(2.1).

Essentially, the programming of the logical pages will follow a sequence n so that the current page being programmed will see a minimum of changes around its environment after it has been programmed. In this case, again moving incrementally in one consistent direction from bottom to top will help to eliminate perturbation from one side. Furthermore, because each physical page may have two programming passes, as the programming moves up the physical pages, it will be better for the current upper-bit page to be programmed after its adjacent lower-bit pages have already been programmed so that their perturbative effects will be accounted for when programming the current upper-bit page. Thus, if programming starts from LP(0.0) then the sequence will be as earmarked by the page-programming order, 0, 1, 2, . . . n, . . . which would yield: LP(0.0), LP(1.0), LP(0.1), LP(2.0), LP(1.1), LP(3.0), LP(2.1), . . .

Cache Read Algorithm for LM code with LA Correction

According to one aspect of the invention, a scheme for caching read data is implemented so that even for read operation whose correction depend on data from a neighboring physical page or wordline, the data latches and I/O bus are efficiently used to toggle out a previously read page while a current page is being sensed from the memory core. In particular, the preferred read operation is a "look ahead" ("LA") read and the preferred coding for the memory states is the "lower middle" ("LM") code. When the read for a current page on a current wordline must be preceded by a prerequisite read of data on an adjacent wordline, the prerequisite read along with any I/O access is preemptively done in the cycle for reading a previous page so that the current read can be performed while the previously read page is busy with the I/O access.

The LA reading scheme has been disclosed in U.S. patent application Ser. No. 11/099,049 filed on Apr. 5, 2005, entitled, "Read Operations for Non-Volatile Storage that Includes Compensation for Coupling," which entire disclosure is herein incorporated by reference. Read with the LA ("Look Ahead") correction basically examines the memory states programmed into the cells on an adjacent wordline and corrects any perturbation effect they have on the memory cells being read on the current wordline. If the pages have been programming according to the preferred programming scheme described above, then the adjacent wordline will be from the wordline immediately above the current one. The LA correction scheme would require the data on the adjacent wordline to be read prior to the current page.

For example, referring to FIG. 40, if the current page (n) to be read is on WLm (e.g., WL1), then the LA read, as will be denoted by $S_{LA}(n)$, will read the next wordline WLm+1 (e.g., WL2) first and save the data result in one data latch. Next, the current page will then be sensed in view of the $S_{LA}(n)$ result, and will be denoted by $S_1'(n)$.

As described earlier in connection with FIG. 40, in the LM code with the preferred programming sequence, the lower page (e.g., LP(1.0) will be programmed to $D_B$ or close to $D_B$ (intermediate state). The upper page (e.g., LP(1.1)) will be programmed only after the WLm+1 lower page (e.g., LP(2.0) is programmed. Then the lower page WL-WL Yupin effect will be eliminated completely. Therefore, the data dependent correction will only be performed on the "A" and "C" states, and not on the "U" or the "B" state.

In a preferred implementation of the LA read, a latch is used to indicate whether the LA read found the "A" or "C" state or the "U" or "B" state. In the former case, correction is needed and in the latter case, correction is not needed. The corresponding cell in the current read $S_1(n)$ will be corrected accordingly by suitable adjustment of the sensing parameters, such as raising the wordline voltage during sensing. This is done for the entire current page by sensing once with adjustment and another time without adjustment. The data for each cell of the page will then be selected from these two sensing according to whether the latch indicates correction or not.

Read with LM code will need to check the LM flag before the read result is finalized (either by a second pass read or by resetting the read data.) LA correction needs to do the next wordline read first before reading the current wordline. Therefore both the LM flag from the next wordline read and the LM flag from the current wordline need to be checked by the state machine. These two LM flags need to be output via the I/O bus to the state machine when the I/O bus is not busying toggling read data.

Figure 41:
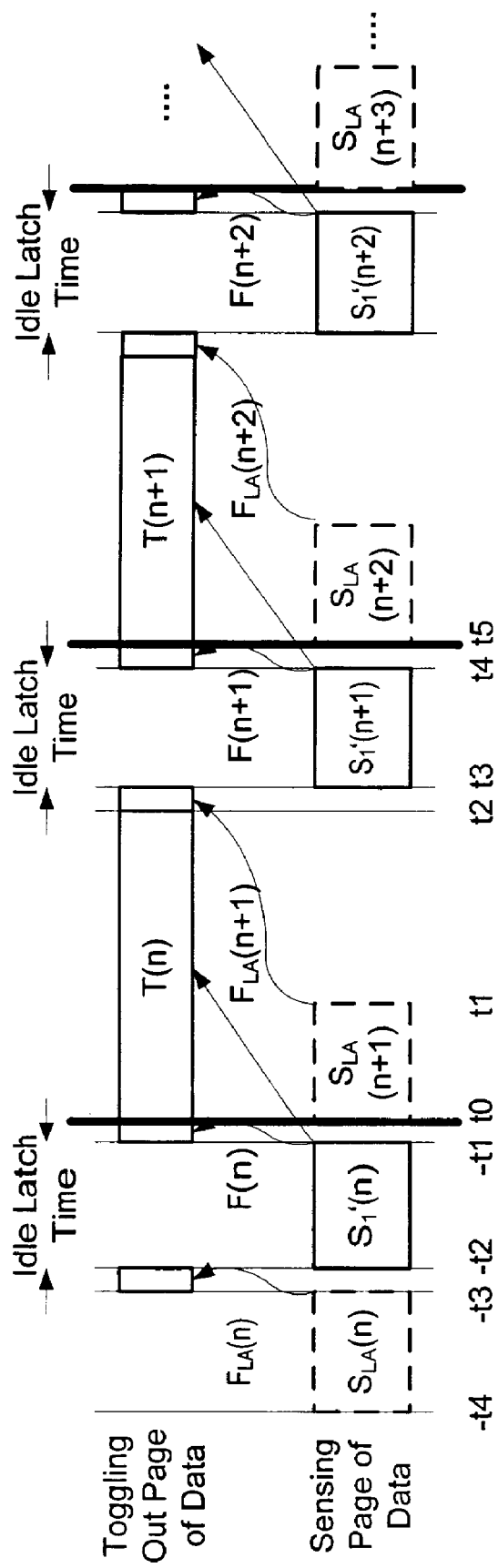
FIG. 41 illustrates an implementation of read caching for the LM code with LA correction according to the convention scheme shown in FIG. 37.

FIG. 41 illustrates an implementation of read caching for the LM code with LA correction according to the convention scheme shown in FIG. 37. Basically, the conventional scheme is for the sensing of the current page to be hidden inside the data toggle out time of the previous page sensed. However, in this case, the current page sensing $S_1'(n)$ on WLm must be preceded by an additional lookahead read $S_{LA}(n)$ on WLm+1. The LM flags for each of these sensing must be output via the I/O bus before the sensed data are ascertained. The current page sensing $S_1'(n)$ is performed in view of the data from the $S_{LA}(n)$ to yield the corrected data for the current page. It will be understood that $S_1'(n)$ may be followed by an additional $S_2'(n)$ if n is a lower-bit page and the upper-bit page is not yet programmed as shown in FIG. 38B.

In the next cycle beginning at t0, the corrected sensed data of page n is then toggled out as indicated by T(n). At the same time, the current sensing has now moved to the next page with $S_1'(n+1)$, which must be preceded by $S_{LA}(n+1)$. However, the output of the LM flags from these sensing must wait until the toggling of the page n, T(n) is done. Furthermore, $S_1(n+1)$ can only be performed after the result of $S_{LA}(n+1)$ is definite. Thus, $S_1'(n+1)$ can only be performed outside the data toggling period and therefore cannot hide behind it. This adds an additional sensing time when the latches and I/O bus are not fully utilized, and the wasted time is repeated for every subsequent cycles. This implementation degrades read performance for the user when the LA correction is used.

A preferred implementation of cache read in LM code with LA correction is to pipeline the next wordline sensing and current wordline sensing in such a way that all the sensing will be hidden inside the data toggle. The next wordline sensing is always executed ahead of the current wordline sensing. Inside each group of data toggle, the current wordline sensing will be executed and followed by the next-next wordline sensing. When the group of data has finished toggle out and the I/O bus is available, the next-next wordline LM flag will be fetched out first and checked. If the LM flag is in the state indicating the upper page not programmed, then the next-next wordline sensed data will be reset to "1" (for no correction). The current wordline LM flag will be checked subsequently. Depending on the current wordline LM flag, either the sensed data is kept or another sensing need to be executed (in the case of lower page read) or the data will be reset to all "1" (in the case of upper page read). All these sensing and data toggle out can be managed with 3 data latches for a memory with 2-bit memory cells.

Figure 42:
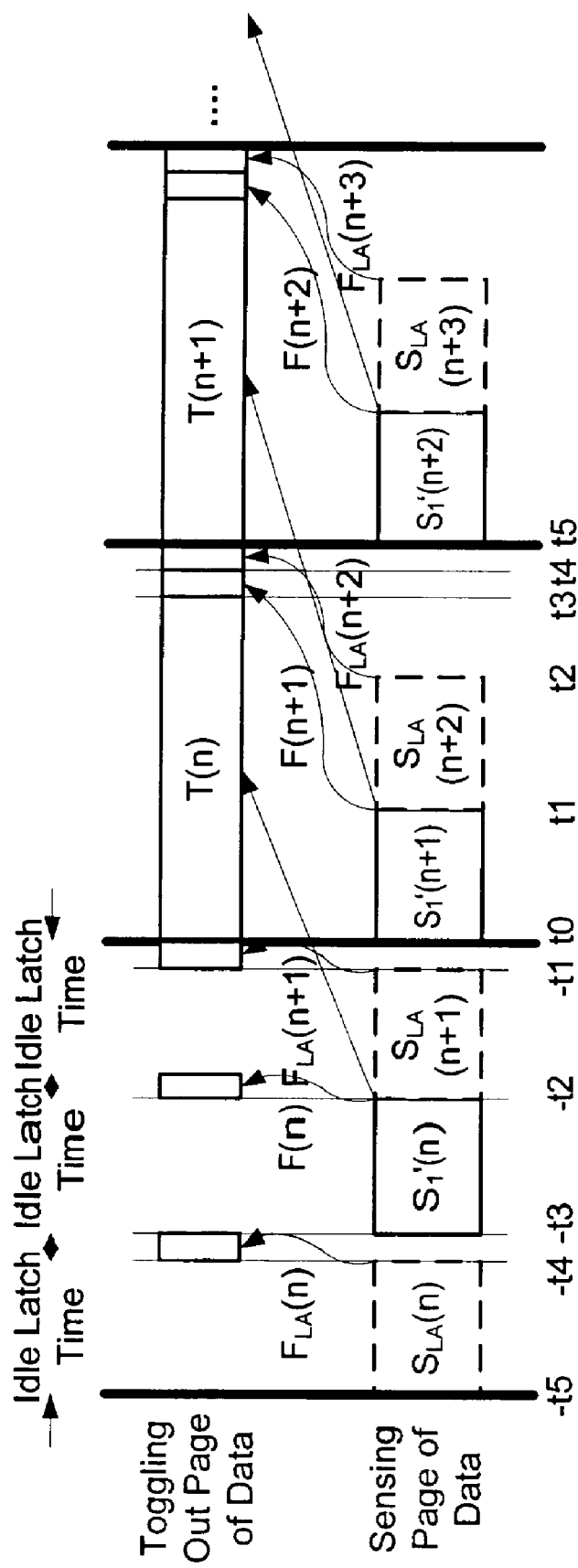
FIG. 42 illustrates an improved read caching scheme with the LM code and LA correction.

FIG. 42 illustrates an improved read caching scheme with the LM code and LA correction. The first cycle from -t5 to t0 is when the current page (n) on WLm is read and is different from the rest of the cycles. As before, the LA correction require a preceding read of $S_{LA}(n)$ where readA, readB and readC will sense the cell states on WLm+1. The LM flag from this read $F_{LA}(n)$ will be output at -t4 and checked. If the flag indicates the upper page is not programmed on WLm+1, the data being sensed will be reset to all "1", indicating that there will be no correction. If the flag indicates the upper page is programmed, then the latched data indicating correction or not will be kept as it is. At -t3, the current page on WLm will be sensed with $S_1'(n)$ and possibly $S_2'(n)$ in accordance with the LM code and LA correction scheme described earlier. In contrast to the scheme illustrated in FIG. 41, a preemptive lookahead read is also performed for the next page (n+1). Thus, at time -t2, $S_{LA}(n+1)$ is performed and at -t1, its LM flag is output and checked.

After the first cycle, at the beginning of the next cycle at t0, the previously sensed data from $S_1'(n)$, now LA corrected, will be toggled out as indicated by T(n). The page address will be incremented first to (n+1) which reside on a wordline given by the order indicated in FIG. 38. Thus, at time t0, with the start of T(n), sensing of the (n+1) page, $S_1'(n+1)$ can begin right away since its prerequisite lookahead $S_{LA}(n+1)$ has already been completed in the previous cycle. At the end of $S_1'(n+1)$ at t1, the LM flag F(n+1) will be fetched out and checked and any additional action will follow depending on the LM flag. The corrected page (n+1) data will then be ready for toggling in the next cycle. In the meantime, while the page (n) is still being toggled out, the lookahead sensing $S_{LA}(n+2)$ for the next page can be performed in advance and within the toggling period of T(n).

As soon as T(n), the toggling for page (n), is completed, the next cycle will start and T(n+1) follows with the toggling out of the LA corrected page (n+1) data. The cycle for page (n+1) continues in similar manner as that for page (n). The important feature is that the lookahead read for a given page is preemptively performed in an earlier cycle.

Figure 43:
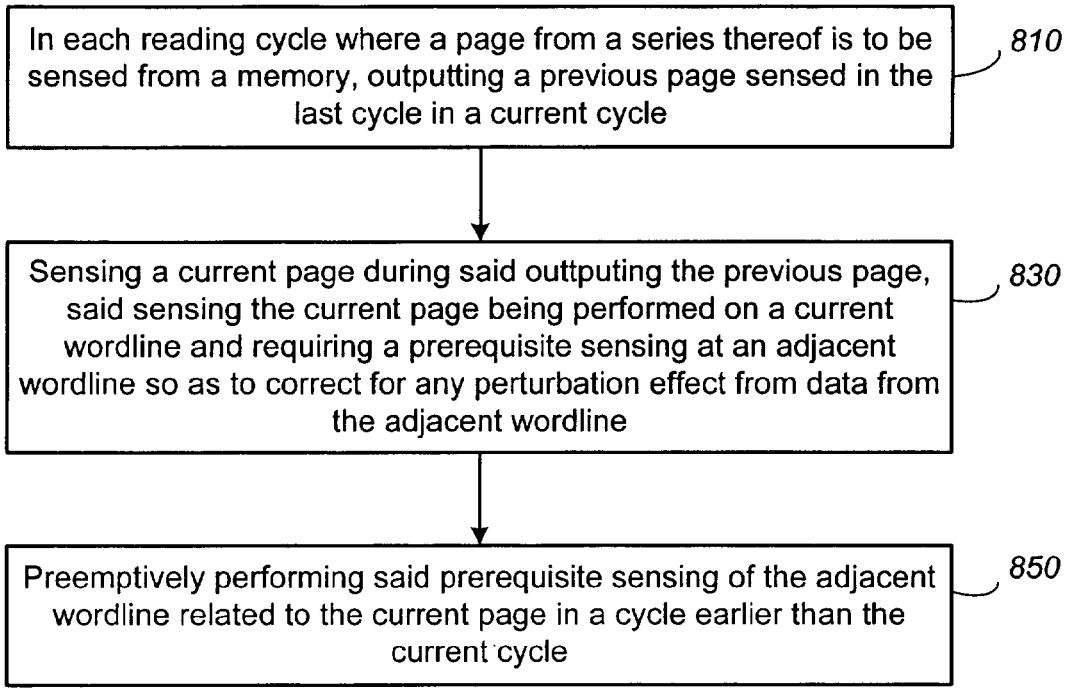
FIG. 43 is a schematic flow diagram illustrating the improved read caching.

FIG. 43 is a schematic flow diagram illustrating the improved read caching:

STEP 810: In each reading cycle where a page from a series thereof is to be sensed from a memory, outputting a previous page sensed in the last cycle in a current cycle.

STEP 830: Sensing a current page during said outputting the previous page, said sensing the current page being performed on a current wordline and requiring a prerequisite sensing at an adjacent wordline so as to correct for any perturbation effect from data on the adjacent wordline.

STEP 850: Preemptively performing said prerequisite sensing of the adjacent wordline related to the current page in a cycle earlier than the current cycle.

Figure 44:
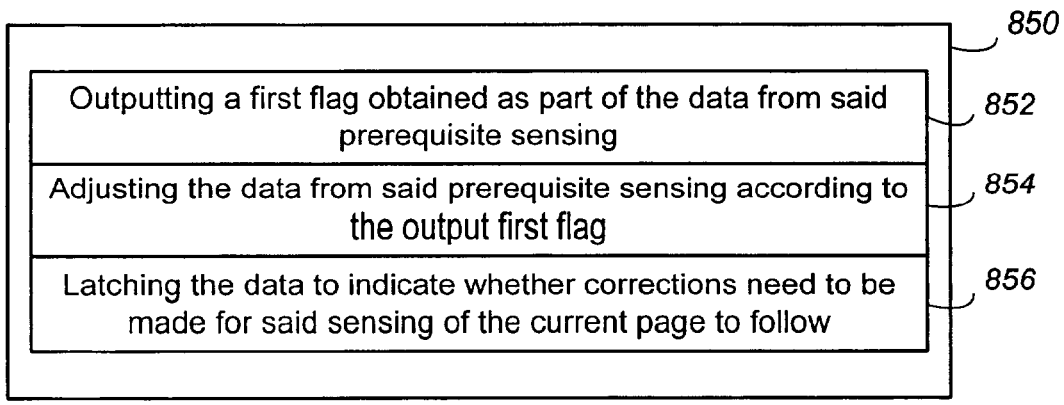
FIG. 44 is a schematic flow diagram illustrating a further articulation of STEP 850 of FIG. 43.

FIG. 44 is a schematic flow diagram illustrating a further articulation of STEP 850 of FIG. 41:

STEP 852: Outputting a first flag obtained as part of the data from said prerequisite sensing.

STEP 854: Adjusting the data from said prerequisite sensing according to the output first flag.

STEP 856: Latching the data to indicate whether corrections need to be made for said sensing of the current page to follow.

Figure 45:
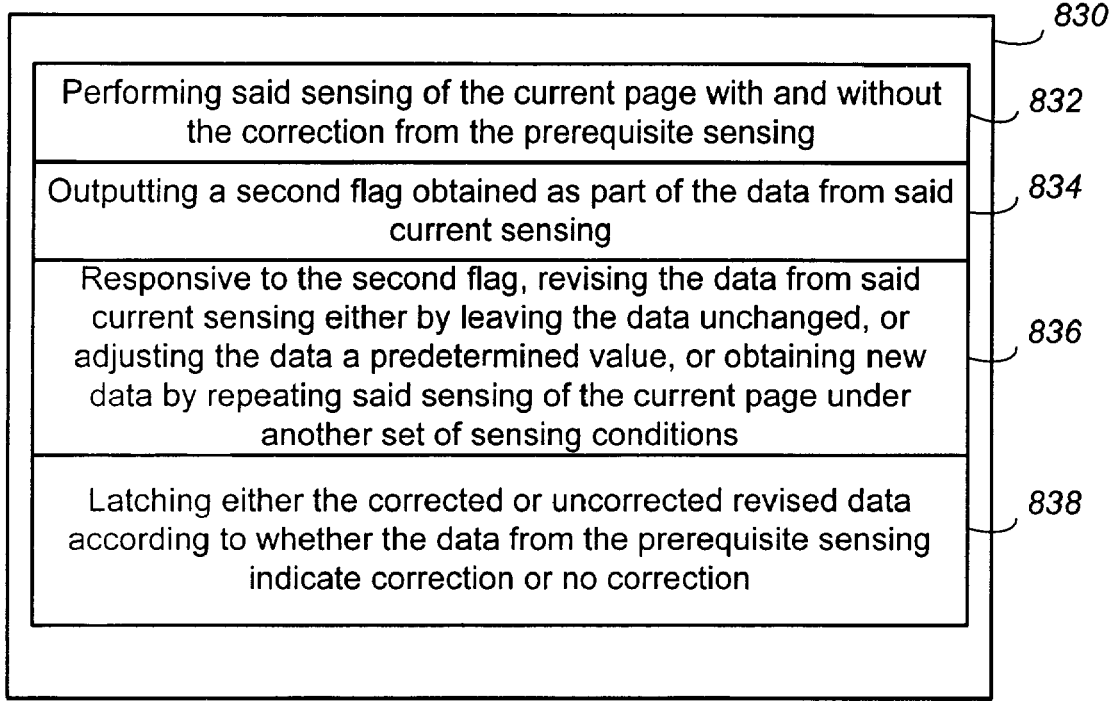
FIG. 45 is a schematic flow diagram illustrating a further articulation of STEP 830 of FIG. 43.

FIG. 45 is a schematic flow diagram illustrating a further articulation of STEP 830 of FIG. 41:

STEP 832: Performing said sensing of the current page with and without the correction from the prerequisite sensing.

STEP 834: Outputting a second flag obtained as part of the data from said current sensing.

STEP 836: Responsive to the second flag, revising the data from said current sensing either by leaving the data unchanged, or adjusting the data a predetermined value, or obtaining new data by repeating said sensing of the current page under another set of sensing conditions.

STEP 838: Latching either the corrected or uncorrected revised data according to whether the data from the prerequisite sensing indicate correction or no correction.

The above algorithm has been described using the 2-bit LM code. The algorithm is equally applicable LM codes for 3 bits or more.

Although the various aspects of the present invention have been described with respect to certain embodiments, it is understood that the invention is entitled to protection within the full scope of the appended claims.

What is claimed is:

1. A method of reading a non-volatile memory having addressable pages of memory cells on associated wordlines, comprising:

sensing and latching a page of data in each of a series of reading cycles, wherein said sensing and latching in a current reading cycle are directed to a current page of data on a current wordline and are performed responsive to prerequisite data from an adjacent wordline so as to correct for any perturbation effects therefrom;

preemptively sensing and latching the prerequisite data for the current page prior to the current reading cycle; and performing in the current reading cycle, other than the first reading cycle, said sensing and latching of the current page while outputting a previous page sensed and latched in the just passed reading cycle.

2. The method of claim 1, wherein the memory cells each stores one bit of data.

3. The method of claim 1, wherein the memory cells each stores more than one bit of data and each page of memory cells on a wordline is associated with more than one page of binary data corresponding to the individual bits of each memory cell.

4. The method of claim 3, wherein said sensing and latching of the prerequisite data for the current page further comprises:

outputting a first flag obtained as part of the prerequisite data from said prerequisite sensing;

adjusting the prerequisite data responsive to the first flag; and latching the adjusted prerequisite data to indicate whether corrections need to be made for the current page.

5. The method of claim 4, wherein the first flag indicates whether the prerequisite page of memory cells on the adjacent wordline has been programmed with all the bits.

6. The method of claim 5, further comprising:

when the first flag indicates that the adjacent wordline has not been programmed with all the bits, adjusting the prerequisite data to indicate no correction is needed.

7. The method of claim 5, further comprising:

when the first flag indicates that the adjacent wordline has been programmed with all the bits, adjusting the prerequisite data to indicate that correction is needed.

8. The method of claim 4, wherein said sensing and latching of a current page further comprises:

performing said sensing of the current page with corrections from the adjusted prerequisite data;

outputting a second flag obtained as part of the current page;

responsive to the second flag, refreshing the current page by one of the group steps consisting of: (1) leaving the page unchanged; (2) adjusting the page to a predetermined value; and (3) replacing with a new pabe obtained by repeating said sensing of the current page under another set of sensing conditions; and latching the refreshed current page for outputting in the next reading cycle.

9. The method of claim 8, wherein said sensing of the current page for those memory cells that needs correction as indicated by the adjusted prerequisite data is performed at a wordline voltage with a predetermined boost.

10. The method of claim 8, wherein the second flag indicates whether the current page of memory cells on the current wordline has been programmed with all the bits.

11. The method of claim 10, wherein:

when the second flag indicates that the adjacent wordline has been programmed with all the bits, said refreshing the current page is a null operation which leaves the current page unchanged.

12. The method of claim 10, wherein:

the memory cells each stores two bits of data;

the page of memory cells is constituted from a lower-bit page and an upper-bit page; and when the second flag indicates that the adjacent wordline has not been programmed with all the bits, and the current page being sensed is an upper-bit page, said refreshing the current page is by resetting the current page data all to a predetermined bit value indicating the upper-bit page has not been programmed.

13. The method of claim 10, wherein:

the memory cells each stores two bits of data;

the page of memory cells is constituted from a lower-bit page and an upper-bit page; and when the second flag indicates that the adjacent wordline has not been programmed with all the bits, and the current page being sensed is a lower-bit page, said refreshing the current page is by sensing the current page relative to another predetermined reference.

* * * * *